US012356781B2

(12) United States Patent
Akimoto

(10) Patent No.: US 12,356,781 B2
(45) Date of Patent: Jul. 8, 2025

(54) IMAGE DISPLAY DEVICE MANUFACTURING METHOD AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 564 days.

(21) Appl. No.: 17/709,063

(22) Filed: Mar. 30, 2022

(65) Prior Publication Data

US 2022/0223648 A1 Jul. 14, 2022

Related U.S. Application Data

(63) Continuation of application No. PCT/JP2020/036933, filed on Sep. 29, 2020.

(30) Foreign Application Priority Data

Oct. 1, 2019 (JP) ................................ 2019-181637

(51) Int. Cl.
*H10H 29/14* (2025.01)
*H10H 20/01* (2025.01)
(Continued)

(52) U.S. Cl.
CPC .... *H10H 29/142* (2025.01); *H10H 20/01335* (2025.01); *H10H 20/018* (2025.01);
(Continued)

(58) Field of Classification Search
CPC . H01L 27/156; H01L 33/007; H01L 33/0093; H01L 33/22; H01L 33/32;
(Continued)

(56) References Cited

U.S. PATENT DOCUMENTS

2010/0320445 A1 12/2010 Ogihara et al.
2016/0027967 A1 1/2016 Isa
(Continued)

FOREIGN PATENT DOCUMENTS

CN 107369748 A 11/2017
JP 2002-141492 A 5/2002
(Continued)

OTHER PUBLICATIONS

International Search Report and Written Opinion of the International Searching Authority dated Nov. 17, 2020 as issued in PCT Application No. PCT/JP2020/036933 and English translation of International Search Report; 11 pages.
(Continued)

*Primary Examiner* — Yasser A Abdelaziez
(74) *Attorney, Agent, or Firm* — Foley & Lardner LLP

(57) ABSTRACT

An image display device manufacturing method includes: providing a first substrate that includes: a circuit including a circuit element formed on a light-transmitting substrate, and a first insulating film covering the circuit; forming, on the first insulating film, a layer including graphene; forming, on the layer v graphene, a semiconductor layer including a light-emitting layer; etching the semiconductor layer to form a light-emitting element; forming a second insulating film covering the layer including graphene, the light-emitting element, and the first insulating film; forming a via passing through the first insulating film and the second insulating film; and electrically connecting the light-emitting element and the circuit element through the via at a light-emitting surface facing a surface of the light-emitting element on a first insulating film side.

8 Claims, 28 Drawing Sheets

(51) Int. Cl.

| | |
|---|---|
| ***H10H 20/82*** | (2025.01) |
| ***H10H 20/825*** | (2025.01) |
| ***H10H 20/84*** | (2025.01) |
| ***H10H 20/851*** | (2025.01) |
| ***H10H 20/856*** | (2025.01) |

(52) U.S. Cl.
CPC .......... *H10H 20/82* (2025.01); *H10H 20/825* (2025.01); *H10H 20/84* (2025.01); *H10H 20/851* (2025.01); *H10H 20/856* (2025.01); *H10H 20/032* (2025.01); *H10H 20/034* (2025.01); *H10H 20/0361* (2025.01)

(58) Field of Classification Search
CPC ......... H01L 33/44; H01L 33/50; H01L 33/60; H01L 2933/0016; H01L 25/167; H01L 2933/0025; H01L 2933/0041; H01L 33/12; H01L 33/42; H01L 33/62; H01L 2933/0066
See application file for complete search history.

(56) References Cited

U.S. PATENT DOCUMENTS

| | | | | |
|---|---|---|---|---|
| 2016/0043152 | A1* | 2/2016 | Tian | H10K 59/123 257/27 |
| 2016/0071463 | A1 | 3/2016 | Takahashi et al. | |
| 2016/0147109 | A1 | 5/2016 | Yamazaki et al. | |
| 2016/0336374 | A1 | 11/2016 | Jiang et al. | |
| 2018/0122836 | A1* | 5/2018 | Kang | H01L 27/1248 |
| 2018/0122837 | A1 | 5/2018 | Kang et al. | |
| 2018/0175268 | A1 | 6/2018 | Moon et al. | |
| 2019/0066592 | A1 | 2/2019 | Kim | |
| 2020/0168777 | A1* | 5/2020 | Kang | H01L 33/36 |
| 2020/0259055 | A1 | 8/2020 | Iguchi et al. | |

FOREIGN PATENT DOCUMENTS

| | | | |
|---|---|---|---|
| JP | 2011-009268 | A | 1/2011 |
| JP | 2015-015321 | A | 1/2015 |
| JP | 2016-031927 | A | 3/2016 |
| JP | 2016-059041 | A | 4/2016 |
| JP | 2016-206642 | A | 12/2016 |
| JP | 2018-101785 | A | 6/2018 |
| JP | 2018-180436 | A | 11/2018 |
| KR | 2019-0048988 | A | 5/2019 |
| WO | WO-2019/053923 | A1 | 3/2019 |
| WO | WO-2019/168187 | A1 | 9/2019 |

OTHER PUBLICATIONS

Jeong et al., "Fabrication of full-color InGaN-based light-emitting diodes on amorphous substrates by pulsed sputtering", Scientific Reports 4:5325, Jun. 23, 2014; 4 pages.

Kim et al., "Fabrication of full-color GaN-based light-emitting diodes on nearly lattice-matched flexible metal foils", Scientific Reports 7:2112, May 18, 2017; 5 pages.

* cited by examiner

IMAGE DISPLAY DEVICE MANUFACTURING METHOD AND IMAGE DISPLAY DEVICE

CROSS-REFERENCE TO RELATED APPLICATIONS

The present application is a bypass continuation of PCT Application No. PCT/JP2020/036933, filed Sep. 29, 2020, which claims priority to Japanese Application No. 2019-181637, filed Oct. 1, 2019. The contents of these applications are hereby incorporated by reference in their entireties.

BACKGROUND

Embodiments of the present invention relate to an image display device manufacturing method and an image display device.

Realization of a thin image display device having high brightness, a wide viewing angle, high contrast, and low power consumption has been desired. To accommodate such market demands, advancements have been made in the development of a display device that utilizes a self-light-emitting element.

The emergence of a display device that uses, as a self-light-emitting element, a micro light-emitting diode (LED), which is a fine light-emitting element, is expected. As a manufacturing method of a display device that uses a micro LED, a method of sequentially transferring individually formed micro LEDs to a drive circuit has been introduced. Nevertheless, as the number of micro LED elements increases as image quality advances, such as full high definition, 4K, and 8K, in the individual formation and the sequential transfer of a large number of micro LEDs to a substrate on which a drive circuit and the like are formed, a significant amount of time is required for the transfer process. Furthermore, connection failure or the like between a micro LED and the drive circuit or the like may occur, resulting in a decrease in yield.

There is known a technique of growing a semiconductor layer including a light-emitting layer on a Si substrate, forming an electrode on the semiconductor layer, and then bonding the semiconductor layer to a circuit substrate on which a drive circuit is formed (for example, Patent Document 1: JP 2002-141492 A).

SUMMARY

An embodiment of the present invention provides an image display device manufacturing method that reduces a transfer process of a light-emitting element and improves yield.

An image display device manufacturing method according to an embodiment of the present invention includes preparing a first substrate including a circuit including a circuit element formed on a light-transmitting substrate and a first insulating film covering the circuit, forming on the first insulating film a layer including graphene, forming on the layer including graphene a semiconductor layer including a light-emitting layer, etching the semiconductor layer to form a light-emitting element, forming a second insulating film covering the layer including graphene, the light-emitting element, and the first insulating film, forming a via passing through the first insulating film and the second insulating film, and electrically connecting the light-emitting element and the circuit element through the via at a light-emitting surface facing a surface of the light-emitting element on a side of the first insulating film.

An image display device according to an embodiment of the present invention includes a light-transmitting substrate including a first surface, a circuit element provided on the first surface, a first wiring layer provided on the circuit element and electrically connected to the circuit element, a first insulating film covering the circuit element and the first wiring layer on the first surface, a first portion provided on the first insulating film and including graphene, a light-emitting element provided on the first portion, a second insulating film covering at least a portion of the light-emitting element, the first portion, and the first insulating film, a second wiring layer provided on the second insulating film and electrically connected to a light-emitting surface facing a surface of the light-emitting element on a side of the first insulating film, and a first via passing through the first insulating film and the second insulating film and electrically connecting the first wiring layer and the second wiring layer.

An image display device according to an embodiment of the present invention includes a substrate including a first surface and having flexibility, a circuit element provided on the first surface, a first wiring layer provided on the circuit element and electrically connected to the circuit element, a first insulating film covering the circuit element and the first wiring layer on the first surface, a first portion provided on the first insulating film and including graphene, a light-emitting element provided on the first portion, a second insulating film covering at least a portion of the light-emitting element, the first portion, and the first insulating film, a second wiring layer provided on the second insulating film and electrically connected to a light-emitting surface facing a surface of the light-emitting element on a side of the first insulating film, and a first via passing through the first insulating film and the second insulating film and electrically connecting the first wiring layer and the second wiring layer.

An image display device according to an embodiment of the present invention includes a light-transmitting substrate including a first surface, a plurality of transistors provided on the first surface, a first wiring layer provided on the plurality of transistors and electrically connected to the plurality of transistors, a first insulating film covering the plurality of transistors and the first wiring layer on the first surface, a portion provided on the first insulating film and including graphene, a first semiconductor layer of a first conductivity type provided on the portion, a light-emitting layer provided on the first semiconductor layer, a second semiconductor layer of a second conductivity type, different from the first conductivity type, provided on the light-emitting layer, a second insulating film covering the portion, the first insulating film, the light-emitting layer, and the first semiconductor layer, and covering at least a portion of the second semiconductor layer, a second wiring layer connected to a light-transmitting electrode arranged on a plurality of light-emitting surfaces of the second semiconductor layer, each exposed from the second insulating film in accordance with the plurality of transistors, and a plurality of vias passing through the first insulating film and the second insulating film and each electrically connecting a wiring line of the first wiring layer and a wiring line of the second wiring layer.

According to an embodiment of the present invention, an image display device manufacturing method that reduces a transfer process of a light-emitting element and improves yield may be realized.

DETAILED DESCRIPTION

Figure 1:
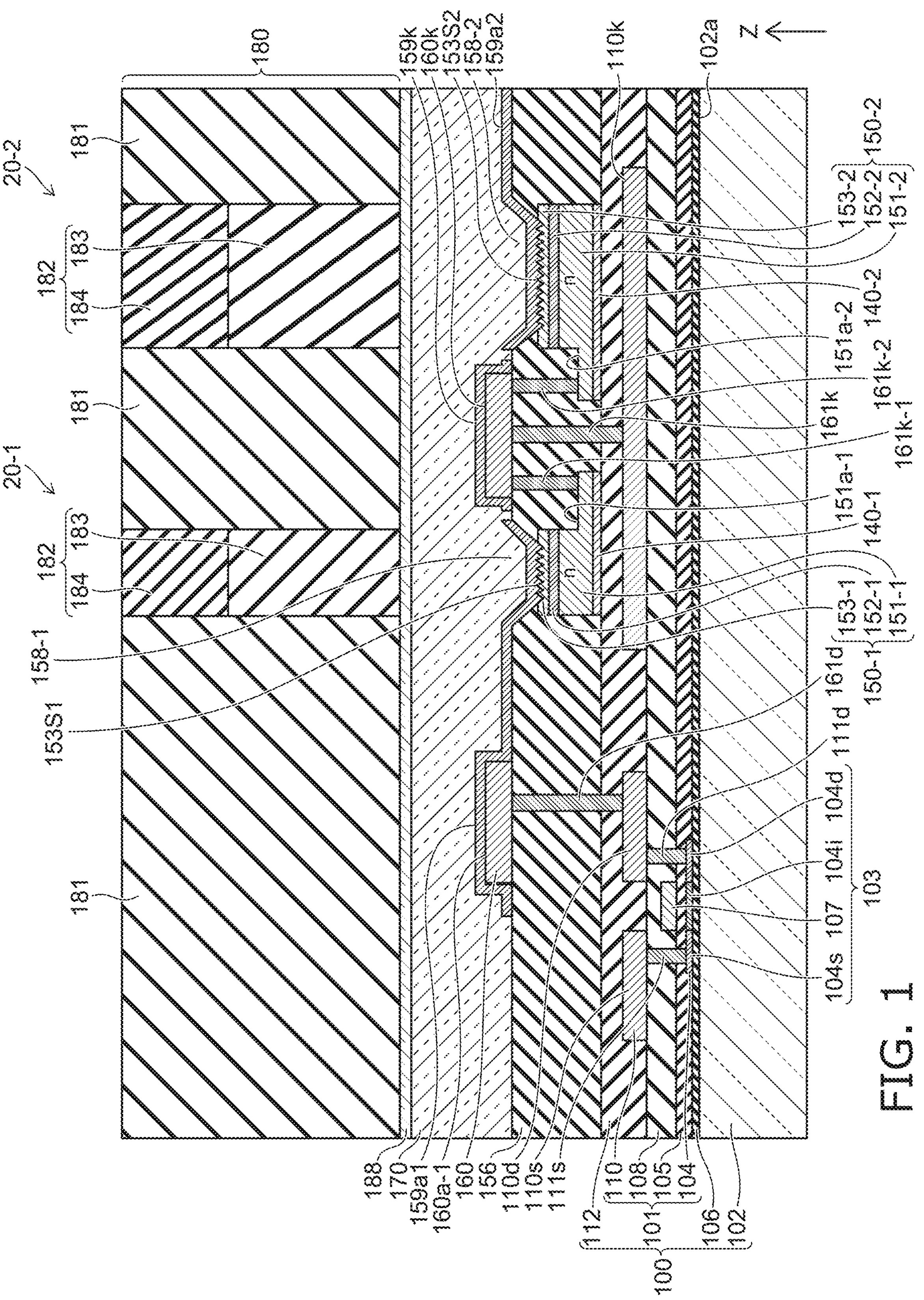
FIG. 1 is a schematic cross-sectional view illustrating a portion of an image display device according to a first embodiment.

Embodiments of the present invention will be described below with reference to the drawings.

Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated.

Note that, in the specification and the drawings, elements similar to those described in relation to a previously drawing are denoted using like reference characters, and a detailed description is omitted as appropriate.

First Embodiment

FIG. 1 is a schematic cross-sectional view illustrating a portion of an image display device according to an embodiment.

FIG. 1 schematically illustrates a configuration of a sub-pixel 20-1 of the image display device according to the present embodiment. A pixel constituting an image displayed on the image display device is constituted by a plurality of sub-pixels. In FIG. 1, the sub-pixel 20-1 as well as a portion of a configuration of a sub-pixel 20-2 are illustrated.

In the following, description is sometimes made using a three-dimensional coordinate system of XYZ. The sub-pixels 20-1, 20-2 are arrayed on a two-dimensional plane. The two-dimensional plane in which the sub-pixels 20-1, 20-2 are arrayed is defined as an XY plane. The sub-pixels 20-1, 20-2 are arrayed in an X-axis direction and a Y-axis direction. FIG. 1 illustrates an aligned section view taken along the lines AA' in FIG. 4 described below, and is a cross-sectional view in which cross sections in a plurality of planes perpendicular to the XY plane are connected together. In other drawings as well, in a cross-sectional view of a plurality of planes perpendicular to the XY plane, the Z axis orthogonal to the XY plane is illustrated without illustrating the X axis and the Y axis, as in FIG. 1. That is, in these drawings, the plane perpendicular to the Z axis is the XY plane.

The sub-pixels 20-1, 20-2 respectively include light-emitting surfaces 153S1, 153S2 that are substantially parallel to the XY plane. The light-emitting surfaces 153S1, 153S2 emit light mainly in a positive direction of the Z axis substantially orthogonal to the XY plane.

As illustrated in FIG. 1, the sub-pixel 20-1 of the image display device of the present embodiment includes a substrate 102, a transistor (circuit element) 103, a first wiring layer (first wiring layer) 110, a first interlayer insulating film (first insulating film) 112, a graphene sheet 140-1, a light-emitting element 150-1, a second interlayer insulating film (second insulating film) 156, a plurality of vias 161*d*, 161*k*, 161*k*-1, and a second wiring layer (second wiring layer) 160.

In the present embodiment, the image display device includes the sub-pixel 20-2. For example, the sub-pixel 20-2 is disposed adjacent to the sub-pixel 20-1. The sub-pixel 20-2 includes the substrate 102, the first wiring layer 110, the first interlayer insulating film 112, the second interlayer insulating film 156, the via 161*k*, and the second wiring layer 160, which are common to the sub-pixel 20-1. In FIG. 1, while a transistor for the sub-pixel 20-2 is not illustrated, a transistor that drives a light-emitting element 150-2 is provided separately.

In the present embodiment, the substrate 102 on which circuit elements including the transistor 103 are formed is a light-transmitting substrate, and is, for example, a glass substrate. The substrate 102 includes a first surface 102*a*. The first surface 102*a* is a surface substantially parallel to the XY plane. The transistor 103 is a thin film transistor (TFT) and is formed on the first surface 102*a*. The light-emitting elements 150-1, 150-2 are driven by the TFT formed on the glass substrate. The process of forming circuit elements including the TFT on a large glass substrate is established for the manufacture of a liquid crystal panel, an organic electroluminescent (EL) panel, and the like, resulting in the advantage that an existing plant can be utilized.

The sub-pixels 20-1, 20-2 further include a color filter 180. The color filter (wavelength conversion member) 180 is provided on a surface resin layer 170 with a transparent thin film adhesive layer 188 interposed therebetween. The surface resin layer 170 is provided on the interlayer insulating film 156 and the wiring layer 160.

The configuration of the sub-pixels 20-1, 20-2 will now be described in detail.

The transistor 103 is formed on a TFT lower layer film 106 formed on the first surface 102*a* of the substrate 102. The TFT lower layer film 106 is provided to ensure flatness when the transistor 103 is formed, and to protect a TFT channel 104 of the transistor 103 from contamination and the like during heat treatment. The TFT lower layer film 106 is, for example, $SiO_2$.

In addition to the transistor 103 for driving the light-emitting element 150-1, circuit elements such as a transistor for driving the light-emitting element 150-2 and other transistors and capacitors are formed on the substrate 102, forming, with wiring lines and the like, a circuit 101. For example, the transistor 103 corresponds to a drive transistor 26 illustrated in FIG. 3 described below.

Hereinafter, the circuit 101 is a circuit that includes the TFT channel 104, an insulating layer 105, an insulating film 108, vias 111*s*, 111*d*, and the wiring layer 110. The substrate 102, the TFT lower layer film 106, the circuit 101, and other components such as the interlayer insulating film 112 may be collectively referred to as a circuit substrate 100.

The transistor 103 is a p-channel TFT in this example. The transistor 103 includes the TFT channel 104 and a gate 107. The TFT is preferably formed by a low temperature polysilicon (LTPS) process. The TFT channel 104 is a region of polycrystalline Si formed on the substrate 102, and is polycrystallized and activated by annealing a region formed as amorphous Si by laser irradiation. A TFT formed by the LTPS process has sufficiently high mobility.

The TFT channel 104 includes regions 104*s*, 104*i*, 104*d*. The regions 104*s*, 104*i*, 104*d* are all provided on the TFT lower layer film 106. The region 104*i* is provided between the regions 104*s*, 104*d*. The regions 104*s*, 104*d* are doped with a p-type impurity such as boron ions ($B^+$) and boron fluoride ions ($BF_2^+$) and are in ohmic connection with the vias 111*s*, 111*d*.

The gate 107 is provided on the TFT channel 104 with the insulating layer 105 interposed therebetween. The insulating layer 105 is provided to insulate the TFT channel 104 and the gate 107 and to provide insulation from other adjacent circuit elements. When a potential lower than that of the region 104*s* is applied to the gate 107, a channel is formed in the region 104*i*, making it possible to control a current flowing between the regions 104*s*, 104*d*.

The insulating layer 105 is, for example, $SiO_2$. The insulating layer 105 may be a multi-layer insulating layer including $SiO_2$, $Si_3N_4$, or the like in accordance with the covered region.

The gate 107 is, for example, polycrystalline Si. The polycrystalline Si film of the gate 107 can be generally created by a chemical vapor deposition (CVD) process.

In this example, the gate 107 and the insulating layer 105 are covered by the insulating film 108. The insulating film 108 is, for example, $SiO_2$ or $Si_3N_4$. The insulating film 108 functions as a flattening film for forming the wiring layer 110. The insulating film 108 is a multi-layer insulating film containing $SiO_2$ or $Si_3N_4$, for example.

The vias 111*s*, 111*d* are provided through the insulating film 108. The first wiring layer (first wiring layer) 110 is formed on the insulating film 108. The first wiring layer 110 includes a plurality of wiring lines having potentials that may differ from each other, and includes wiring lines 110*s*, 110*d*, 110*k*. In the wiring layer in the cross-sectional views of FIG. 1 and subsequent drawings, the reference character of the wiring layer is displayed at a position lateral to one wiring line included in the denoted wiring layer.

The via 111*s* is provided between and electrically connects the wiring line 110*s* and the region 104*s*. The via 111*d* is provided between and electrically connects the wiring line 110*d* and the region 104*d*.

The wiring line 110*s*, in this example, electrically connects the region 104*s*, which is a source region of the transistor 103, to a power source line 3 illustrated in FIG. 3 described below. As described below, the wiring line 110*d* is electrically connected to a p-type semiconductor layer 153-1 on the light-emitting surface 153S1 side of the light-emitting element 150-1 through the via 161*d*, a wiring line 160*a*-1, and a light-transmitting electrode 159*a*1.

The wiring line 110*k* is, in this example, connected to a ground line 4 illustrated in FIG. 3 described below through the via 161*k*, the wiring line 160*k*, and the light-transmitting electrode 159*k*. The wiring line 110*k* is not limited to being connected to the ground line 4, and may be connected to the power source line 3 or other potential, or may not be connected to any potential.

The wiring line (second portion) 110*k* is provided below the light-emitting elements 150-1, 150-2, and functions as a light-reflecting plate that reflects light emitted downward by the light-emitting element 150-1, 150-2. An outer periphery of the wiring line 110*k* includes outer peripheries of the light-emitting elements 150-1, 150-2 as a whole when the light-emitting elements 150-1, 150-2 are projected onto the wiring line 110*k* in an XY plane view. By appropriately selecting the material of the wiring line 110*k*, the light scattered downward of the light-emitting elements 150-1, 150-2 can be reflected toward the light-emitting surface 153S1, 153S2 side, improving light emission efficiency.

The wiring line 110*k* reflects the light scattered downward of the light-emitting element 150-1 toward the light-emitting surface 153S1 side, making it possible to ensure that the emitted light of the light-emitting element 150-1 does not reach the transistor 103. The wiring line 110*k* also reflects the light scattered downward of the light-emitting element 150-2 toward the light-emitting surface 153S2 side, making it possible to ensure that the emitted light of the light-emitting element 150-2 does not reach the transistor that drives the light-emitting element 150-2. The wiring line 110*k* blocks light scattered downward of the light-emitting elements 150-1, 150-2, thereby inhibiting the scattered light from reaching the circuit element including the transistor 103 and making it possible to prevent malfunction of circuit elements as well.

The wiring layer 110 and the vias 111*s*, 111*d* are formed by Al, an Al alloy, or a layered film of Al and Ti or the like, for example. In a layered film of Al and Ti, for example, Al is layered on a thin film of Ti, and Ti is further layered on Al.

The interlayer insulating film 112 is provided on the insulating film 108 and the wiring layer 110. The interlayer insulating film (first insulating film) 112 is an organic insulating film such as phosphorus silicon glass (PSG) or boron phosphorus silicon glass (BPSG), for example. The interlayer insulating film 112 insulates the circuit elements of the circuit 101 formed on the circuit substrate 100 and provides a flat surface for providing the graphene sheets 140-1, 140-2. The interlayer insulating film 112 also functions as a protective film that protects a front surface of the circuit substrate 100.

The graphene sheets 140-1, 140-2 are provided above the wiring line 110*k* with the interlayer insulating film 112 interposed therebetween. The light-emitting element 150-1 is provided on the graphene sheet (first portion including graphene) 140-1, and the light-emitting element 150-2 is provided on the graphene sheet 140-2. An outer periphery of the graphene sheet 140-1 substantially matches the outer periphery of the light-emitting element 150-1. An outer periphery of the graphene sheet 140-2 substantially matches the outer periphery of the light-emitting element 150-2.

The light-emitting element 150-1 includes an n-type semiconductor layer (first semiconductor layer) 151-1, a light-emitting layer 152-1, and the p-type semiconductor layer (second semiconductor layer) 153-1. The n-type semiconductor layer 151-1, the light-emitting layer 152-1, and the p-type semiconductor layer 153-1 are layered in this order from the side of the interlayer insulating film 112 toward the side of the light-emitting surface 153S1. A lower portion of the n-type semiconductor layer 151-1 includes a step portion 151*a*-1. The step portion 151*a*-1 projects toward the light-emitting element 150-2. The step portion 151*a*-1 is provided to connect the n-type semiconductor layer 151-1 to the via 161*k*-1.

The light-emitting element 150-2 includes an n-type semiconductor layer 151-2, a light-emitting layer 152-2, and a p-type semiconductor layer 153-2. The n-type semiconductor layer 151-2, the light-emitting layer 152-2, and the p-type semiconductor layer 153-2 are layered in this order from the side of the interlayer insulating film 112 toward the side of the light-emitting surface 153S2. A lower portion of the n-type semiconductor layer 151-2 includes a step portion 151*a*-2. The step portion 151*a*-2 projects toward the light-emitting element 150-1. The step portion 151*a*-2 is provided to connect the n-type semiconductor layer 151-2 to the via 161*k*-2.

An area of the light-emitting element in an XY plane view is set in accordance with the light emission colors of red, green, and blue sub-pixels. The areas of the light-emitting elements 150-1, 150-2 in an XY plane view are set as appropriate according to visibility, a conversion efficiency of a color conversion unit 182 of the color filter 180, and the like. In this example, the areas of the two light-emitting elements 150-1, 150-2 in an XY plane view are different. The light-emitting elements 150-1, 150-2 are mounted on a surface of the wiring line 110*k* that is substantially parallel to the XY plane, and thus the areas in an XY plane view are the areas of the regions surrounded by the outer peripheries of the light-emitting elements 150-1, 150-2 projected onto the XY plane. In the following, the area in an XY plane view is simply referred to as "area." In this example, the area of the light-emitting element 150-1 is smaller than the area of the light-emitting element 150-2.

Note that, in this example, the light-emitting elements 150-1, 150-2 include the step portions 151*a*-1, 151*a*-2, respectively. The step portions 151*a*-1, 151*a*-2 are formed by processing the n-type semiconductor layers 151-1, 151-2, and thus do not directly contribute to light emission. Therefore, the areas of the light-emitting elements 150-1, 150-2 are the areas of the light-emitting layers 152-1, 152-2 in an XY plane view.

The light-emitting elements 150-1, 150-2 have substantially square or rectangular shapes in an XY plane view, for example, but a corner portion may be rounded. The light-emitting element 150 may have, for example, an elliptical shape or a circular shape in an XY plane view. With appropriate selection of the shape, the arrangement, and the like of the light-emitting element in a plan view, a degree of freedom of the layout is improved.

As the light-emitting elements 150-1, 150-2, a gallium nitride compound semiconductor including a light-emitting layer such as $In_XAl_YGa_{1-X-Y}N$ (where $0 \leq X$, $0 \leq Y$, $X+Y<1$), for example, is preferably used. Hereinafter, the gallium nitride compound semiconductor described above may be simply referred to as gallium nitride (GaN). The light-emitting elements 150-1, 150-2 in one embodiment of the present invention are so-called light-emitting diodes, and a wavelength of light emitted by the light-emitting elements 150-1, 150-2 is about 467 nm±20 nm, for example. The wavelength of light emitted by the light-emitting elements 150-1, 150-2 may be a blue violet emission of about 410 nm±20 nm. The wavelength of the light emitted by the light-emitting elements 150-1, 150-2 is not limited to the values described above and may be an appropriate value.

The second interlayer insulating film 156 covers the first interlayer insulating film 112, the graphene sheets 140-1, 140-2, and the light-emitting elements 150-1, 150-2. The interlayer insulating film 156 is formed of an organic insulating material or the like. The interlayer insulating film 156 covers the light-emitting elements 150-1, 150-2, the graphene sheets 140-1, 140-2, and the like, thereby providing protection from a surrounding environment, such as dust and humidity, and the like. The interlayer insulating film 156 covers the light-emitting element 150, the graphene sheets 140-1, 140-2, and the like, thereby having a function of insulating these from other conductors. A front surface of the interlayer insulating film 156 need only be flat enough to allow formation of the wiring layer 160 on the interlayer insulating film 156.

The organic insulating material used for the interlayer insulating film 156 is preferably a white resin. The interlayer insulating film 156 that is a white resin can reflect the laterally emitted light of the light-emitting elements 150-1, 150-2, the return light caused by the interface of the color filter 180, and the like and substantially improve the light emission efficiency of the light-emitting elements 150-1, 150-2.

The white resin is formed by dispersing scattering microparticles having a Mie scattering effect on a transparent resin such as a silicon-based resin such as spin-on glass (SOG) or a novolac phenolic resin. The microparticles are colorless or white, and have a diameter of about one-tenth to several times the wavelength of the light emitted by the light-emitting elements 150-1, 150-2. Microparticles having a diameter of about one-half the wavelength of the light are suitably used as the scattering microparticles. Examples of such scattering microparticles include $TiO_2$, $Al_2SO_3$, and ZnO. Alternatively, the white resin can also be formed by utilizing a number of fine pores or the like dispersed within a transparent resin. The interlayer insulating film 156 may be whitened by using a $SiO_2$ film or the like formed by atomic layer deposition (ALD) or CVD, for example, instead of SOG.

The second interlayer insulating film 156 may be a black resin. With the interlayer insulating film 156 being a black resin, the scattering of light within the sub-pixels 20-1, 20-2 is suppressed, and stray light is more effectively suppressed. An image display device in which stray light is suppressed can display a sharper image.

The via 161*k*-1 is provided through the second interlayer insulating film 156. One end of the via 161*k*-1 is connected to the step portion 151*a*-1. The via 161*k*-2 is provided through the second interlayer insulating film 156. One end of the via 161*k*-2 is connected to the step portion 151*a*-2.

The via (second via) 161*k* is provided through the interlayer insulating films 112, 156. One end of the via 161*k* is connected to the wiring line 110*k*.

The via (first via) 161*d* is provided through the interlayer insulating films 112, 156. One end of the via 161*d* is connected to the wiring line 110*d*.

The wiring layer 160 is provided on the interlayer insulating film 156. The wiring layer 160 includes the wiring lines 160*a*-1, 160*k*. The wiring line 160*a*-1 is connected to the other end of the via 161*d*.

A light-transmitting electrode 159*a*1 is provided over the wiring line 160*a*-1. The light-transmitting electrode 159*a*1 is provided over the light-emitting surface 153S1 of the light-emitting element 150-1. The light-transmitting electrode 159*a*1 is provided between the wiring line 160*a*-1 and the light-emitting surface 153S1, and electrically connects the wiring line 160*a*-1 and the p-type semiconductor layer 153-1. Accordingly, the p-type semiconductor layer 153-1 that is an anode electrode of the light-emitting element 150-1 is electrically connected, via the light-transmitting electrode 159*a*1, the wiring line 160*a*-1, the via 161*d*, and the wiring line 110*d*, to the region 104*d* of the channel that is a drain electrode of the transistor 103.

A light-transmitting electrode 159*a*2 is provided over the light-emitting surface 153S2 of the light-emitting element 150-2. Similar to the case of the light-emitting element 150-1, the light-emitting surface 153S2 is electrically connected, via the light-transmitting electrode 159*a*2, a wiring line included in the wiring layer 160, and a via passing through the interlayer insulating films 112, 156, to a transistor that drives the light-emitting element 150-2. The light-emitting surfaces 153S1, 153S2 are both roughened.

The wiring line 160*k* is connected to the other ends of the vias 161*k*, 161*k*-1, 161*k*-2. A light-transmitting electrode 159*k* is provided over the wiring line 160*k*. The wiring line 160*k* and the light-transmitting electrode 159*k* are connected to the ground line 4 illustrated in FIG. 3 described below. Accordingly, the n-type semiconductor layers 151-1, 151-2 are connected to the ground line 4 through the vias 161*k*-1, 161*k*-2, the wiring line 160*k*, and the light-transmitting electrode 159*k*. Further, in this example, the wiring line 110*k* is connected to the ground line 4 together with the n-type semiconductor layers 151-1, 151-2.

Figure 3:
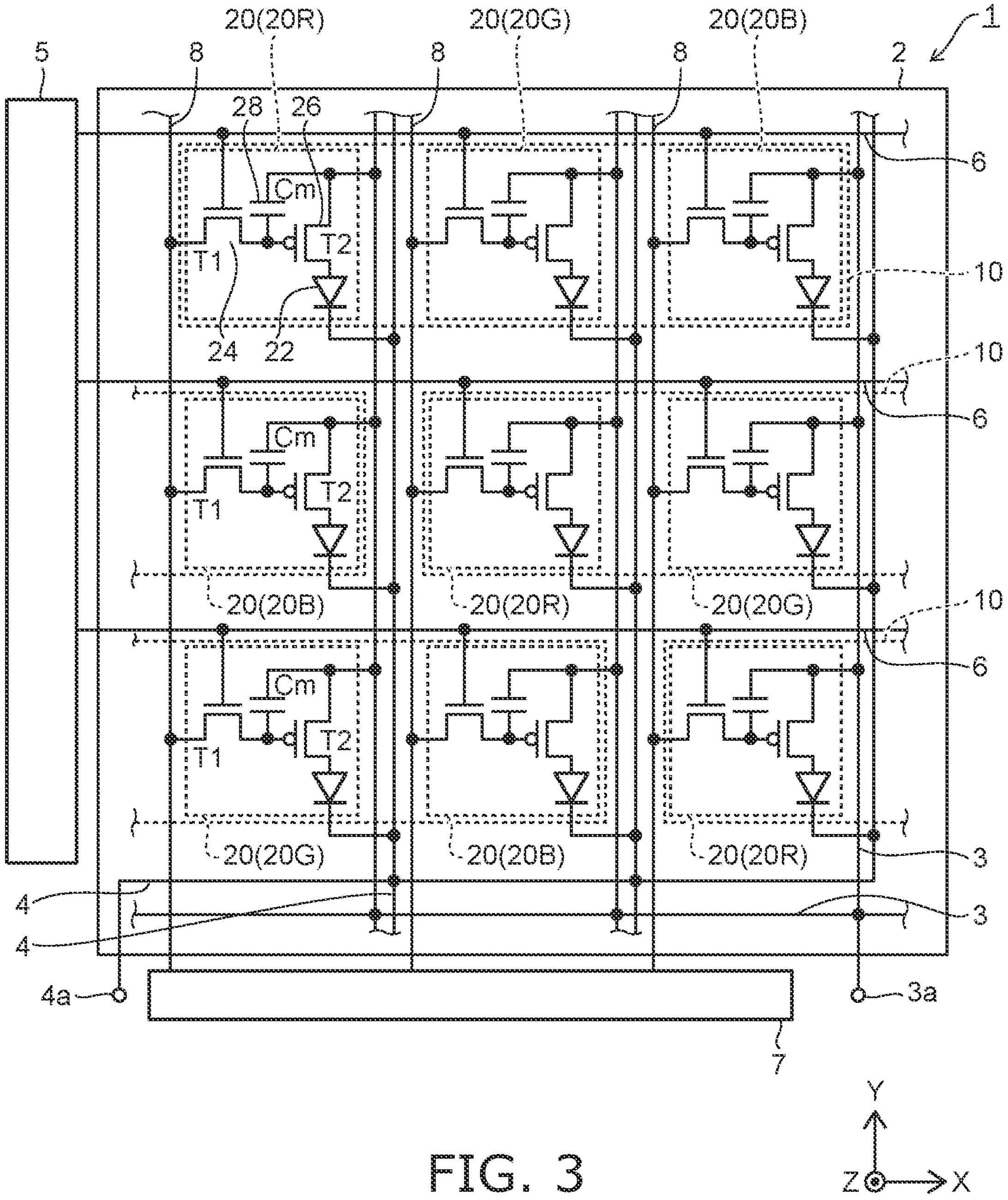
FIG. 3 is a schematic block diagram illustrating the image display device according to the first embodiment.

The region 104*s* of the TFT channel 104 that is a source electrode of the transistor 103 is electrically connected, via the wiring line 110*s*, to the power source line 3 illustrated in FIG. 3.

The surface resin layer 170 covers the second interlayer insulating film 156, the second wiring layer 160, and the light-transmitting electrodes **159*a*1, 159*a*2, 159*k*. The surface resin layer 170 is a transparent resin and provides a flat surface for protecting the second interlayer insulating film 156, the wiring layer 160, and the light-transmitting electrodes 159*a*1, 159*a*2, 159*k*, and for adhering the color filter 180**.

The color filter 180 includes a light-blocking portion 181 and the color conversion unit 182. The color conversion unit 182 is provided directly above the light-emitting surfaces 153S1, 153S2 of the light-emitting elements 150-1, 150-2 in accordance with the shapes of the light-emitting surfaces 153S1, 153S2. In the color filter 180, a portion other than the color conversion unit 182 is the light-blocking portion 181. The light-blocking portion 181 is a so-called black matrix, and can reduce bleeding caused by the color mixing of light emitted from the adjacent color conversion unit 182 and the like, and thus display a sharp image.

The color conversion unit 182 is one layer or two layers. A portion of two layers is illustrated in FIG. 1. Whether the color conversion unit 182 is one layer or two layers is determined by the color, that is, the wavelength, of the light emitted by the sub-pixels 20-1, 20-2. In a case in which the light emission color of the sub-pixels 20-1, 20-2 is red or green, the color conversion unit 182 is preferably the two layers of a color conversion layer 183 and a filter layer 184 described below. In a case in which the light emission color of the sub-pixels 20-1, 20-2 is blue, one layer is preferred.

In a case in which the color conversion unit 182 is two layers, a first layer closer to the light-emitting elements 150-1, 150-2 is the color conversion layer 183, and a second layer is the filter layer 184. That is, the filter layer 184 is layered on the color conversion layer 183.

The color conversion layer 183 is a layer that converts the wavelength of the light emitted by the light-emitting elements 150-1, 150-2 to a desired wavelength. For example, in a case in which the sub-pixel emits red light, the color conversion layer 183 converts light of 467 nm±20 nm, which is the wavelength of the light-emitting element 150-1, to light having a wavelength of about 630 nm±20 nm, for example. In a case in which the sub-pixel emits green, the color conversion layer 183 converts light of 467 nm±20 nm, which is the wavelength of the light-emitting element, to light having a wavelength of about 532 nm±20 nm, for example.

The filter layer 184 blocks the wavelength component of the remaining blue light emission without color conversion by the color conversion layer 183.

In a case in which the color of the light emitted by the sub-pixel is blue, the light-emitting element of the sub-pixel may output the light via the color conversion layer 183 or may output the light as is without the light being passed through the color conversion layer 183. In a case in which the wavelength of the light emitted by the light-emitting element is about 467 nm±20 nm, the light-emitting element of the sub-pixel may output the light without the light being passed through the color conversion layer 183. In a case in which the wavelength of the light emitted by the light-emitting element is set to 410 nm±20 nm, it is preferable to provide the one layer of the color conversion layer 183 in order to convert the wavelength of the light to be output to about 467 nm±20 nm.

Even in the case of a blue sub-pixel, the sub-pixel may include the filter layer 184. With the filter layer 184 provided in the blue sub-pixel, minute reflection of external light generated at the front surface of the light-emitting element of the sub-pixel is suppressed.

Modified Example

A modified example of the configuration of the sub-pixel will now be described.

Figure 2A:
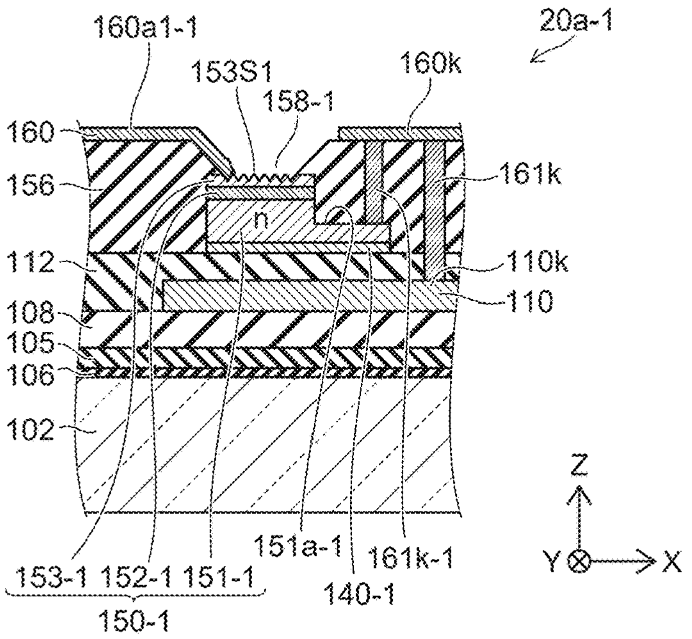
FIG. 2A is a schematic cross-sectional view illustrating a portion of a modified example of the image display device according to the first embodiment.
Figure 2B:
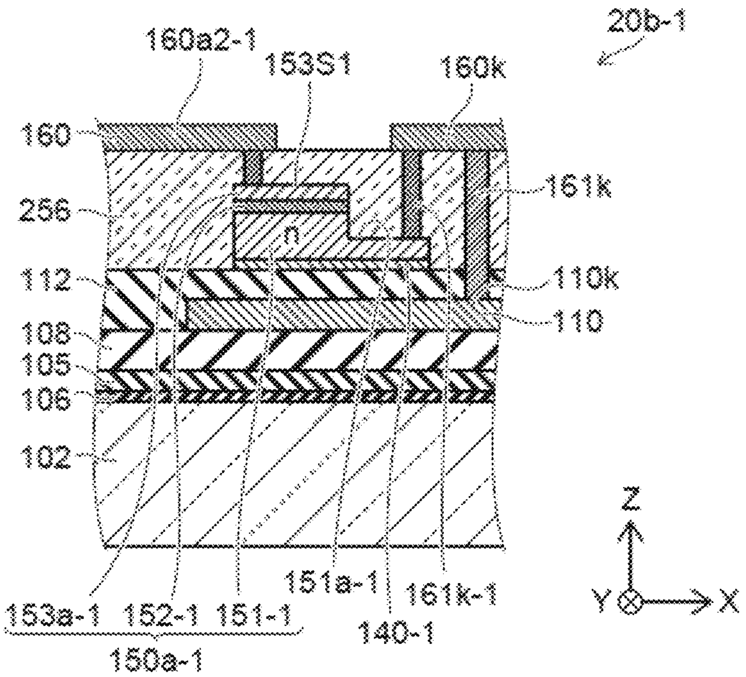
FIG. 2B is a schematic cross-sectional view illustrating a portion of the modified example of the image display device according to the first embodiment.

FIG. 2A and FIG. 2B are schematic cross-sectional views illustrating portions of the modified example of the image display device according to the present embodiment.

FIG. 2A illustrates one light-emitting element 150-1 of the two light-emitting elements 150-1, 150-2 illustrated in FIG. 1. The configurations including the two light-emitting elements 150-1, 150-2 are the same, and in the following description of the present modified example, the configuration including the light-emitting element 150-1 will be described. In FIG. 2B as well, a configuration including one light-emitting element **150*a*-1** of the two light-emitting elements will be described.

In the cross-sectional views of the sub-pixels in FIG. 2A and subsequent drawings, illustration of the surface resin layer 170 and the color filter 180 is omitted in order to avoid complexity. In the subsequent drawings, unless otherwise specified, the surface resin layer 170, the color filter 180, and the like are provided on the second interlayer insulating films 156, 256 and the second wiring layer 160. With regard to the other embodiments and other modified examples described below as well, illustration of the surface resin layer 170 and the color filter 180 is similarly omitted.

In a sub-pixel **20*a*-1 of FIG. 2A, the method of connecting the light-emitting element 150-1 and a wiring line 160*a*1-1** differs from that in the first embodiment described above. The same components are denoted by the same reference characters, and detailed descriptions thereof will be omitted as appropriate.

As illustrated in FIG. 2A, the sub-pixel **20*a*-1 includes the wiring line 160*a*1-1. The wiring line 160*a*1-1 extends to the light-emitting surface 153S1 of the light-emitting element 150-1 and, at one end of the wiring line 160*a*1-1, is electrically connected to a surface of the p-type semiconductor layer 153-1 including the light-emitting surface 153S1. The light-emitting surface 153S1 and the surface including the light-emitting surface 153S1** are coplanar surfaces.

The light-emitting surface 153S1 is preferably roughened as in the embodiment described above. In a case in which the light-emitting surface 153S1 is a rough surface, the light extraction efficiency of the light-emitting element 150-1 can be improved.

In a sub-pixel **20*b*-1 of FIG. 2B, the light-emitting element 150*a*-1 differs from that in the first embodiment in including a p-type semiconductor layer 153*a*-1 that is not roughened. In the sub-pixel 20*b*-1, the method of connecting the light-emitting element 150*a*-1 and a wiring line 160*a*2-1 differs from that in the first embodiment. The sub-pixel 20*b*-1 of the present modified example includes the second interlayer insulating film (second insulating film) 256** unlike the case of the first embodiment.

As illustrated in FIG. 2B, in the sub-pixel **20*b*-1, the second interlayer insulating film 256 is a resin having light transmittance, and is preferably a transparent resin. Examples of transparent resin materials include silicon-based resins such as SOG and novolac phenolic resin. The light-emitting element 150*a*-1 emits light from the light-emitting surface 153S1 via the transparent interlayer insulating film 256. The light-emitting surface 153S1 is connected to the wiring line 160*a*2-1 of the second wiring layer 160** via a contact hole.

In the sub-pixel **20*b*-1 of the present modified example, the light-emitting element 150*a*-1 emits light from the light-emitting surface 153S1 via the interlayer insulating film 256, and thus the process of forming an opening in the interlayer insulating film 256 and the process of roughening the light-emitting surface 153S1** can be omitted.

In the present embodiment, any of the configurations of the sub-pixels 20-1, **20*a*-1, 20*b*-1** described above can be included.

FIG. 3 is a schematic block diagram illustrating the image display device according to the present embodiment.

As illustrated in FIG. 3, an image display device 1 according to the present embodiment includes a display region 2. The sub-pixels 20 are arrayed in the display region 2. The sub-pixels 20 are arrayed, for example, in a lattice pattern. For example, n sub-pixels 20 are arrayed along the X axis, and m sub-pixels 20 are arrayed along the Y axis.

A pixel 10 includes a plurality of the sub-pixels 20 that emit different colors of light. A sub-pixel 20R emits red light. A sub-pixel 20G emits green light. A sub-pixel 20B emits blue light. The three types of sub-pixels 20R, 20G, 20B emit light at a desired brightness, and thus the light emission color and brightness of one pixel 10 are determined.

One pixel 10 includes the three sub-pixels 20R, 20G, 20B, and the sub-pixels 20R, 20G, 20B are arrayed in a linear shape on the X axis, for example, as in the example illustrated in FIG. 3. In each pixel 10, sub-pixels of the same color may be arrayed in the same column or, as in this example, sub-pixels of different colors may be arrayed on a per column basis.

The image display device 1 further includes the power source line 3 and the ground line 4. The power source line 3 and the ground line 4 are wired in a lattice pattern along the array of the sub-pixels 20. The power source line 3 and the ground line 4 are electrically connected to each sub-pixel 20, and power is supplied to each sub-pixel 20 from a direct current power source connected between a power source terminal **3*a* and a ground (GND) terminal 4*a*. The power source terminal 3*a* and the GND terminal 4*a* are respectively provided at end portions of the power source line 3 and the ground line 4, and are connected to a direct current power source circuit provided outside the display region 2. A positive voltage is supplied to the power source terminal 3*a* based on the GND terminal 4*a***.

The image display device 1 further includes a scanning line 6 and a signal line 8. The scanning line 6 is wired in a direction parallel to the X axis. That is, the scanning line 6 is wired along the array of the sub-pixels 20 in a row direction. The signal line 8 is wired in a direction parallel to the Y axis. That is, the signal line 8 is wired along the array of the sub-pixels 20 in a column direction.

The image display device 1 further includes a row selection circuit 5 and a signal voltage output circuit 7. The row selection circuit 5 and the signal voltage output circuit 7 are provided along an outer edge of the display region 2. The row selection circuit 5 is provided in the Y-axis direction of the outer edge of the display region 2. The row selection circuit 5 is electrically connected to the sub-pixel 20 of each column via the scanning line 6, and supplies a selection signal to each sub-pixel 20.

The signal voltage output circuit 7 is provided in the X-axis direction of the outer edge of the display region 2. The signal voltage output circuit 7 is electrically connected to the sub-pixel 20 of each row via the signal line 8, and supplies a signal voltage to each sub-pixel 20.

The sub-pixel 20 includes a light-emitting element 22, a selection transistor 24, the drive transistor 26, and a capacitor 28. In FIG. 3, the selection transistor 24 may be denoted as T1, the drive transistor 26 may be denoted as T2, and the capacitor 28 may be denoted as Cm.

The light-emitting element 22 is connected in series with the drive transistor 26. In the present embodiment, the drive transistor 26 is a p-channel TFT, and an anode electrode of the light-emitting element 22 connected to the p-type semiconductor layer is connected to a drain electrode that is a main electrode of the drive transistor 26. The series circuit of the light-emitting element 22 and the drive transistor 26 is connected between the power source line 3 and the ground line 4. The drive transistor 26 corresponds to the transistor 103 in FIG. 1 and the like, and the light-emitting element 22 corresponds to the light-emitting elements 150, **150*a* in FIG. 1 and the like. The current flowing to the light-emitting element 22 is determined by the voltage applied across the gate-source of the drive transistor 26, and the light-emitting element 22** emits light at a brightness corresponding to the flowing current.

The selection transistor 24 is connected between a gate electrode of the drive transistor 26 and the signal line 8 via the main electrode. A gate electrode of the selection transistor 24 is connected to the scanning line 6. The capacitor 28 is connected between the gate electrode of the drive transistor 26 and the power source line 3.

The row selection circuit 5 selects one row from the array of m rows of the sub-pixels 20 to supply a selection signal to the scanning line 6. The signal voltage output circuit 7 supplies a signal voltage having the required analog voltage value to each sub-pixel 20 in the selected row. The signal voltage is applied across the gate-source of the drive transistor 26 of the sub-pixels 20 of the select row. The signal voltage is held by the capacitor 28. The drive transistor 26 introduces a current corresponding to the signal voltage to the light-emitting element 22. The light-emitting element 22 emits light at a brightness corresponding to the current flowing in the light-emitting element 22.

The row selection circuit 5 supplies the selection signal by sequentially switching the selected row. That is, the row selection circuit 5 scans the rows in which the sub-pixels 20 are arrayed. A current corresponding to the signal voltage flows in the light-emitting element 22 of the sub-pixels 20 sequentially scanned, and light is emitted. Each pixel 10 emits light of the light emission color and brightness determined by the light emission color and the brightness emitted by the sub-pixels 20 of each RGB color, and an image is displayed in the display region 2.

Figure 4:
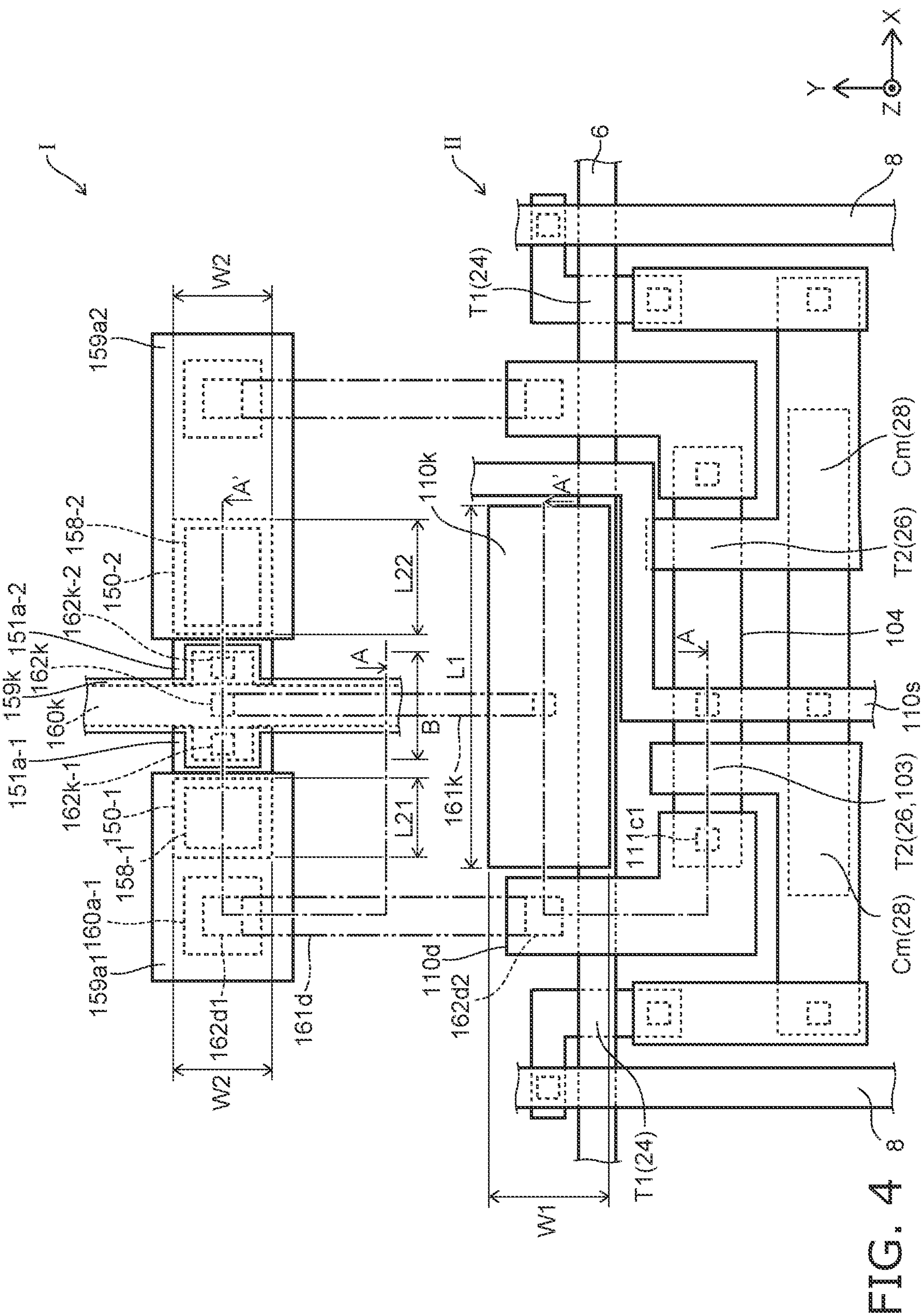
FIG. 4 is a schematic plan view illustrating a portion of the image display device according to the first embodiment.

FIG. 4 is a schematic plan view illustrating a portion of the image display device according to the present embodiment.

In the present embodiment, as illustrated in FIG. 1, the light-emitting element 150-1 (light-emitting element 22 in FIG. 3) and the drive transistor 103 (drive transistor 26 in FIG. 3) are layered in the Z-axis direction. The anode electrode of the light-emitting element 150-1 is electrically connected to the drain electrode of the transistor 103 by the via **161*d*. Further, a cathode electrode of the light-emitting element 150-1 is electrically connected to the ground line 4 illustrated in FIG. 3 by the via 161*k*-1. Similarly, an anode electrode and a cathode electrode of the light-emitting element 150-2 are also electrically connected to a predetermined circuit by a via. FIG. 4** schematically illustrates these three-dimensional configurations broken down into two plan views.

A plan view of the first layer is schematically illustrated in the upper portion of FIG. 4, and a plan view of the second layer is schematically illustrated in the lower portion. In FIG. 4, the first layer is denoted by "I" and the second layer is denoted by "II." The first layer is a layer in which the light-emitting elements 150-1, 150-2 are formed. That is, the first layer illustrates an element further on the positive side of the Z axis than the first interlayer insulating film 112 in FIG. 1, and the element illustrated in FIG. 4 is a layer from the graphene sheets 140-1, 140-2 to the second wiring layer 160. In FIG. 4, the second interlayer insulating film 156 is not illustrated.

The second layer illustrates an element that is further on the positive side of the Z axis than is the TFT lower layer film 106 in FIG. 1, and the element illustrated in FIG. 4 is a layer from the transistor 103 to the first interlayer insulating film 112. In FIG. 4, the substrate 102, the insulating layer 105, the insulating film 108, and the first interlayer insulating film 112 are not illustrated.

The cross-sectional view of FIG. 1 is an aligned section view taken along the lines AA' indicated by the dashed lines of alternate long and short dashes in the first layer and the second layer in FIG. 4.

In the present embodiment, the wiring line 160*k* of the first layer extends between the light-emitting elements 150-1, 150-2 in the Y-axis direction. The wiring line 110*s* of the second layer extends in the positive direction of the Y axis on an X coordinate substantially the same as that of the wiring line 160*k*. The wiring line 110*s* bends in the X-axis direction away from the wiring line 110*k*, extends in the X-axis direction along the outer periphery of the wiring line 110*k*, and subsequently bends again in the Y-axis direction. After bending in the Y-axis direction, the wiring line 110*s* extends in the positive direction of the Y axis along the outer periphery of the wiring line 110*k*.

The AA' line cuts the wiring line 160*k*, the light-transmitting electrode 159*k*, and the wiring line 110*s* on the negative side in the Y-axis direction of the light-emitting elements 150-1, 150-2 and the wiring line 110*k*. That is, in FIG. 1, when the wiring line 160*k*, the light-transmitting electrode 159*k*, and the wiring line 110*s* are to be illustrated on side A of the AA' line, illustration of the wiring line 160*k* and the light-transmitting electrode 159*k* is omitted in the region B of the drawing due to complexities in illustration. The same applies to the other embodiments described below as well.

As illustrated in FIG. 4, the light-emitting elements 150-1, 150-2 are provided above the wiring line 110*k*. The wiring line 110*k* is connected to the via 161*k* illustrated in FIG. 1 in the second layer. The via 161*k* is connected to the wiring line 160*k* by a via hole 162*k*.

One end of the via 161*k*-1 illustrated in FIG. 1 is connected to the step portion 151*a*-1 of the light-emitting element 150-1. The other end of the via 161*k*-1 is connected to the wiring line 160*k* by a via hole 162*k*-1. One end of the via 161*k*-2 illustrated in FIG. 1 is connected to the step portion 151*a*-2 of the light-emitting element 150-2. The other end of the via 161*k*-2 is connected to the wiring line 160*k* by a via hole 162*k*-2. The light-transmitting electrode 159*k* is provided over the wiring line 160*k*, and the wiring line 160*k* and the light-transmitting electrode 159*k* are connected to the ground line 4.

The light-emitting element 150-1 includes an opening 158-1 provided in the interlayer insulating film 156 illustrated in FIG. 1. The via 161*d*, in this example, is separated from and adjacent to the light-emitting element 150-1 in the negative direction of the X axis. The via 161*d* is schematically illustrated in FIG. 4 by a two-dot chain line. In the first layer, the via 161*d* is connected to the wiring line 160*a*-1 by a contact hole 162*d*1. The light-transmitting electrode 159*a*1 is provided over the light-emitting element 150-1 and the wiring line 160*a*-1 exposed from the opening 158-1, and electrically connects the light-emitting element 150-1 and the via 161*d*. In the second layer, the via 161*d* is connected to the wiring line 110*d* by a contact hole 162*d*2.

The wiring line 110*d* is connected to the via 111*d* illustrated in FIG. 1 via a contact hole 111*c*1 open to the insulating film 108 illustrated in FIG. 1, and is connected to the drain electrode of the transistor 103 provided in the TFT channel 104.

In this way, the light-emitting element 150-1 formed in the first layer and the wiring line 110*d* formed in the second layer that is a layer different from the first layer can be electrically connected, and the light-emitting element 150-1 and the transistor 103 can be electrically connected by the via 161*d* passing through the two interlayer insulating films 112, 156. Similarly, the connection between the light-emitting element 150-2 and the transistor that drives the light-emitting element 150-2 is also made through the via passing through the two interlayer insulating films.

With reference to FIG. 4, the arrangement of the wiring line 110*k* and the light-emitting elements 150-1, 150-2 in a case in which the wiring line 110*k* reflects light scattering below the light-emitting elements 150-1, 150-2 toward the light-emitting surfaces 153S1, 153S2 will now be described.

The wiring line 110*k* is a rectangle having a length L1 in the X-axis direction and a length W1 in the Y-axis direction in an XY plane view. On the other hand, in an XY plane view, the light-emitting element 150-1 has a rectangular bottom surface having a length L21 in the X-axis direction and a length W2 in the Y-axis direction. The light-emitting element 150-2 has a rectangular bottom surface with a length L22 in the X-axis direction and the length W2 in the Y-axis direction in an XY plane view.

The lengths of each component are set so that L1>L21, L1>L22, W1>W2. That is, the area of the wiring line 110*k* is set larger than the sum of the areas of the light-emitting elements 150-1, 150-2. The wiring line 110*k* is provided directly below the light-emitting elements 150-1, 150-2, and the outer peripheries of the light-emitting elements 150-1, 150-2 are entirely located within the outer periphery of the wiring line 110*k*. The outer peripheries of the light-emitting elements 150-1, 150-2 need only be located fully within the outer periphery of the wiring line 110*k*, and a shape of the wiring line 110*k*, depending on the layout on the circuit substrate 100 and the like, is not limited to a rectangular shape and can be any suitable shape.

Along with emitting light upward, the light-emitting elements 150-1, 150-2 have downward light emission, reflected light at an interface between the interlayer insulating film 112 and the surface resin layer 170, scattered light, and the like. The wiring layer 110 includes the wiring line 110*k*. The wiring layer 110 is formed by a conductor such as metal, and thus the wiring line 110*k* has light reflectivity corresponding to the material. Thus, the light scattered downward of the light-emitting elements 150-1, 150-2 is reflected upward by the wiring line 110*k*. Accordingly, the proportion of the light emitted from the light-emitting elements 150-1, 150-2 that is distributed to the light-emitting surface 153S1, 153S2 side is increased, improving the substantial light emission efficiency of the light-emitting elements 150-1, 150-2. Further, by thus providing the wiring line 110*k*, the arrival of light downward of the light-emitting elements 150-1, 150-2 is suppressed. Therefore, even when circuit elements are disposed in the vicinity directly below the light-emitting elements 150-1, 150-2, the effect of light on the circuit elements is reduced.

As described above, the wiring line 110*k* is not limited to being connected to the ground line 4, and may be connected to another potential such as the potential of the power source line 3, depending on the circuit configuration and the circuit layout.

A manufacturing method of the image display device 1 according to the present embodiment will now be described.

FIG. 5A to FIG. 7B are schematic cross-sectional views illustrating the manufacturing method of the image display device according to the present embodiment.

Figure 5A:
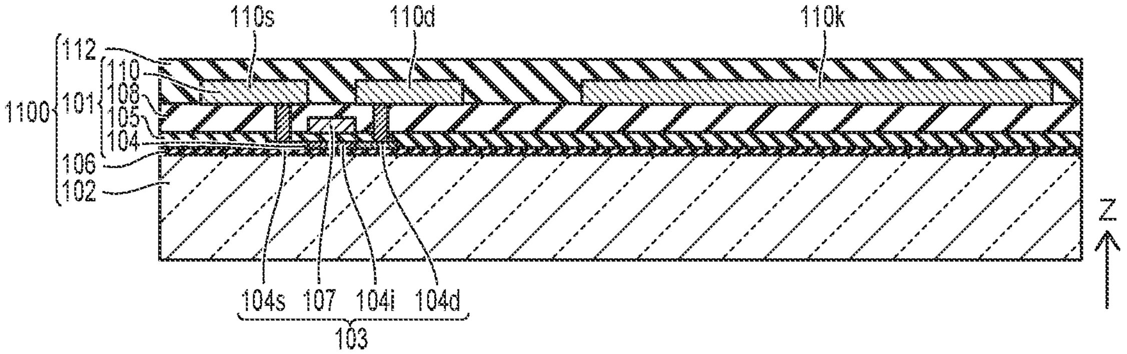
FIG. 5A is a schematic cross-sectional view illustrating a manufacturing method of the image display device according to the first embodiment.

As illustrated in FIG. 5A, in the manufacturing method of the image display device 1 according to the present embodiment, a circuit substrate 1100 is prepared. The circuit substrate (first substrate) 1100 includes the circuit 101 described in FIG. 1 and the like. The circuit 101 includes the first wiring layer 110, and the wiring layer 110 includes the wiring lines 110*s*, 110*d*, 110*k*. In the circuit substrate 1100, the first interlayer insulating film 112 covers the wiring layer 110.

Figure 5B:
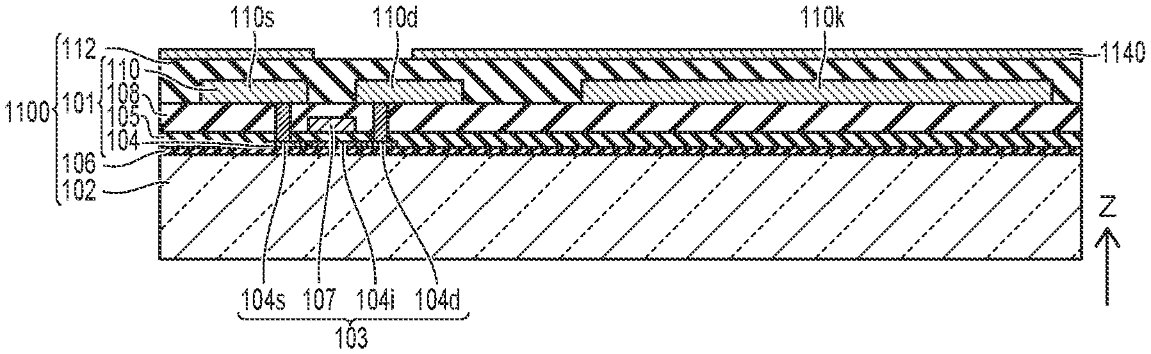
FIG. 5B is a schematic cross-sectional view illustrating the manufacturing method of the image display device according to the first embodiment.

As illustrated in FIG. 5B, a graphene layer 1140 is formed on the interlayer insulating film (first insulating film) 112. The graphene layer 1140 is a layer including graphene, preferably formed by layering a single layer of graphene. The graphene layer 1140, cut to an appropriate size and shape, is adhered on the interlayer insulating film 112 by an adhesive, for example. The graphene layer 1140 in this case is preferably cut to a sufficiently large size compared to the areas of the light-emitting elements 150-1, 150-2 subsequently formed on the graphene layer 1140, and adhered onto the interlayer insulating film 112. To form the light-emitting elements 150-1, 150-2 on the graphene layer 1140, an outer periphery of the graphene layer 1140 is, for example, set to a sufficient size such that the outer periphery of the wiring line 110*k* is located within the outer periphery of the graphene layer 1140.

Figure 6A:
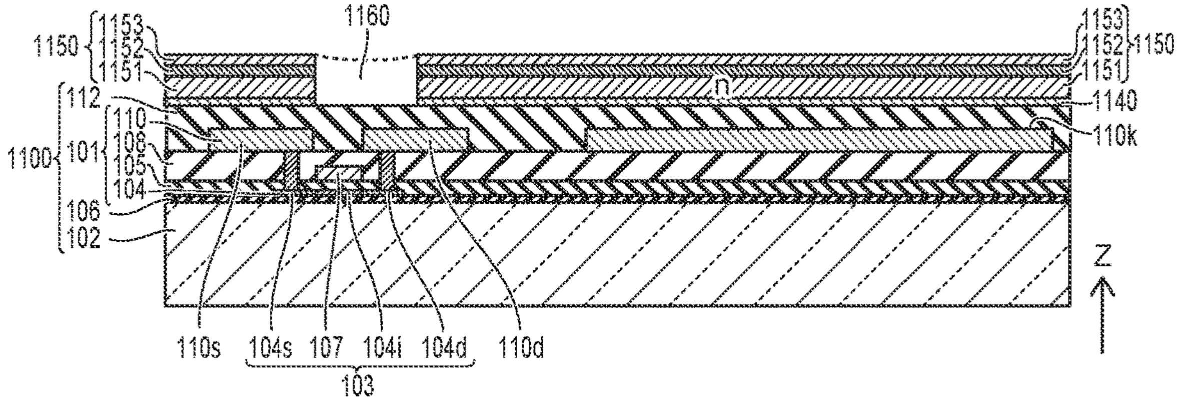
FIG. 6A is a schematic cross-sectional view illustrating the manufacturing method of the image display device according to the first embodiment.

As illustrated in FIG. 6A, a semiconductor layer 1150 is formed over the graphene layer 1140 cut to an appropriate size and shape and adhered on the interlayer insulating film 112. The semiconductor layer 1150 is formed in the order of an n-type semiconductor layer 1151, a light-emitting layer 1152, and a p-type semiconductor layer 1153, in the positive direction of the Z axis from the side of the graphene layer 1140. Crystal defects caused by crystal lattice mismatch readily occur during initial growth of the semiconductor layer 1150, and crystals with GaN as a main component generally exhibit n-type semiconductor properties. Therefore, by growing the semiconductor layer 1150 on the graphene layer 1140 from the n-type semiconductor layer 1151, yield can be improved.

For formation of the semiconductor layer 1150, a physical vapor deposition method such as vapor deposition, ion beam deposition, molecular beam epitaxy (MBE), or sputtering is used, and a low-temperature sputtering method is preferably used. Note that, in the low-temperature sputtering method, the temperature can be made lower when assistance is provided by light or plasma during film formation, and thus such a method is preferred. With epitaxial growth by metal organic chemical vapor deposition (MOCVD), the temperature may exceed 1000° C. In contrast, in the low-temperature sputtering method, it is known that a GaN crystal including a light-emitting layer can be epitaxially grown on the graphene layer 1140 at a low temperature ranging from about 400° C. to about 700° C. (refer to Non Patent Documents 1 and 2 and the like: Non Patent Document 1, H. Kim, J. Ohta, K. Ueno, A. Kobayashi, M. Morita, Y. Tokumoto & H. Fujioka, "Fabrication of full-color GaN-based light-emitting diodes on nearly lattice-matched flexible metal foil", SCIENTIFIC REPORTS, 7, No. 2112 (May 18, 2017), and Non Patent Document 2, J. W. Shon, J. Ohta, K. Ueno, A. Kobayashi & H. Fujioka, "Fabrication of full-color InGaN-based light-emitting diodes on amorphous substrates by pulsed sputtering", SCIENTIFIC REPORTS, 4, No. 5325 (Jun. 23, 2014)). Such a low-temperature sputtering method is consistent with formation of the semiconductor layer 1150 on a circuit substrate including TFTs and the like formed in an LTPS process. Using an appropriate film formation technique, the semiconductor layer 1150 of GaN is grown on the graphene layer 1140, thereby forming the monocrystallized semiconductor layer 1150 including the light-emitting layer 1152 on the graphene layer 1140. The graphene layer 1140 is cut to an appropriate size and shape and then adhered, and thus a deposit 1160 including GaN and not monocrystallized is formed at a location where the graphene layer 1140 is not present, as indicated by the dashed line in FIG. 6A.

In this embodiment, the graphene layer 1140 is a seed, thereby promoting the crystal growth of GaN. Note that a buffer layer having conductivity may be provided on the graphene layer 1140, and the semiconductor layer may be grown on this buffer layer by the sputtering method described above or the like. For the buffer layer, any type of material may be used as long as the material promotes the crystal growth of GaN. For example, a metal layer including a single crystal such as Hf or Cu may also be used as the buffer layer.

Figure 6B:
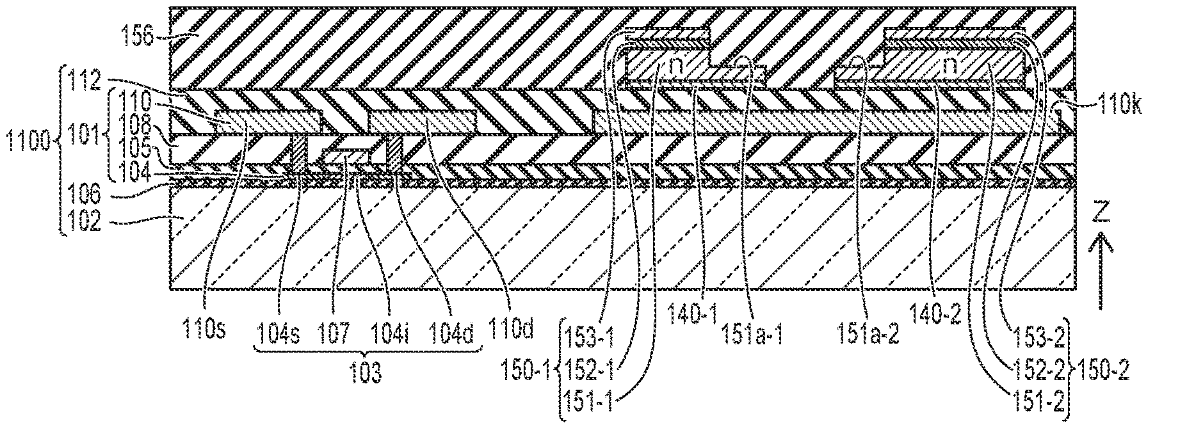
FIG. 6B is a schematic cross-sectional view illustrating the manufacturing method of the image display device according to the first embodiment.

As illustrated in FIG. 6B, the semiconductor layer 1150 is molded into a desired shape by reactive ion etching (RIE) or the like, forming the light-emitting elements 150-1, 150-2. At this time, the graphene layer 1140 illustrated in FIG. 6A is over-etched and molded into the graphene sheets 140-1, 140-2 having outer peripheral shapes in accordance with the outer peripheral shapes of the light-emitting elements 150-1, 150-2. In this example, the area of the light-emitting element 150-1 in an XY plane view is set smaller than the area of the light-emitting element 150-2 in an XY plane view.

Subsequently, the second interlayer insulating film (second insulating film) 156 covering the first interlayer insulating film 112, the graphene sheets 140-1, 140-2, and the light-emitting elements 150-1, 150-2 is formed.

Figure 7A:
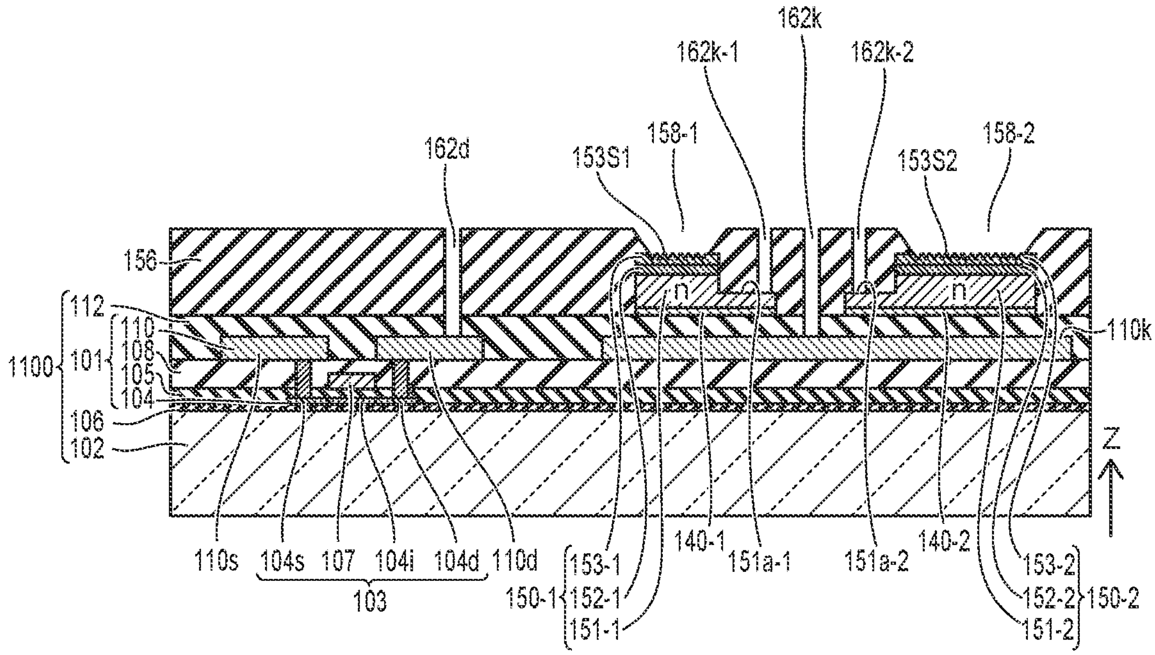
FIG. 7A is a schematic cross-sectional view illustrating the manufacturing method of the image display device according to the first embodiment.

As illustrated in FIG. 7A, the via holes 162*k*-1, 162*k*-2 are formed through the second interlayer insulating film 156. The via holes 162*d*, 162*k* are formed through the interlayer insulating films 112, 156. Simultaneously with forming the via holes 162*k*, 162*k*-1, 162*k*-2, 162*d*, the openings 158-1, 158-2 are formed in the interlayer insulating film 156, exposing the light-emitting surfaces 153S1, 153S2. The openings 158-1, 158-2 may be formed before formation of the via holes 162*k*, 162*k*-1, 162*k*-2, 162*d* or after formation of the via holes 162*k*, 162*k*-1, 162*k*-2, 162*d*. The exposed light-emitting surfaces 153S1, 153S2 are roughened.

Figure 7B:
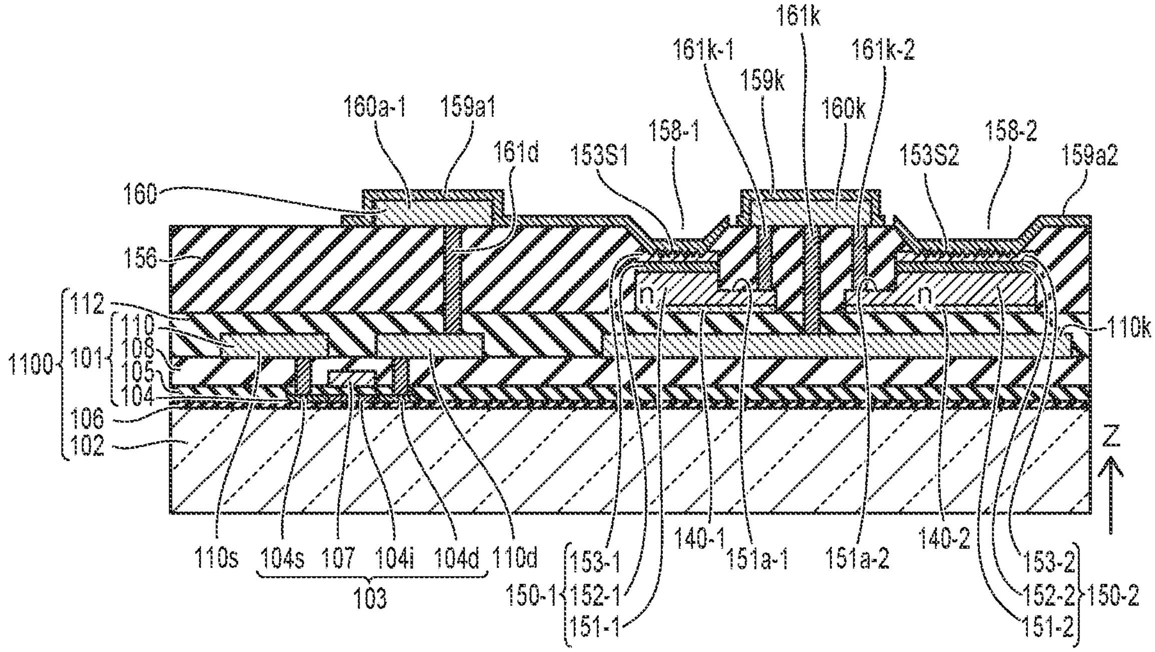
FIG. 7B is a schematic cross-sectional view illustrating the manufacturing method of the image display device according to the first embodiment.

As illustrated in FIG. 7B, the via holes 162*d*, 162*k*, 162*k*-1, 162*k*-2 illustrated in FIG. 7A are filled with a conductive material. Subsequently or simultaneously with filling the via holes or the like, the second wiring layer 160 is formed. The light-transmitting electrode 159*a*1 is formed over the light-emitting surface 153S1 and over the wiring line 160*a*-1, electrically connecting the p-type semiconductor layer 153-1 and the wiring line 160*a*-1. At the same time, the light-transmitting electrode **159*a*2 is formed over the light-emitting surface 153S2, and the light-transmitting electrode 159*a*2 is electrically connected to an electrode for another drive transistor different from the transistor 103. The light-transmitting electrode 159*k* is formed on the wiring line 160*k*** as well.

Note that, as described above, in order to insulate the light-emitting elements 150-1, 150-2, and the like, the interlayer insulating film 156 need only cover these layers. The interlayer insulating film 156 need only have a flatness that allows the second wiring layer 160 to be formed on the interlayer insulating film 156, and need not be flattened during formation. In a case in which the interlayer insulating film 156 is not flattened, the process for flattening can be reduced and, other than in the locations where the light-emitting elements 150-1, 150-2 are formed, a thickness of the interlayer insulating film 156 can be decreased. At locations where the thickness of the interlayer insulating film 156 is thin, a depth of the via holes **162*k*, 162*k*-1, 162*k*-2, 162*d*** can be decreased. With formation of a shallow via hole, a sufficient opening diameter across the depth of the via hole can be ensured, making it easy to secure an electrical connection by the via. Therefore, a reduction in yield due to poor electrical properties can be suppressed.

Figure 8A:
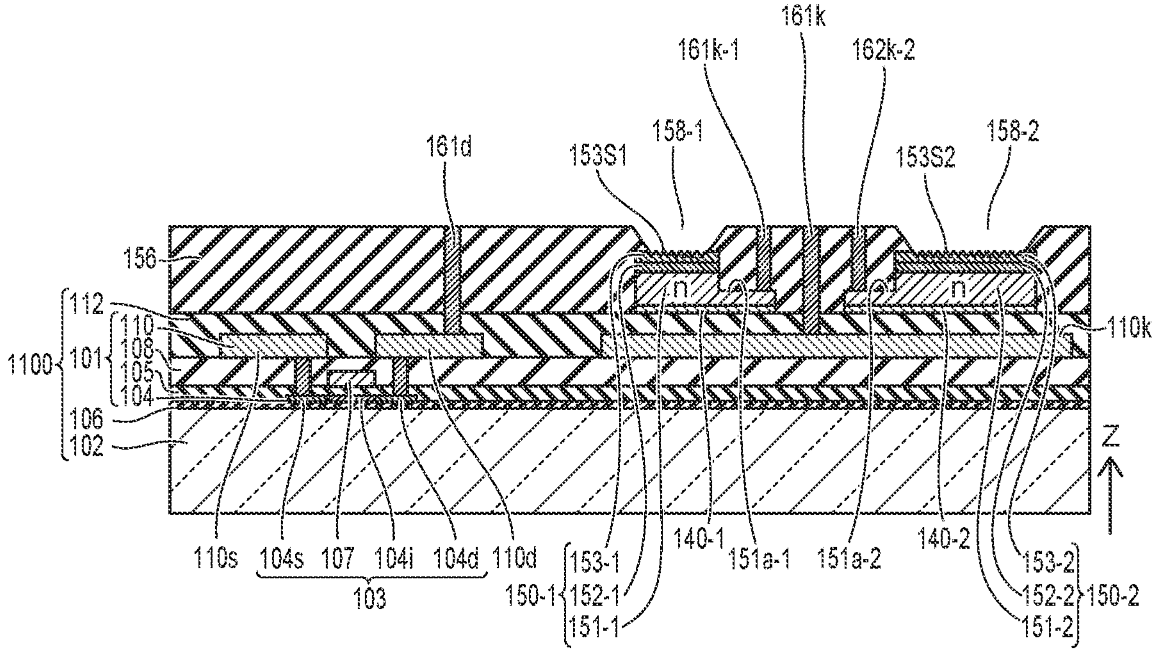
FIG. 8A is a schematic cross-sectional view illustrating a manufacturing method of a modified example of the image display device according to the first embodiment.
Figure 8B:
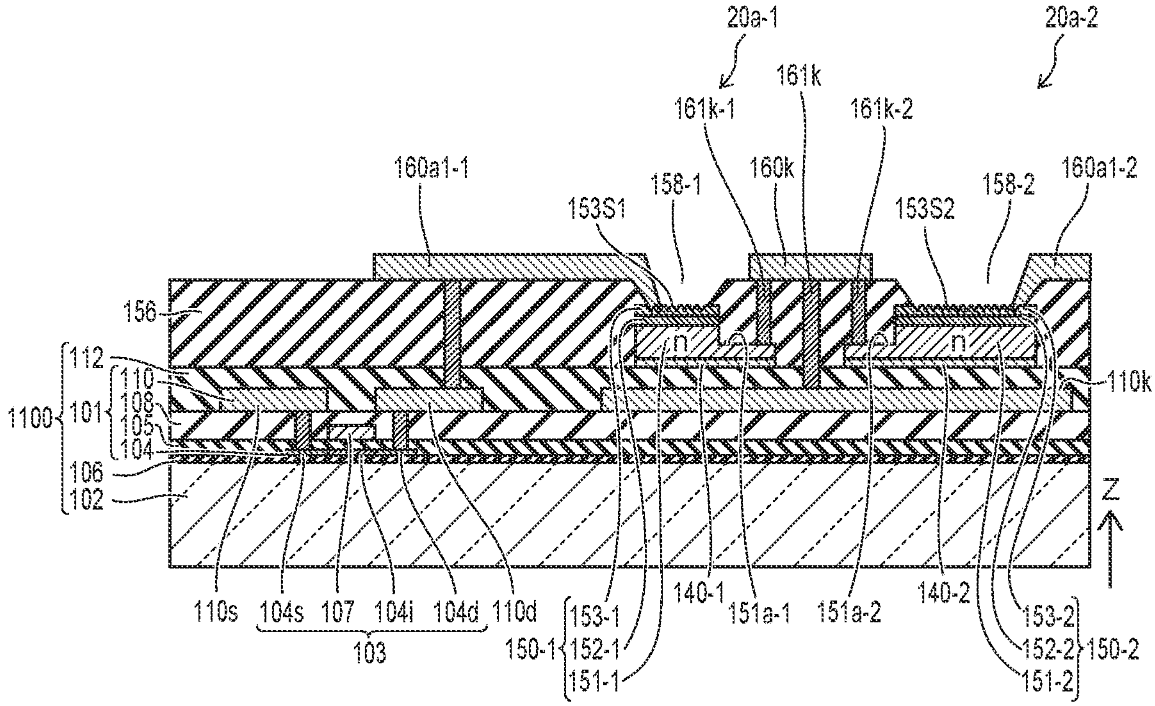
FIG. 8B is a schematic cross-sectional view illustrating the manufacturing method of the modified example of the image display device according to the first embodiment.

FIG. 8A and FIG. 8B are schematic cross-sectional views illustrating the manufacturing method of a modified example of the image display device according to the present embodiment.

FIG. 8A and FIG. 8B illustrate the manufacturing process for forming the sub-pixels illustrated in FIG. 2A. In the present modified example, until formation of the openings 158-1, 158-2, the method includes the same processes as those in the other embodiment described above. Accordingly, the execution of the processes in FIG. 8A and FIG. 8B following FIG. 7A will be described below as a manufacturing process of this modified example.

As illustrated in FIG. 8A, the openings 158-1, 158-2 are formed, exposing the light-emitting surfaces 153S1, 153S2 of the p-type semiconductor layers 153-1, 153-2, and subsequently the light-emitting surfaces 153S1, 153S2 are roughened. The via holes **162*k*-1, 162*k*-2 illustrated in FIG. 7A are filled with a conductive material, respectively forming the vias 161*k*-1, 161*k*-2. The via holes 162*d*, 162*k* illustrated in FIG. 7A are filled with a conductive material, respectively forming the vias 161*d*, 161*k***.

As illustrated in FIG. 8B, the wiring layer 160 including the wiring lines **160*a*1-1, 160*a*1-2, 160*k* is formed on the interlayer insulating film 156. The wiring line 160*a*1-1 is connected to a surface including the exposed light-emitting surface 153S1. The wiring line 160*a*1-2 is connected to a surface including the exposed light-emitting surface 153S2**.

In this way, the sub-pixels **20*a*-1, 20*a*-2** of the modified example are formed.

Figure 9A:
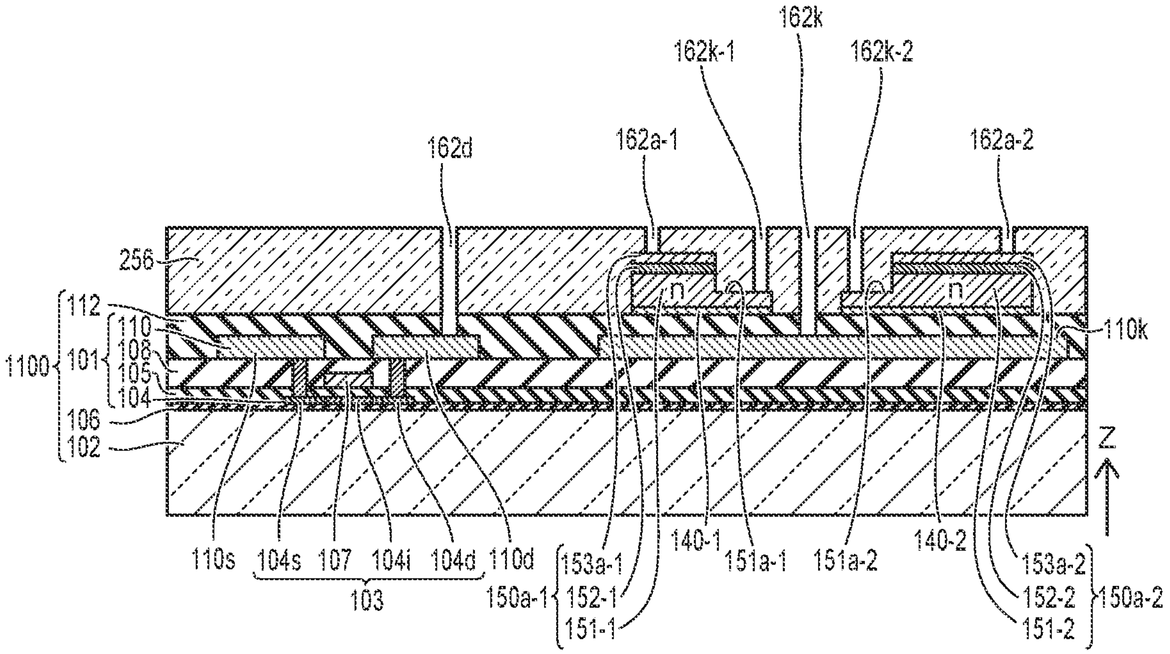
FIG. 9A is a schematic cross-sectional view illustrating the manufacturing method of the modified example of the image display device according to the first embodiment.
Figure 9B:
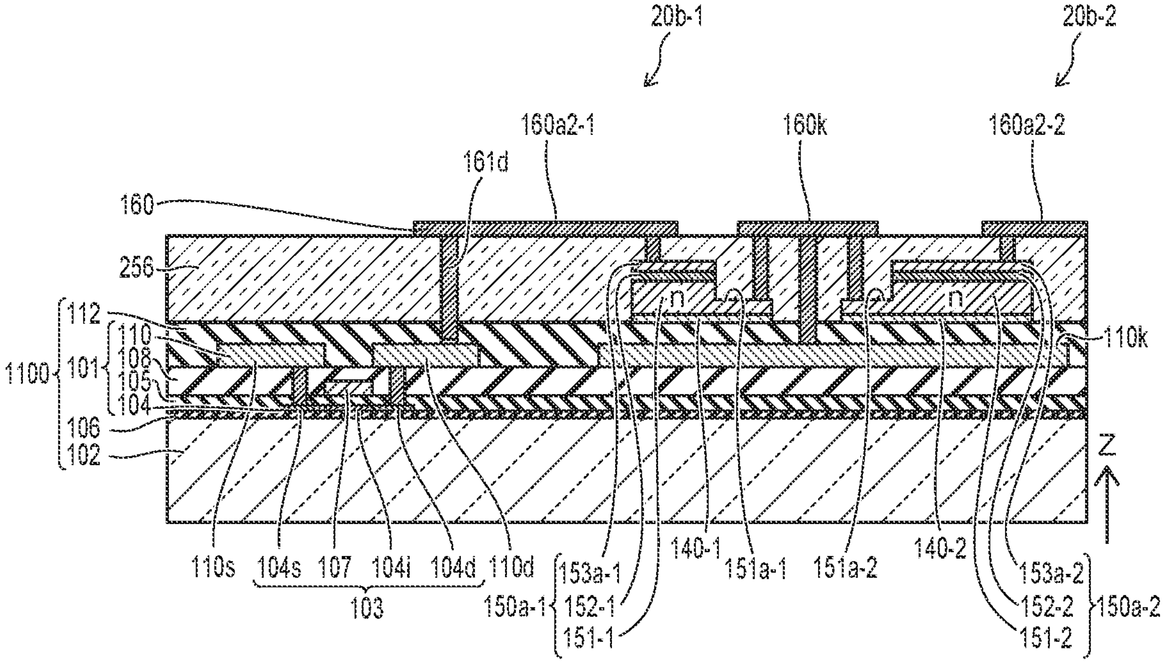
FIG. 9B is a schematic cross-sectional view illustrating the manufacturing method of the modified example of the image display device according to the first embodiment.

FIG. 9A and FIG. 9B are schematic cross-sectional views illustrating the manufacturing method of the modified example of the image display device according to the present embodiment.

FIG. 9A and FIG. 9B illustrate the manufacturing process for forming the sub-pixels illustrated in FIG. 2B. In the present modified example, until formation of the light-emitting elements, the method includes the same processes as those in the other embodiment described above. Accordingly, the execution of the processes in FIG. 9A and FIG. 9B following FIG. 6A will be described below as a manufacturing process of this modified example. In the case of the other embodiments, the interlayer insulating film 156 is formed of an insulating material not having transmittance such as white resin, whereas in the present modified example, the interlayer insulating film 256 is formed of an insulating material having light transmittance as described above.

As illustrated in FIG. 9A, the semiconductor layer 1150 illustrated in FIG. 6A is molded into a desired shape by RIE or the like, forming the light-emitting elements **150*a*-1, 150*a*-2. At this time, by overetching of the semiconductor layer 1150, the graphene layer 1140 illustrated in FIG. 6B is molded into the graphene sheets 140-1, 140-2 having outer peripheries in accordance with the outer peripheral shapes of the light-emitting elements 150*a*-1, 150*a*-2. Subsequently, the second interlayer insulating film 256 covering the first interlayer insulating film 112, the graphene sheets 140-1, 140-2, and the light-emitting elements 150*a*-1, 150*a*-2 is formed. The interlayer insulating film 256** is an insulating resin having light transmittance, and is preferably a transparent resin.

Contact holes **162*a*-1, 162*a*-2 are formed in the second interlayer insulating film 256. The via holes 162*k*-1, 162*k*-2 passing through the interlayer insulating film 256 are formed. The via holes 162*d*, 162*k* passing through the interlayer insulating films 112, 156** are formed. For example, reactive ion etching (RIE) or the like is used for forming the contact holes and the via holes.

As illustrated in FIG. 9B, the contact holes **162*a*-1, 162*a*-2 and the via holes 162*d*, 162*k*, 162*k*-1, 162*k*-2 illustrated in FIG. 9A are filled with a conductive material. Subsequently, the second wiring layer 160 is formed, and the wiring lines 160*a*2-1, 160*a*2-2, 160*k* are formed. The wiring line 160*a*2-1 is connected to the p-type semiconductor layer 153*a*-1 at one end and is connected to the wiring line 110*d* by the via 161*d* at the other end. The wiring line 160*a*2-2 is connected to a p-type semiconductor layer 153*a*-2 at one end and is connected to the wiring line for the other drive transistor by the via at the other end. The second wiring layer 160 may be formed at the same time as the via holes 162*d*, 162*k*** are filled with the conductive material.

In this way, the sub-pixels **20*b*-1, 20*b*-2** of the modified example are formed.

The portion of the circuit other than the sub-pixels 20-1, 20-2 is formed in the circuit substrate 1100. For example, the row selection circuit 5 illustrated in FIG. 3 is formed in the circuit substrate 1100 along with drive transistors, selection transistors, and the like. That is, the row selection circuit 5 may be incorporated at the same time by the manufacturing process described above. On the other hand, it is desirable to incorporate the signal voltage output circuit 7 into a semiconductor device manufactured by a manufacturing process that permits high integration by microprocessing. The signal voltage output circuit 7 is mounted on another substrate together with a central processing unit (CPU) and other circuit elements, and is interconnected with the wiring lines of the circuit substrate 1100 before incorporation of, for example, a color filter described below, or after incorporation of the color filter.

For example, the circuit substrate 1100 includes the substrate 102 composed of a glass substrate including the circuit 101 and having light transmittance, and the substrate 102 is substantially rectangular. The circuit 101 for one or a plurality of image display devices is formed on the circuit substrate 1100. In the case of a larger screen size or the like, the circuit 101 for constituting one image display device may be divided into a plurality of the circuit substrates 1100, and the divided circuits may be combined to constitute one image display device.

The circuit substrate 1100 includes one substrate 102, and the plurality of circuits 101 are disposed in a lattice pattern, for example, on the one substrate 102. The circuit 101 includes all sub-pixels 20 and the like required for the one image display device 1. An interval about a scribe line width is provided between the circuits 101 adjacently disposed. Circuit elements and the like are not disposed at an end portion or near an end portion of the circuit 101.

Figure 10:
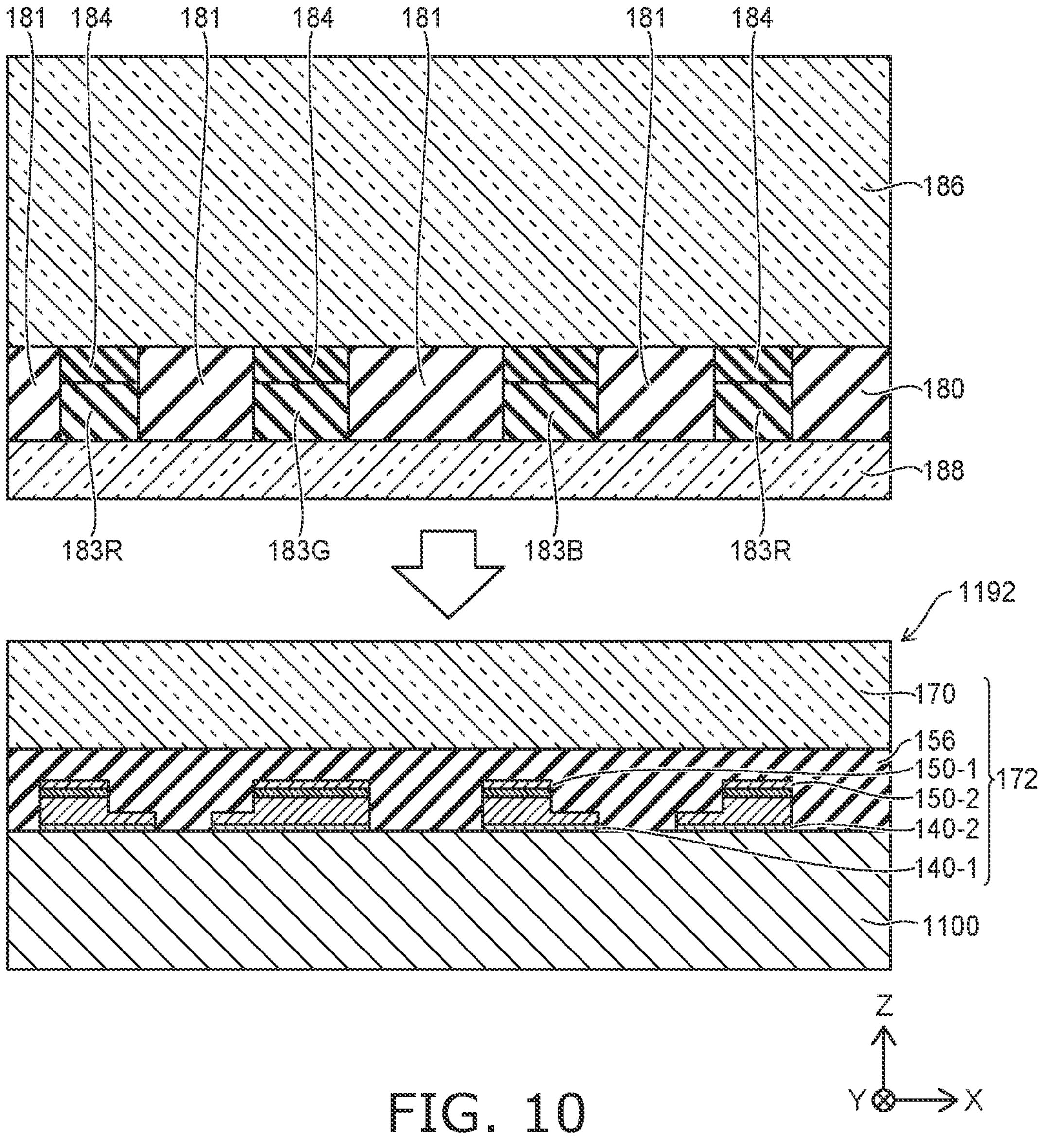
FIG. 10 is a schematic cross-sectional view illustrating the manufacturing method of the image display device according to the first embodiment.

FIG. 10 is a schematic cross-sectional view illustrating the manufacturing method of the image display device according to the present embodiment.

In FIG. 10, the structure within the circuit substrate 1100, the interlayer insulating film 112, the vias 161*d*, 161*k*, 161*k*-1, 161*k*-2, the wiring layer 160, and the like illustrated in FIG. 1 and the like are omitted to avoid complexity. Further, in FIG. 10, a portion of the color conversion member such as the color filter 180 is illustrated. In FIG. 10, the structure including the graphene sheet 140-1, 140-2, the light-emitting elements 150-1, 150-2, the interlayer insulating film 156, the surface resin layer 170, the vias omitted in the illustration, and the like is referred to as a light-emitting circuit portion 172. Further, the structure in which the light-emitting circuit portion 172 is provided on the circuit substrate 1100 is referred to as a structure 1192.

As illustrated in FIG. 10, one surface of the color filter (wavelength conversion member) 180 is adhered to the structure 1192. The other surface of the color filter 180 is adhered to the glass substrate 186. The one surface of the color filter 180 is provided with the transparent thin film adhesive layer 188 and adhered to a surface of the structure 1192 on the side of the light-emitting circuit portion 172 with the transparent film adhesive layer 188 interposed therebetween.

In the color filter 180, in this example, color conversion units are arrayed in the positive direction of the X axis in the order of red, green, and blue. A red color conversion layer 183R is provided in the first layer for red. A green color conversion layer 183G is provided in the first layer for green. A blue color conversion layer 183B is provided in the first layer for blue. While each is provided with the filter layer 184 in the second layer, the frequency characteristics of the filter layer 184, needless to say, can be changed for each color of the color conversion unit. A single layer of the color conversion layer 183B may be provided for blue. The light-blocking portion 181 is provided between each of the color conversion units.

The color filter 180 is adhered to the structure 1192 with the positions of the color conversion layers 183R, 183G, 183B of each color aligned to the position of the light-emitting element 150.

FIG. 11A to FIG. 11D are schematic cross-sectional views illustrating a modified example of the manufacturing method of the image display device according to the present embodiment.

FIG. 11A to FIG. 11D illustrate a method of forming the color filter by ink jetting.

Figure 11A:
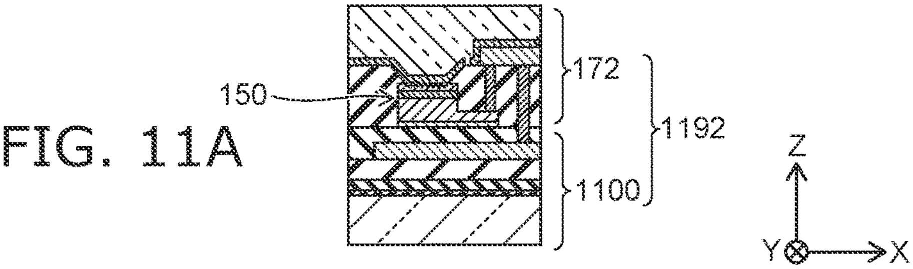
FIG. 11A is a schematic cross-sectional view illustrating the manufacturing method of the image display device according to the first embodiment.

As illustrated in FIG. 11A, the structure 1192 in which the light-emitting circuit portion 172 is adhered to the circuit substrate 1100 is prepared.

Figure 11B:
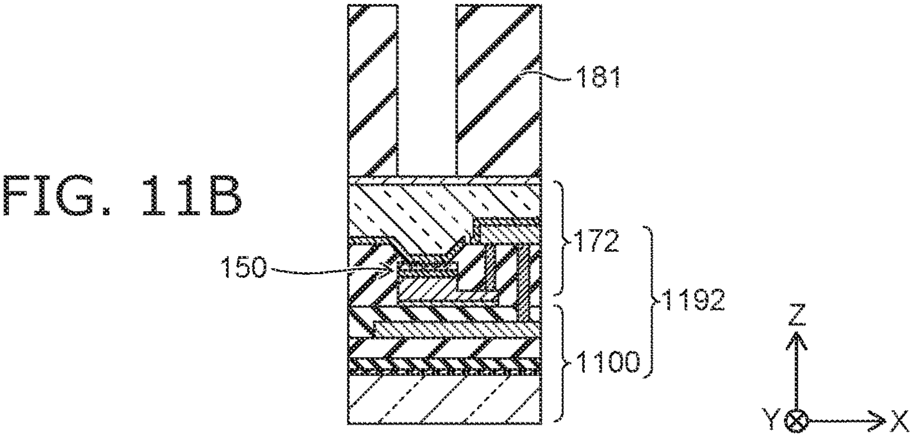
FIG. 11B is a schematic cross-sectional view illustrating the manufacturing method of the image display device according to the first embodiment.

As illustrated in FIG. 11B, the light-blocking portion 181 is formed on the structure 1192. The light-blocking portion 181 is formed using, for example, screen printing or a photolithography technique.

Figure 11C:
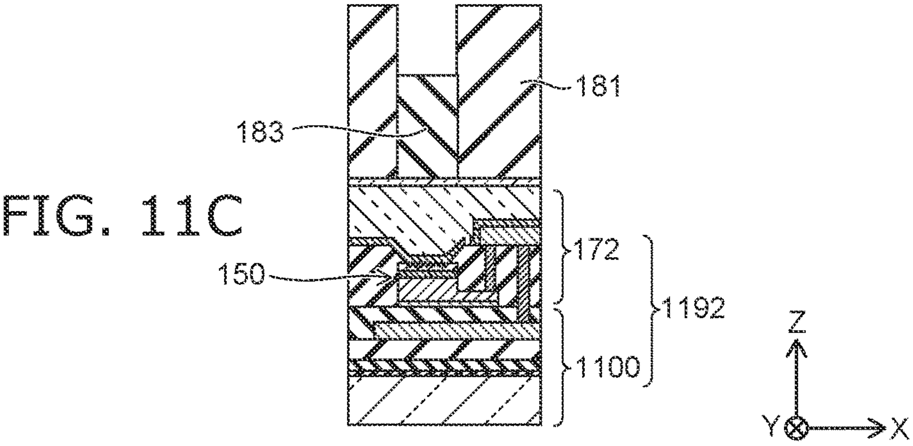
FIG. 11C is a schematic cross-sectional view illustrating the manufacturing method of the image display device according to the first embodiment.

As illustrated in FIG. 11C, a phosphor corresponding to the light emission color is ejected from an inkjet nozzle to form the color conversion layer 183. The phosphor colors the region where the light-blocking portion 181 is not formed. As the phosphor, for example, a fluorescent coating that uses a typical phosphor material, a perovskite phosphor material, or a quantum dot phosphor material is used. Use of a perovskite phosphor material or a quantum dot phosphor material makes it possible to realize each light emission color, high chromaticity, and high color reproducibility, and is thus preferred. After the drawing by the inkjet nozzle, drying is performed at an appropriate temperature and for an appropriate time. A thickness of the coating film at the time of coloring is set thinner than a thickness of the light-blocking portion 181.

As already described, for a blue light-emitting sub-pixel, phosphor is not ejected in a case in which the color conversion unit is not formed. Further, for a blue light-emitting sub-pixel, in a case in which the color conversion unit need only be a single layer when the blue color conversion layer is formed, a thickness of the coating film of the blue phosphor is preferably about the same as the thickness of the light-blocking portion 181.

Figure 11D:
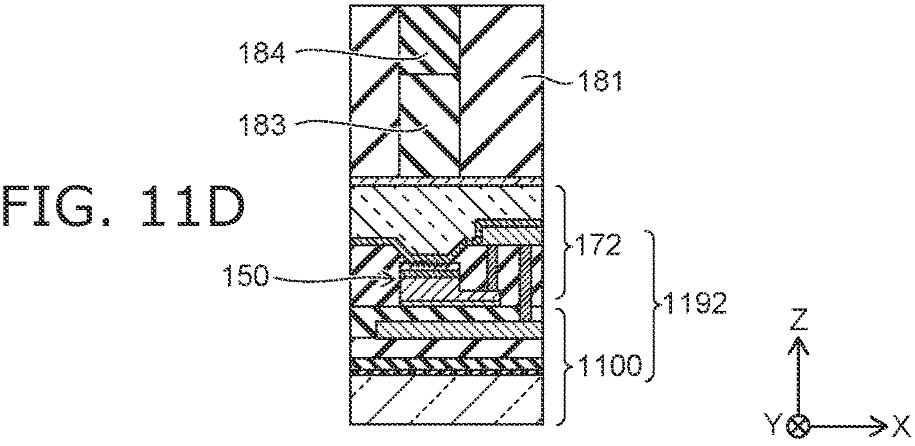
FIG. 11D is a schematic cross-sectional view illustrating the manufacturing method of the image display device according to the first embodiment.

As illustrated in FIG. 11D, the coating for the filter layer 184 is ejected from an inkjet nozzle. The coating is applied so as to overlap the coating film of the phosphor. The total thickness of the coating film of the phosphor and the coating is about the same as the thickness of the light-blocking portion 181.

Effects of the image display device 1 of the present embodiment will now be described.

In the manufacturing method of the image display device 1 according to the present embodiment, circuit elements such as the transistor 103 that drives the light-emitting elements 150-1, 150-2 are formed in advance on the circuit substrate 1100, and the graphene layer 1140 is formed on the interlayer insulating film 112 of the circuit substrate 1100. Furthermore, the semiconductor layer 1150 is grown on the graphene layer 1140. By molding the crystal-grown semiconductor layer 1150 together with the graphene layer 1140 into a desired shape, the light-emitting elements 150-1, 150-2 can be respectively formed on the graphene sheets 140-1, 140-2. As a result, the process of transferring the light-emitting elements 150-1, 150-2 can be shortened compared to individually transferring individualized light-emitting elements to the circuit substrate 1100.

For example, the number of sub-pixels exceeds 24 million in an image display device with 4K image quality, and exceeds 99 million in the case of an image display device with 8K image quality. To individually mount such a large number of light-emitting elements onto a circuit substrate requires an enormous amount of time, making it difficult to realize an image display device that uses micro LEDs at a realistic cost. Further, individually mounting a large number of light-emitting elements reduces yield due to connection failure and the like during mounting, and thus further increases in cost cannot be avoided.

In contrast, with the manufacturing method of the image display device 1 according to the present embodiment, the light-emitting elements 150-1, 150-2 are formed after the entire semiconductor layer 1150 is grown on the graphene layer 1140 formed on the circuit substrate 1100, making it possible to reduce the transfer process of the light-emitting elements.

The semiconductor layer 1150 grows on the graphene layer 1140 with a uniform crystal structure and thus, by forming the graphene layer 1140 to an appropriate size and shape, the light-emitting elements can be arranged in a self-aligned manner. As a result, it is not necessary to align the light-emitting elements on the circuit substrate 1100, and the sizes of the light-emitting elements 150-1, 150-2 are readily reduced, which is suitable for a high-definition display.

After the light-emitting elements are formed directly on the circuit substrate by etching or the like, the light-emitting elements and the circuit elements in the circuit substrate 1100 are electrically connected by via formation, making it possible to realize a uniform connection structure and suppress a reduction in yield.

In the present embodiment, a TFT formed on a glass substrate can be used as the circuit substrate 1100, for example, making it possible to utilize an existing flat panel manufacturing process and plant.

In the image display device 1 according to the present embodiment, the first wiring layer 110 includes the wiring line 110*k*. The wiring line 110*k* is formed in advance at the locations where the light-emitting elements 150-1, 150-2 of the circuit substrate 1100 are formed. Therefore, light scattered downward from the light-emitting elements 150-1, 150-2 is reflected by the wiring line 110*k* and distributed on the side of the light-emitting surfaces 153S1, 153S2. Accordingly, the light emission efficiency of the light-emitting elements 150-1, 150-2 is substantially improved.

The wiring line 110*k* can block the light scattered downward of the light-emitting elements 150-1, 150-2, making it possible to suppress irradiation of light to circuit elements in the vicinity below the light-emitting elements 150-1, 150-2, and prevent malfunction and the like of the circuit elements.

Second Embodiment

Figure 12:
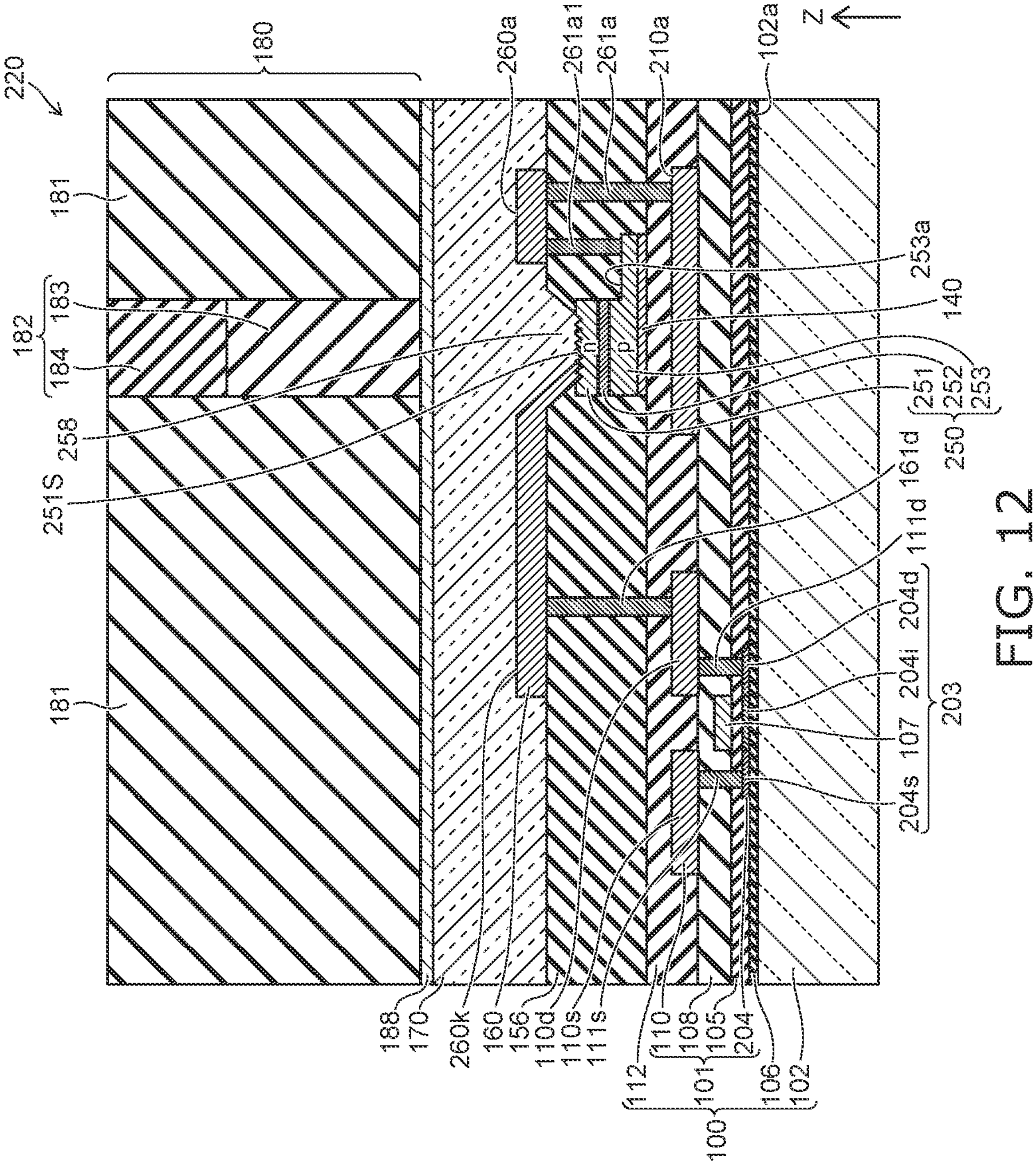
FIG. 12 is a schematic cross-sectional view illustrating a portion of an image display device according to a second embodiment.

FIG. 12 is a schematic cross-sectional view illustrating a portion of an image display device according to the present embodiment.

FIG. 12 illustrates an aligned cross section at positions corresponding to the lines AA' in FIG. 4.

The present embodiment differs from the other embodiments described above in that one light-emitting element 250 is provided on one wiring line 210*a*. Further, in the present embodiment, the configuration of the light-emitting element 250 and the configuration of a transistor 203 that drives the light-emitting elements differ from those of the other embodiment described above. Components that are the same as those of the other embodiment described above are denoted by the same reference characters, and detailed descriptions thereof will be omitted as appropriate.

As illustrated in FIG. 12, in a sub-pixel 220 of the image display device of the present embodiment, the first wiring layer 110 includes the wiring line 210*a*. The wiring line (second portion) 210*a* is provided below the light-emitting element 250 with the interlayer insulating film 112 interposed therebetween. An outer periphery of the wiring line 210*a* is set such that an outer periphery of the light-emitting element 250 is located within the outer periphery of the wiring line 210*a* when the light-emitting element 250 is projected onto the wiring line 210*a*.

The graphene sheet 140 is provided above the wiring line 210*a*. The light-emitting element 250 is provided on the graphene sheet 140.

In the present embodiment, the light-emitting element 250 is layered in the order of a p-type semiconductor layer 253, a light-emitting layer 252, and an n-type semiconductor layer 251, from the side of the first interlayer insulating film 112 toward the side of a light-emitting surface 251S. In the present embodiment, the n-type semiconductor layer 251 is the light-emitting surface 251S.

The light-emitting surface 251S is a surface facing the surface of the n-type semiconductor layer 251 that is in contact with the light-emitting layer 252. The light-emitting surfaces 251S are both roughened.

The light-emitting element 250 may be the same material as in the other embodiment described above. The light-emitting element 250 emits blue light having a wavelength of, for example, about 467 nm±20 nm or blue violet light having a wavelength of 410 nm±20 nm.

The second interlayer insulating film (second insulating film) 156 covers the first interlayer insulating film 112, the graphene sheets 140, and the light-emitting element 250. The second interlayer insulating film 156 includes an opening 258. The opening 258 is formed in the light-emitting element 250, and the interlayer insulating film 156 is not provided on the light-emitting surface 251S.

The transistor 203 is an n-channel TFT in this example. The transistor 203 includes a TFT channel 204 and the gate 107. The TFT channel 204 is a region of polycrystalline Si formed on the first surface 102*a* of the substrate 102, and is polycrystallized and activated by annealing a region formed as amorphous Si by laser irradiation. The TFT channel 204 includes regions 204*s*, 204*i*, 204*d*. The regions 204*s*, 204*i*, 204*d* are all provided on the TFT lower layer film 106. The region 204*i* is provided between the regions 204*s*, 204*d*. The regions 204*s*, 204*d* are doped with an n-type impurity such as phosphorous (P) and are in ohmic connection with the vias 111*s*, 111*d*.

The gate 107 is provided on the TFT channel 204 with the insulating layer 105 interposed therebetween. When a potential higher than that of the region 204*s* is applied to the gate 107, a channel is formed in the region 204*i*, thereby controlling the current flowing between the regions 204*s*, 204*d*.

The structure of an upper portion of the transistor 203 and the structure of the wiring layer 110 are the same as those in the other embodiment described above.

A via 261*a*1 is provided through the interlayer insulating film 156. One end of the via 261*a*1 is connected to a step portion 253*a*.

A via 261*a* is provided through the interlayer insulating films 112, 156. One end of the via 261*a* is connected to the wiring line 210*a*.

The second wiring layer 160 includes wiring lines 260*a*, 260*k*. The other ends of the vias 261*a*1, 261*a* are connected to the wiring line 260*a*. The wiring line 260*a* is electrically connected to the power source line 3 in FIG. 13 described below, for example. The wiring line 210*a* is electrically connected to the power source line 3 through the via 261*a* and the wiring line 260*a*.

One end of the via 161*d* is connected to the wiring line 110*d*, and the other end of the via 161*d* is connected to the wiring line 260*k*. One end of the wiring line 260*k* is connected to a surface of the n-type semiconductor layer 251 including the light-emitting surface 251S. Accordingly, the n-type semiconductor layer 251 is electrically connected to the region 204*d* corresponding to a drain electrode of the transistor 203 via the wiring line 260*k*, the via 161*d*, and the wiring line 110*d*.

The region 204*s* that is a source electrode of the transistor 203 is connected to the wiring line 110*s* by the via 111*s*. The wiring line 110*s* is connected to the ground line 4 in FIG. 13 described below, for example.

Figure 13:
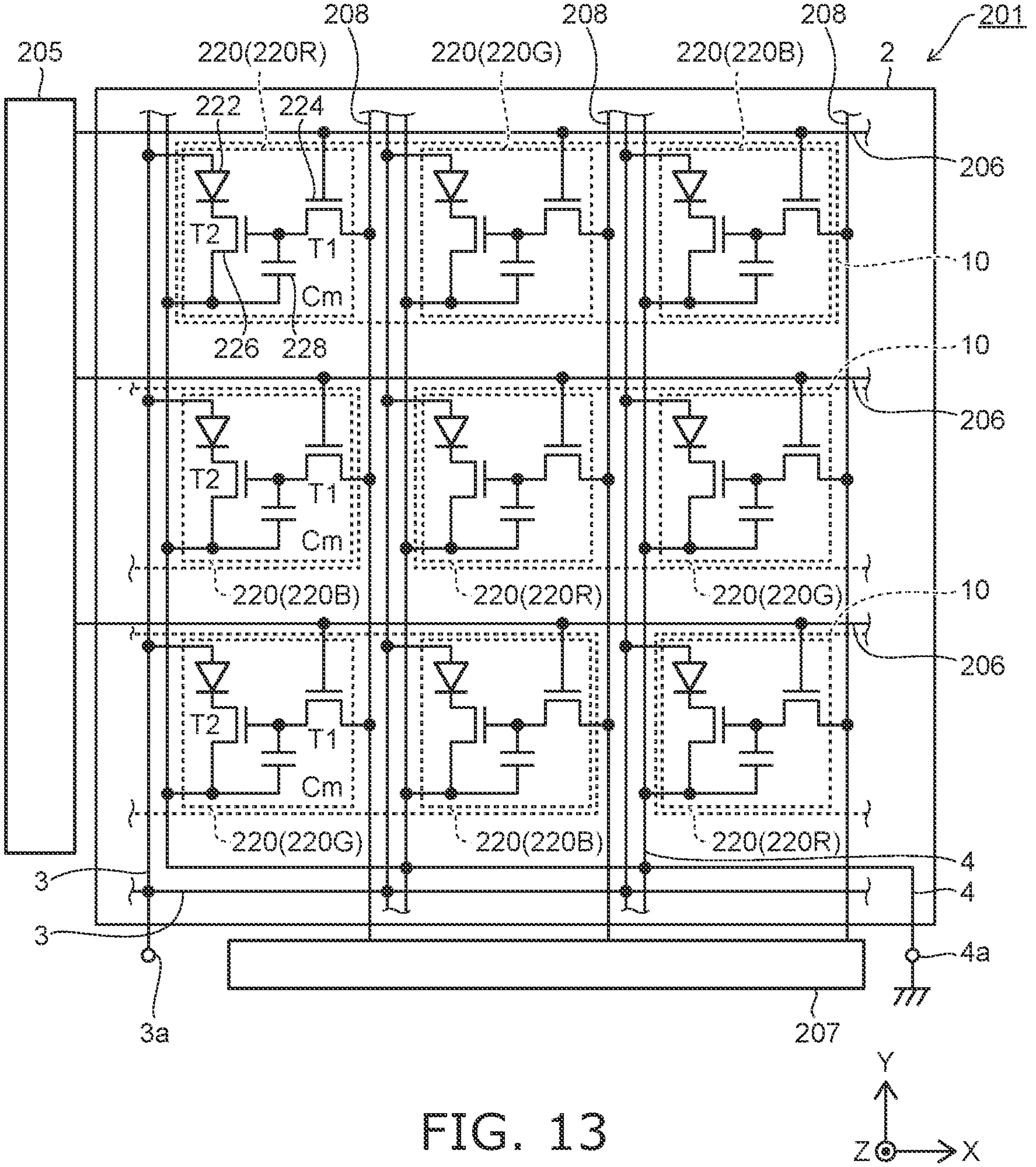
FIG. 13 is a schematic block diagram illustrating the image display device according to the second embodiment.

FIG. 13 is a schematic block diagram illustrating the image display device according to the present embodiment.

As illustrated in FIG. 13, an image display device 201 of the present embodiment includes the display region 2, a row selection circuit 205, and a signal voltage output circuit 207.

In the display region 2, a sub-pixel 220 is arrayed in a lattice pattern on the XY plane, for example, as in the other embodiment described above.

The pixel 10, as in the other embodiment described above, includes a plurality of the sub-pixels 220 that emit light of different colors. A sub-pixel 220R emits red light. A sub-pixel 220G emits green light. A sub-pixel 220B emits blue light. The three types of sub-pixels 220R, 220G, 220B emit light at a desired brightness, thereby determining the light emission color and brightness of one pixel 10.

One pixel 10 is formed of the three sub-pixels 220R, 220G, 220B, and the sub-pixels 220R, 220G, 220B are arrayed in a linear shape on the X axis, for example, as in this example. In each pixel 10, sub-pixels of the same color may be arrayed in the same column or, as in this example, sub-pixels of different colors may be arrayed on a per column basis.

The sub-pixel 220 includes a light-emitting element 222, a selection transistor 224, a drive transistor 226, and a capacitor 228. In FIG. 13, the selection transistor 224 may be denoted as T1, the drive transistor 226 may be denoted T2, and the capacitor 228 may be denoted as Cm.

In the present embodiment, the light-emitting element 222 is provided on the power source line 3 side, and the drive transistor 226 connected in series with the light-emitting element 222 is provided on the ground line 4 side. That is, the drive transistor 226 is connected to a potential side lower than that of the light-emitting element 222. The drive transistor 226 is an n-channel transistor.

The selection transistor 224 is connected between a gate electrode of the drive transistor 226 and a signal line 208. The capacitor 228 is connected between the gate electrode of the drive transistor 226 and the ground line 4.

The row selection circuit 205 and the signal voltage output circuit 207 supply a signal voltage of a polarity different from that of the other embodiment described above to the signal line 208 in order to drive the drive transistor 226 that is an n-channel transistor.

In the present embodiment, the polarity of the drive transistor 226 is the n-channel, and thus the polarity of the signal voltage and the like differ from those of the other embodiment described above. That is, the row selection circuit 205 supplies a selection signal to a scanning line 206, sequentially selecting one row from the array of m rows of the sub-pixels 220. The signal voltage output circuit 207 supplies a signal voltage having the required analog voltage value for each sub-pixel 220 in the selected row. The drive transistor 226 of the sub-pixels 220 of the selected row introduces a current corresponding to the signal voltage to the light-emitting element 222. The light-emitting element 222 emits light at a brightness in accordance with the flowing current.

A manufacturing method of the image display device according to the present embodiment will now be described.

FIG. 14A to FIG. 15B are schematic cross-sectional views illustrating the manufacturing method of the image display device according to the present embodiment.

In the present embodiment, until the formation of the graphene layer 1140 on the circuit substrate 1100, the processes are the same as those of the other embodiment described above. Hereinafter, the processes of the manufacturing process of the present embodiment following the process illustrated in FIG. 5B will be described.

Figure 14A:
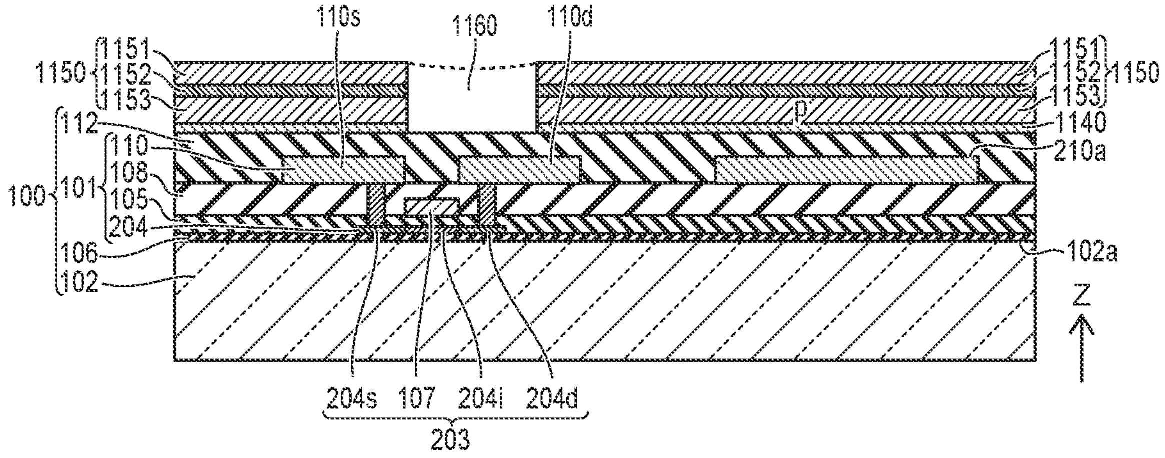
FIG. 14A is a schematic cross-sectional view illustrating a manufacturing method of the image display device according to the second embodiment.

As illustrated in FIG. 14A, the semiconductor layer 1150 is formed over the graphene layer 1140. In the present embodiment, the semiconductor layer 1150 is formed in the order of the p-type semiconductor layer 1153, the light-emitting layer 1152, and the n-type semiconductor layer 1151, in the positive direction of the Z axis from the side of the graphene layer 1140.

Similar to the other embodiments, a physical vapor deposition method such as vapor deposition, ion beam deposition, MBE, or sputtering is used for the formation of the semiconductor layer 1150, and a low-temperature sputtering method is preferably used. The semiconductor layer 1150 of GaN is grown on the graphene layer 1140, thereby stably forming the monocrystallized semiconductor layer 1150 including the light-emitting layer 1152 on the graphene layer 1140 from the p-type semiconductor layer 1153 as well (refer to Non Patent Documents 1 and 2 and the like).

Figure 14B:
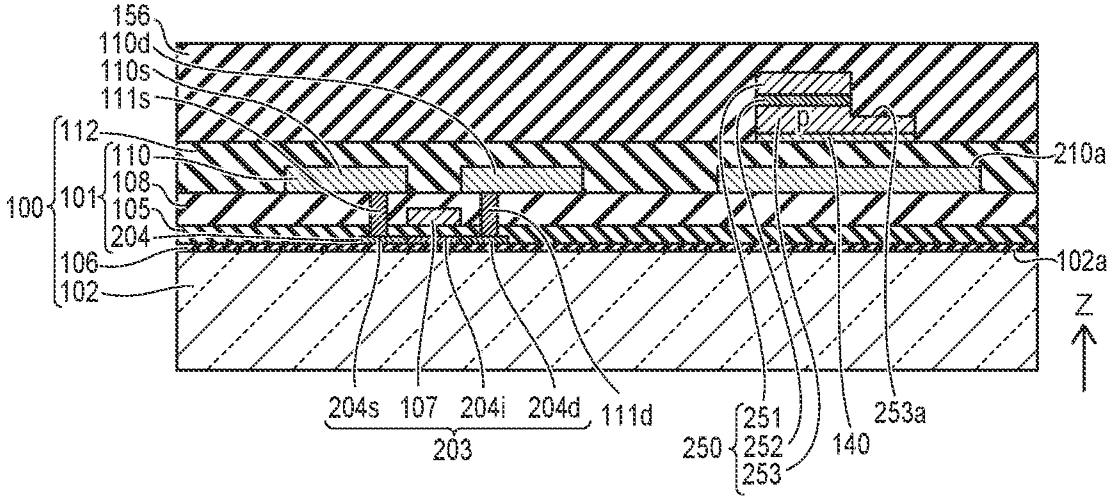
FIG. 14B is a schematic cross-sectional view illustrating the manufacturing method of the image display device according to the second embodiment.

As illustrated in FIG. 14B, the semiconductor layer 1150 is molded into a required shape by RIE or the like, forming the light-emitting element 250. Subsequently, the second interlayer insulating film 156 is formed covering the first interlayer insulating film 112, the graphene sheet 140, and the light-emitting element 250.

Figure 15A:
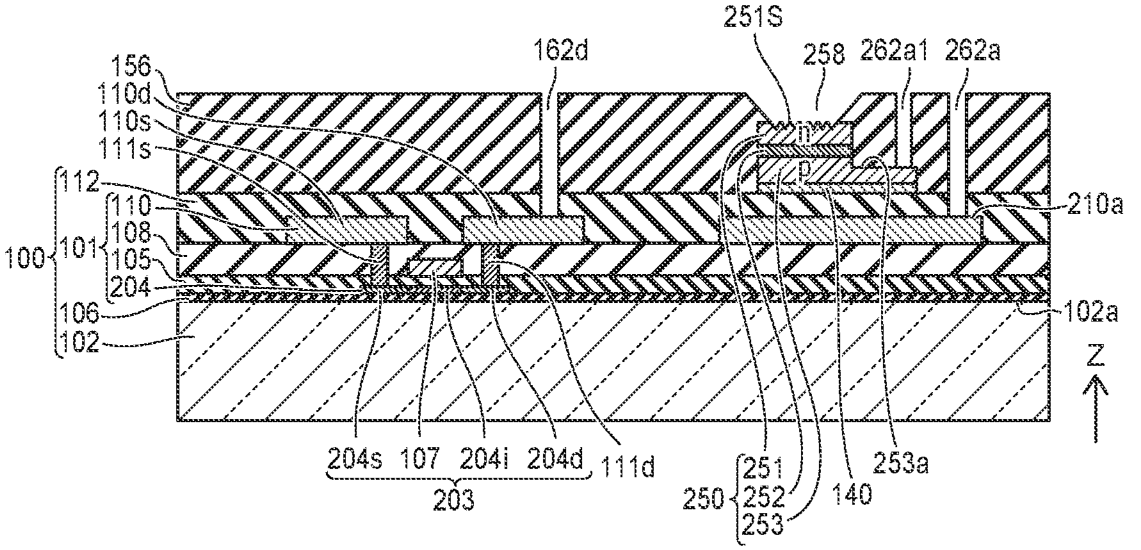
FIG. 15A is a schematic cross-sectional view illustrating the manufacturing method of the image display device according to the second embodiment.

As illustrated in FIG. 15A, a via hole **262*a*1 is formed through the second interlayer insulating film 156. The via holes 262*a*, 162*d* are formed through the interlayer insulating films 112, 256. Simultaneously with forming the via holes 262*a*1, 262*a*, 162*d*, the opening 258 is formed in the interlayer insulating film 156, exposing the light-emitting surface 251S. The exposed light-emitting surface 251S is roughened. The opening 258 may be formed before formation of the via holes 262*a*1, 262*a*, 162*d* or after formation of the via holes 262*a*1, 262*a*, 162*d***.

Figure 15B:
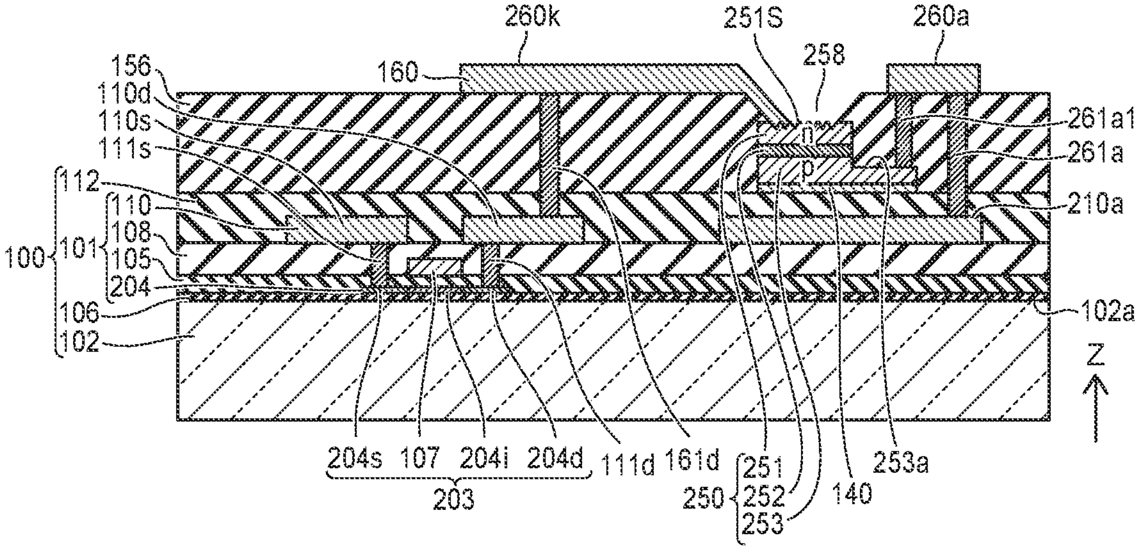
FIG. 15B is a schematic cross-sectional view illustrating the manufacturing method of the image display device according to the second embodiment.

As illustrated in FIG. 15B, the via holes **262*a*1, 262*a*, 162*d* illustrated in FIG. 15A are filled with a conductive material, forming the vias 261*a*1, 261*a*, 161*d*. Subsequently or simultaneously with filling the via holes 262*a*1, 262*a*, 162*d* with a conductive material or the like, the second wiring layer 160 is formed. In this example, one end of the wiring line 260*k* is connected to a surface including the light-emitting surface 251**S.

Thereafter, the color filter is formed as in the other embodiments.

In this way, the image display device 201 of the present embodiment can be manufactured.

Effects of the image display device 201 of the present embodiment will now be described.

In addition to the effects of other embodiment described above, the present embodiment further has the following effects. That is, in the present embodiment, the semiconductor layer 1150 is grown on the graphene layer 1140, making stable growth possible in the p-type semiconductor layer as well. Therefore, the yield of the image display device can be improved.

Third Embodiment

In an image display device of the present embodiment, circuit elements such as a transistor is formed on a flexible substrate instead of a glass substrate. In other respects, components that are the same as those of the other embodiments described above are denoted by the same reference characters, and detailed descriptions thereof will be omitted as appropriate.

Figure 16:
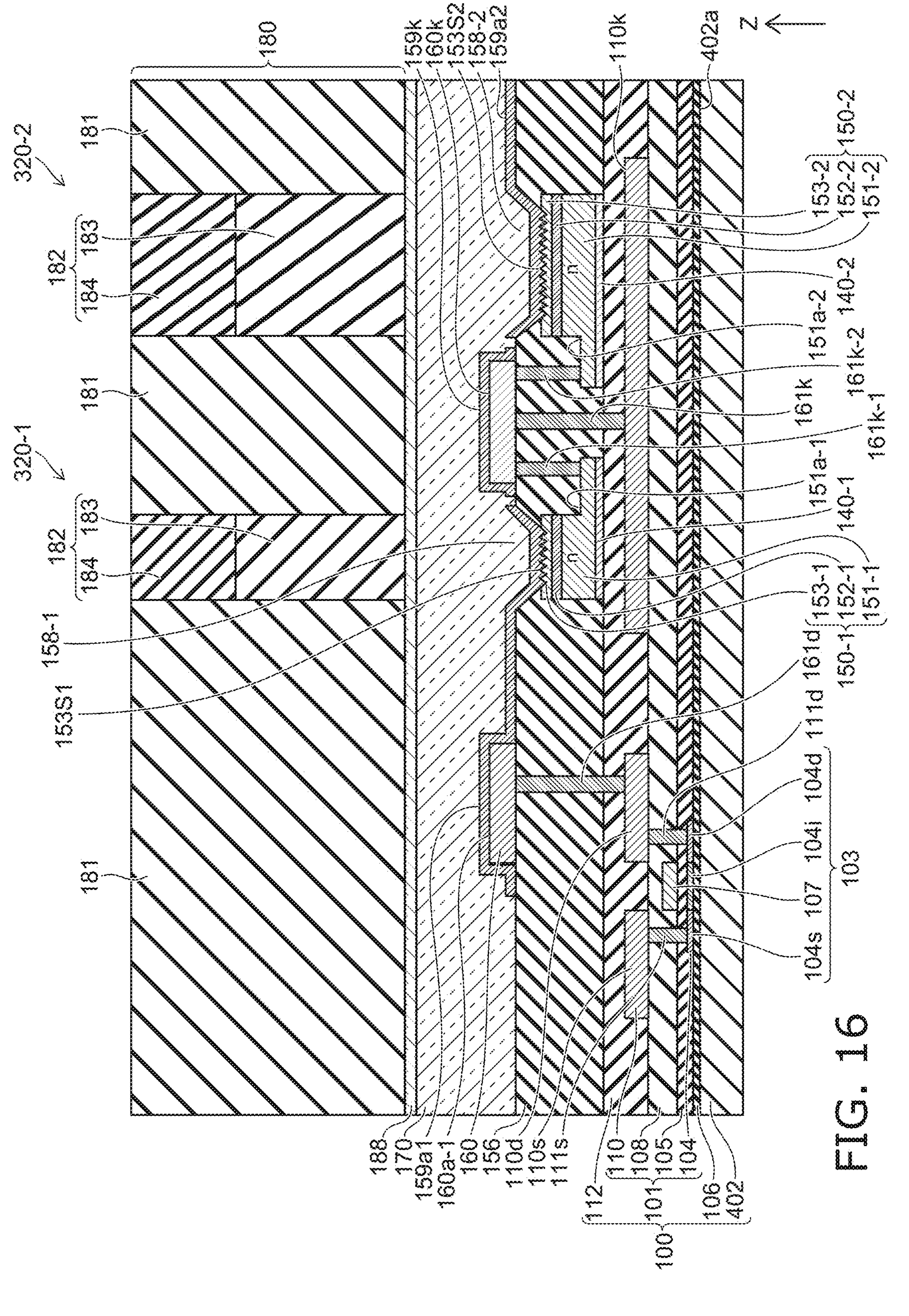
FIG. 16 is a schematic cross-sectional view illustrating a portion of an image display device according to a third embodiment.

FIG. 16 is a schematic cross-sectional view illustrating a portion of the image display device according to the present embodiment.

FIG. 16 illustrates an aligned cross section at positions corresponding to the lines AA' illustrated in FIG. 4.

As illustrated in FIG. 16, the image display device of the present embodiment includes sub-pixels 320-1. 320-2. The sub-pixels 320-1, 320-2 include a substrate 402 that is common to both. The substrate 402 includes a first surface 402*a*. Circuit elements such as the transistor 103 are provided on the first surface 402*a*. In the sub-pixels 320-1, 320-2, an upper structure including the circuit elements is formed on the first surface 402*a*.

The substrate 402 is flexible. The substrate 402 is formed by, for example, a polyimide resin. The interlayer insulating films 112, 156, the wiring layers 110, 160, and the like are preferably formed of a material having a certain degree of flexibility in accordance with the flexibility of the substrate 402. Note that the element having the highest risk of being destroyed during bending is the wiring layer 110 having the longest wiring length. Therefore, it is desirable to adjust various film thicknesses, materials, and films so that a neutral surface including a plurality of protective films and the like added to the front surface and the back surface as needed is positioned on the wiring layer 110.

In this example, the transistor 103 and the light-emitting elements 150-1, 150-2 formed on the substrate 402 are the same as those in the first embodiment, that is, for example, the circuit configuration illustrated in FIG. 3 is applied. Configurations of the other embodiments can also be readily applied.

A manufacturing method of the image display device according to the present embodiment will now be described.

Figure 17A:
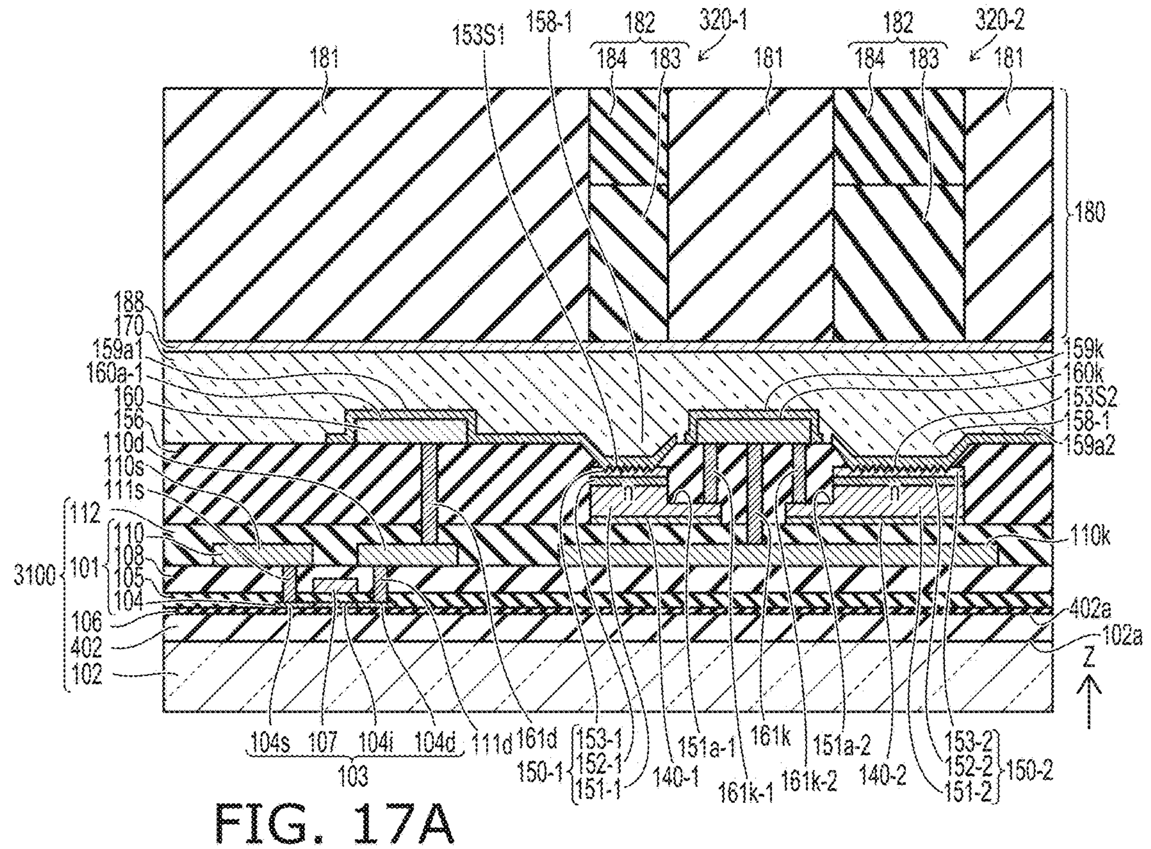
FIG. 17A is a schematic cross-sectional view illustrating a manufacturing method of the image display device according to the third embodiment.
Figure 17B:
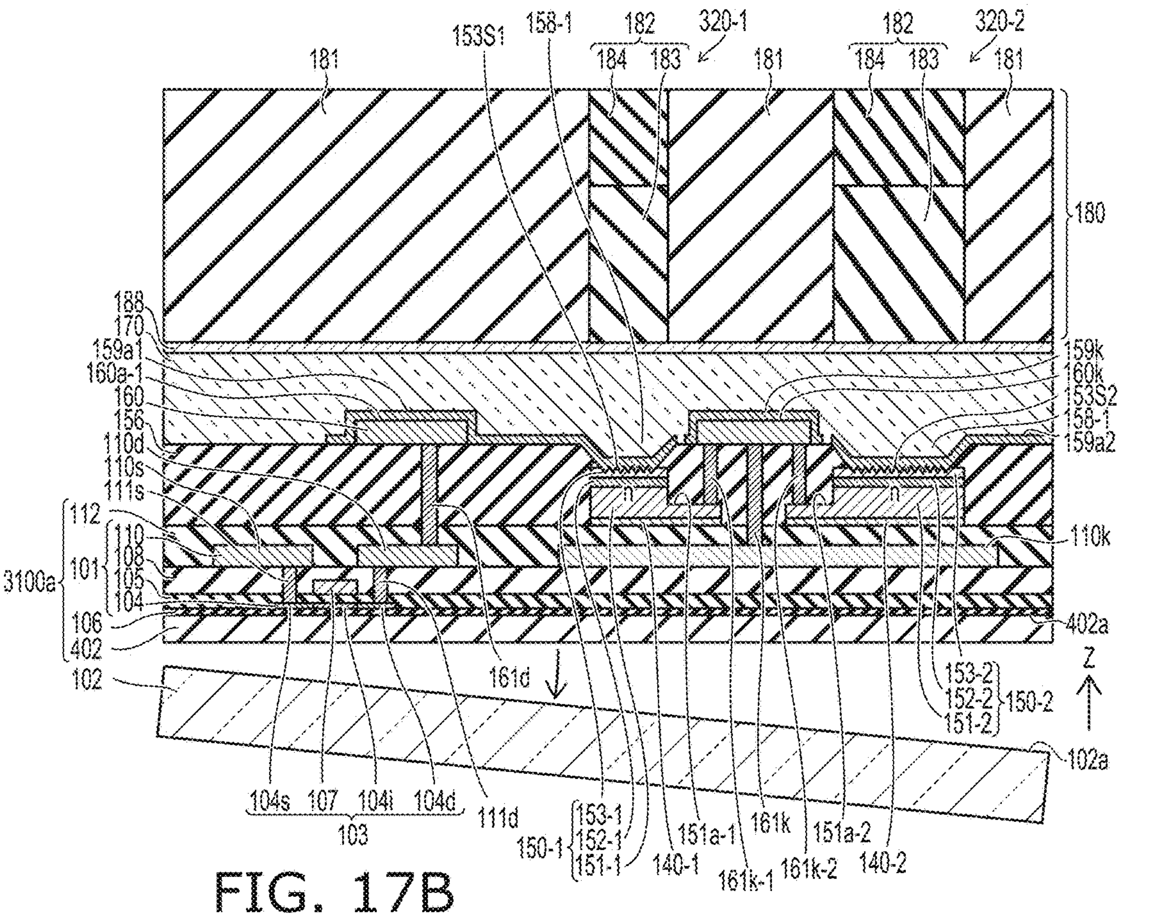
FIG. 17B is a schematic cross-sectional view illustrating the manufacturing method of the image display device according to the third embodiment.

FIG. 17A and FIG. 17B are schematic cross-sectional views illustrating the manufacturing method of the image display device according to the present embodiment.

As illustrated in FIG. 17A, in the present embodiment, a circuit substrate 3100 different from that of the other embodiments described above is prepared. The circuit substrate 3100 includes the two layers of the substrates 102, 402. The substrate 402 is provided on the first surface 102*a* of the substrate 102, and is formed by, for example, applying a polyimide material and baking. An inorganic film such as $SiN_X$ may be further interposed between the two layers of the substrates 102, 402. The TFT lower layer film 106, the circuit 101, and the interlayer insulating film 112 are provided on the first surface 402*a* of the substrate 402. The first surface 402*a* of the substrate 402 is the surface facing the surface on which the substrate 102 is provided.

In such a circuit substrate 3100, an upper structure of the sub-pixels 320-1, 320-2 is formed by applying the processes described in FIG. 5A to FIG. 11D, for example.

As illustrated in FIG. 17B, the substrate 102 is removed from the structure in which an upper structure including the color filter and the like is formed, forming a new circuit substrate 3100*a*. To remove the substrate 102, laser lift-off is used, for example. Removal of the substrate 102 is not limited to the point in time described above, and can be performed at another appropriate point in time. For example, the substrate 102 may be removed after wafer bonding or before formation of the color filter. By removing the substrate 102 at an earlier point in time, defects such as cracking and chipping during the manufacturing process can be reduced.

Effects of the image display device of the present embodiment will now be described.

The substrate 402 is flexible and thus can be bent as an image display device and can be adhered to a curved surface or utilized with a wearable terminal or the like without any discomfort.

Fourth Embodiment

In the present embodiment, a plurality of light-emitting surfaces corresponding to a plurality of light-emitting elements are formed in a single semiconductor layer including a light-emitting layer, thereby realizing an image display device having a higher light emission efficiency. In the description below, components that are the same as those of the other embodiments described above are denoted by the same reference characters, and detailed descriptions thereof will be omitted as appropriate.

Figure 18:
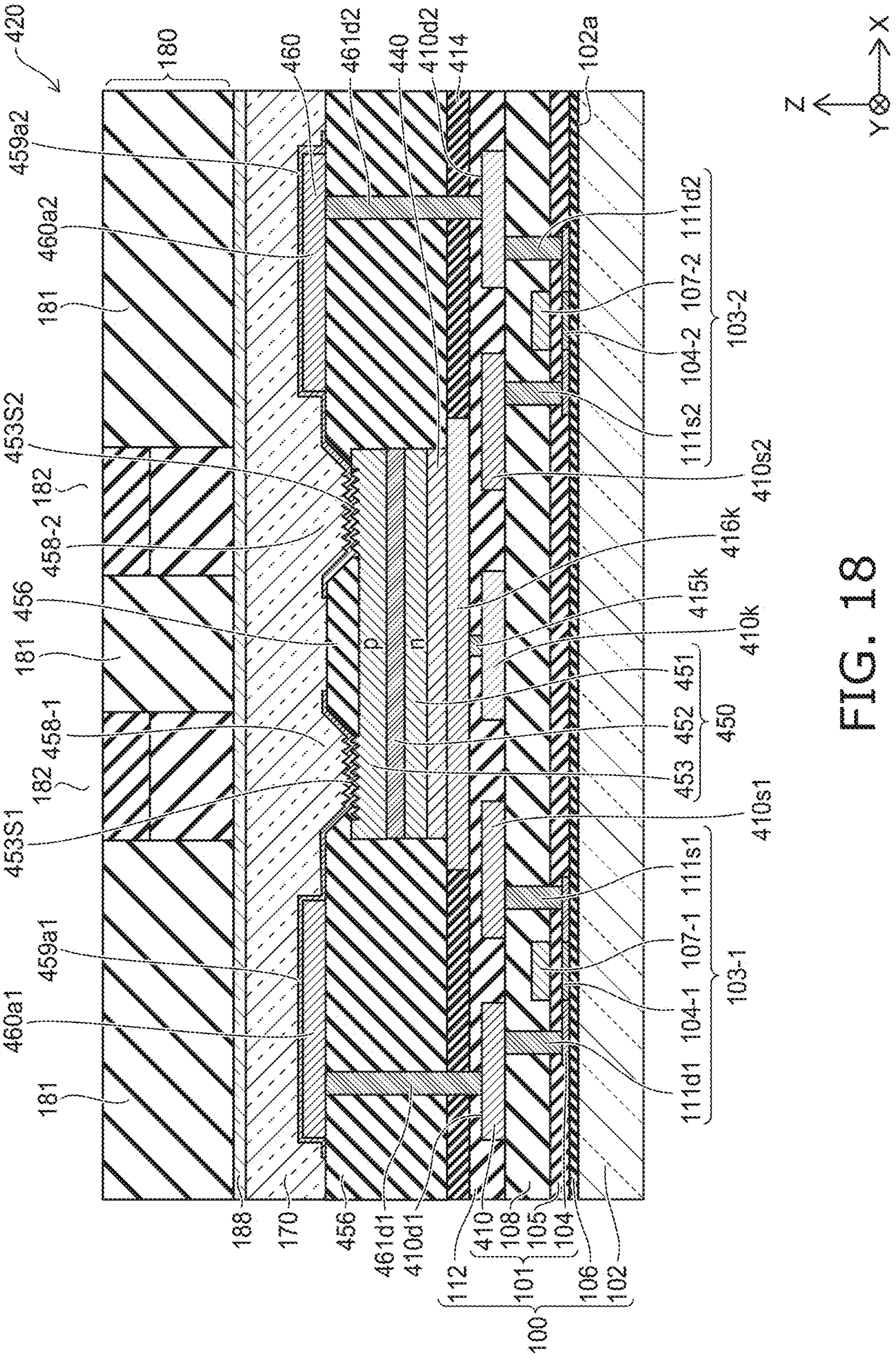
FIG. 18 is a schematic cross-sectional view illustrating a portion of an image display device according to a fourth embodiment.

FIG. 18 is a schematic cross-sectional view illustrating a portion of the image display device according to the present embodiment.

As illustrated in FIG. 18, the image display device includes a sub-pixel group 420. The sub-pixel group 420 includes transistors (plurality of transistors) 103-1, 103-2, a first wiring layer (first wiring layer) 410, the interlayer insulating film (first insulating film) 112, a plug 416*k*, a graphene sheet (portion including graphene) 440, a semiconductor layer 450, an interlayer insulating film (second insulating film) 456, and vias (plurality of vias) 461*d*1, 461*d*2.

In the present embodiment, the p-channel transistors 103-1, 103-2 are turned on, thereby injecting holes into the semiconductor layer 450 via a wiring layer 460 and injecting electrons into the semiconductor layer 450 via the plug 416*k*, causing the light-emitting layer 452 to emit light. The circuit configuration illustrated in FIG. 3, for example, is applied to the drive circuit. The n-type semiconductor layer and the p-type semiconductor layer of the semiconductor layers can be vertically interchanged by using the other embodiment described above to make a configuration in which the semiconductor layer is driven by an n-channel transistor. In such a case, the circuit configuration of FIG. 13, for example, is applied to the drive circuit.

The semiconductor layer 450 includes two light-emitting surfaces 453S1, 453S2, and the sub-pixel group 420 substantially includes two sub-pixels. In the present embodiment, the display region is formed by arraying the sub-pixel group 420 substantially including two sub-pixels in a lattice pattern, as in the other embodiments described above.

The transistors 103-1, 103-2 are respectively formed in TFT channels 104-1, 104-2. In this example, the TFT channels 104-1, 104-2 each include a p-doped region, and a channel region is interposed between these regions.

On the TFT channel 104-1, 104-2, the insulating layer 105 is formed and gates 107-1, 107-2 are formed with the insulating layer 105 interposed therebetween. The gates 107-1, 107-2 are gates of the transistors 103-1, 103-2. In this example, the transistors 103-1, 103-2 are p-channel TFTs.

The insulating film 108 covers the two transistors 103-1, 103-2. The wiring layer 410 is formed on the insulating film 108.

Vias 111*s*1, 111*d*1 are provided between the p-type doped region of the transistor 103-1 and the wiring layer 410. Vias 111*s*2, 111*d*2 are provided between the p-type doped region of the transistor 103-2 and the wiring layer 410.

The wiring layer 410 includes wiring lines 410*k*, 410*s*1, 410*s*2, 410*d*1, 410*d*2. The wiring line 410*k* is connected to the plug 416*k* via a connecting portion 415*k*. The wiring line 410*k* is connected to the ground line 4 illustrated in FIG. 3, for example.

The wiring line 410*s*1 is electrically connected to a region corresponding to a source electrode of the transistor 103-1 by the via 111*s*1. The wiring line 410*s*2 is electrically connected to a region corresponding to a source electrode of the transistor 103-2 by the via 111*s*2. The wiring lines 410*s*1, 410*s*2 are connected to the power source line 3 illustrated in FIG. 3, for example.

The wiring line 410*d*1 is connected to a region corresponding to a drain electrode of the transistor 103-1 by the via 111*d*1. The wiring line 410*d*2 is connected to a region corresponding to a drain electrode of the transistor 103-2 by the via 111*d*2.

The interlayer insulating film 112 covers the transistors 103-1, 103-2 and the wiring layer 410. The plug 416*k* is formed on the interlayer insulating film 112.

A flattening film 414 is formed on the interlayer insulating film 112. The flattening film 414 is also provided on a lateral surface of the plug 416*k*. The plug 416*k* is embedded in the flattening film 414, and the flattening film 414 and the plug 416*k* include surfaces in the same plane in an XY plane view. These surfaces are surfaces on sides facing the surface of the interlayer insulating film 112 side.

The graphene sheet 440 is provided on the plug 416*k*. An outer periphery of the graphene sheet 440 substantially matches an outer periphery of the semiconductor layer 450. An outer periphery of the plug 416*k* is set such that the outer periphery of the semiconductor layer 450 and the outer periphery of the graphene sheet 440 are located within the outer periphery of the plug 416*k* when the graphene sheet 440 and the semiconductor layer 450 are projected onto the plug 416*k*. Therefore, the plug 416*k* functions as a light-reflecting plate that reflects scattered light emitted downward from the semiconductor layer 450 toward the light-emitting surface 453S1, 453S2 side.

The semiconductor layer 450 is provided on the graphene sheet 440. The semiconductor layer 450 includes an n-type semiconductor layer (first semiconductor layer) 451, a light-emitting layer 452, and a p-type semiconductor layer (second semiconductor layer) 453. The semiconductor layer 450 is layered in the order of the n-type semiconductor layer 451, the light-emitting layer 452, and the p-type semiconductor layer 453, from the side of the graphene sheet 440 toward the side of the light-emitting surfaces 453S1, 453S2. The n-type semiconductor layer 451 is provided on the graphene sheet 440. The graphene sheet 440 is sufficiently thin and thus the resistance in the thickness direction is sufficiently low. As such, the n-type semiconductor layer 451 is electrically connected to the plug 416*k* with the graphene sheet 440 interposed therebetween.

The interlayer insulating film 456 covers the flattening film 414 and the plug 416*k*. The interlayer insulating film 456 covers a portion of the semiconductor layer 450. Preferably, the interlayer insulating film 456 covers a surface of the p-type semiconductor layer 453, excluding the light-emitting surfaces (exposed surfaces) 453S1, 453S2 of the semiconductor layer 450. The interlayer insulating film 456 covers a lateral surface of the semiconductor layer 450. The interlayer insulating film 456 is, for example, a white resin, and may be a black resin.

Openings 458-1, 458-2 are formed in a portion of the semiconductor layer 450 not covered by the interlayer insulating film 456. The openings 458-1, 458-2 are formed at positions corresponding to the light-emitting surfaces 453S1, 453S2. The light-emitting surfaces 453S1, 453S2 are formed in separated positions on the p-type semiconductor layer 453. The light-emitting surface 453S1 is provided on the p-type semiconductor layer 453 at a position closer to the transistor 103-1. The light-emitting surface 453S2 is provided on the p-type semiconductor layer 453 at a position closer to the transistor 103-2.

The openings 458-1, 458-2 have, for example, square or rectangular shapes in an XY plane view. The shape is not limited to rectangular, and may be circular, elliptical, or polygonal such as hexagon. The light-emitting surfaces 453S1, 453S2 also have square, rectangular, other polygonal, or circular shapes or the like in an XY plane view. The shapes of the light-emitting surfaces 453S1, 453S2 may be similar to or different from the shapes of the openings 458-1, 458-2.

The wiring layer 460 is provided on the interlayer insulating film 456. The wiring layer 460 includes wiring lines 460*a*1, 460*a*2.

The vias 461*d*1, 461*d*2 are provided through the interlayer insulating films 112, 456 and the flattening film 414. The via 461*d*1 is provided between the wiring line 410*d*1 and the wiring line 460*a*1. One end of the via 461*d*1 is connected to the wiring line 410*d*1 and the other end of the via 461*d*1 is connected to the wiring line 460*a*1. The via 461*d*2 is provided between the wiring line 410*d*2 and the wiring line 460*a*2. One end of the via 461*d*2 is connected to the wiring line 410*d*2 and the other end of the via 461*d*2 is connected to the wiring line 460*a*2.

A light-transmitting electrode 459*a*1 is provided over the wiring line 460*a*1, and the wiring line 460*a*1 and the light-transmitting electrode 459*a*1 are electrically connected. The light-transmitting electrode 459*a*1 is extended to the opening 458-1. The light-transmitting electrode 459*a*1 is provided across the entire light-emitting surface 453S1 exposed from the opening 458-1, and is electrically connected to the p-type semiconductor layer 453 via the light-emitting surface 453S1.

A light-transmitting electrode 459*a*2 is provided over the wiring line 460*a*2, and the wiring line 460*a*2 and the light-transmitting electrode 459*a*2 are electrically connected. The light-transmitting electrode 459*a*2 is extended to the opening 458-2. The light-transmitting electrode 459*a*2 is provided across the entire light-emitting surface 453S2 exposed from the opening 458-2, and is electrically connected to the p-type semiconductor layer 453 via the light-emitting surface 453S2.

As described above, the light-transmitting electrodes 459*a*1, 459*a*2 are connected to the light-emitting surfaces 453S1, 453S2 exposed from the openings 458-1, 458-2. When the transistor 103-1 is turned on, holes are injected into the light-transmitting electrode 459*a*1 via the wiring line 460*a*1, the via 461*d*1, and the wiring line 410*d*1. When the transistor 103-2 is turned on, holes are injected into the light-transmitting electrode 459*a*2 via the wiring line 460*a*2, the via 461*d*2, and the wiring line 410*d*2. On the other hand, electrons are injected into the n-type semiconductor layer 451 via the wiring line 410*k* connected to the ground line 4, the connecting portion 415*k*, the plug 416*k*, and the graphene sheet 440.

The transistors 103-1, 103-2 are drive transistors of adjacent sub-pixels and are driven sequentially. Accordingly, holes injected from either one of the two transistors 103-1, 103-2 are injected into the light-emitting layer 452, electrons injected from the plug 416*k* are injected into the light-emitting layer 452, and the light-emitting layer 452 emits light. When the transistor 103-1 is turned on, the light-emitting surface 453S1 emits light, and when the transistor 103-2 is turned on, the light-emitting surface 453S2 emits light. In this way, the light emission of the light-emitting layer 452 is localized as a result of a drift current flowing in a direction parallel to the XY plane in the p-type semiconductor layer 453 being suppressed by the resistance of the p-type semiconductor layer 453.

A manufacturing method of the image display device according to the present embodiment will now be described.

FIG. 19A to FIG. 22B are schematic cross-sectional views illustrating the manufacturing method of the image display device according to the embodiment.

FIG. 19A to FIG. 20B illustrate a process of forming the plug 416*k* on a circuit substrate 4100.

FIGS. 21A to 22B illustrate a process of forming the semiconductor layer 450 and the like on the circuit substrate 4100 on which the plug 416*k* is formed to form the sub-pixel group 420.

Figure 19A:
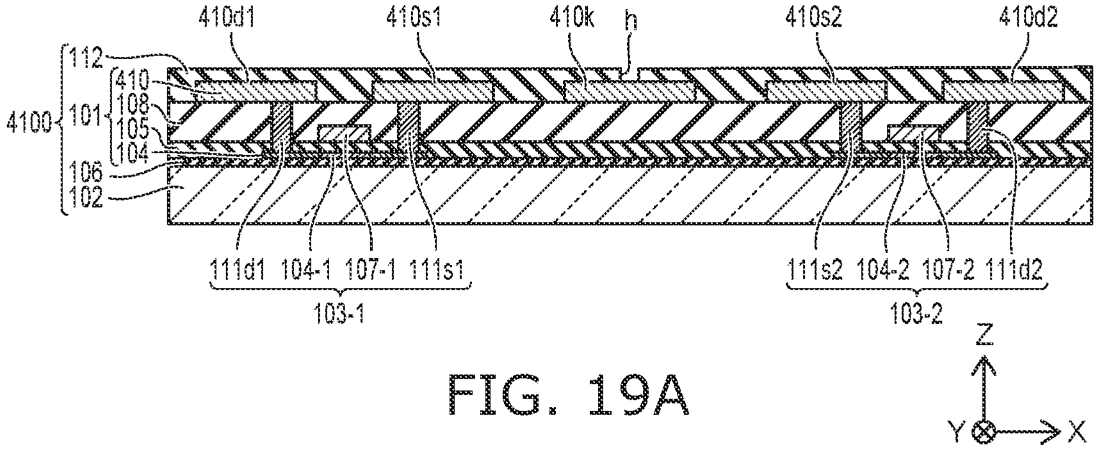
FIG. 19A is a schematic cross-sectional view illustrating a manufacturing method of the image display device according to the fourth embodiment.

As illustrated in FIG. 19A, the circuit substrate 4100 is prepared. The circuit substrate 4100 includes the circuit 101, the substrate 102, the TFT lower layer film 106, and the first interlayer insulating film 112, which are the same as those described in FIG. 1 and the like. This circuit 101 includes the transistors 103-1, 103-2 and the like, and is formed on the TFT lower layer film 106 formed on the substrate 102. The circuit 101 is covered by the first interlayer insulating film 112. A contact hole h is formed in the interlayer insulating film 112. The position at which the contact hole h is formed is a position where the wiring line 410*k* is provided. The contact hole h is formed to a depth at which a surface of the wiring line 410*k* is exposed.

Figure 19B:
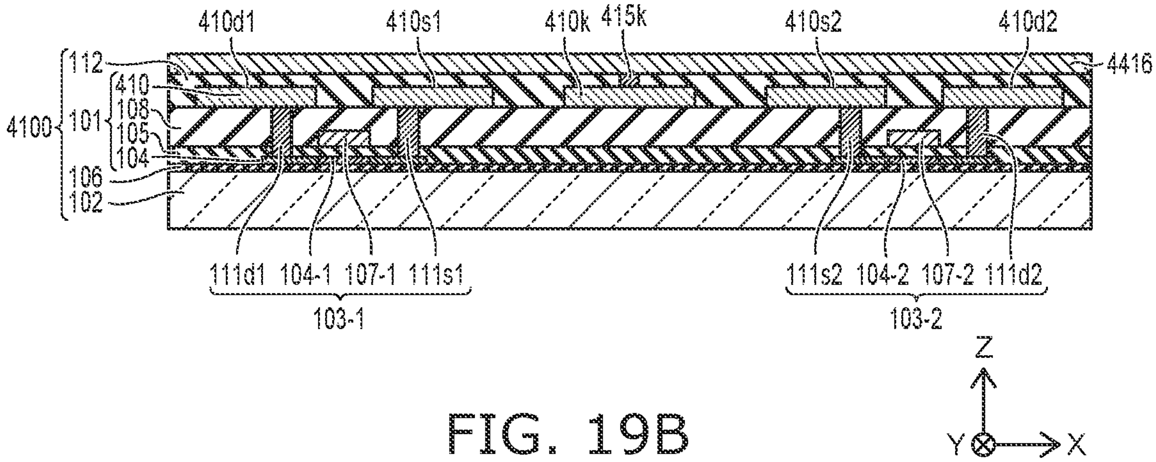
FIG. 19B is a schematic cross-sectional view illustrating the manufacturing method of the image display device according to the fourth embodiment.

As illustrated in FIG. 19B, a metal layer 4416 is formed over the entire surface of the interlayer insulating film 112. The contact hole h is filled with the same conductive material as the metal layer 4416, simultaneously with the formation of the metal layer 4416. The connecting portion 415*k* is formed in the contact hole h filled with the material of the metal layer 4416. Accordingly, the connecting portion 415*k* electrically connects the wiring line 410*k* and the metal layer 4416.

Figure 19C:
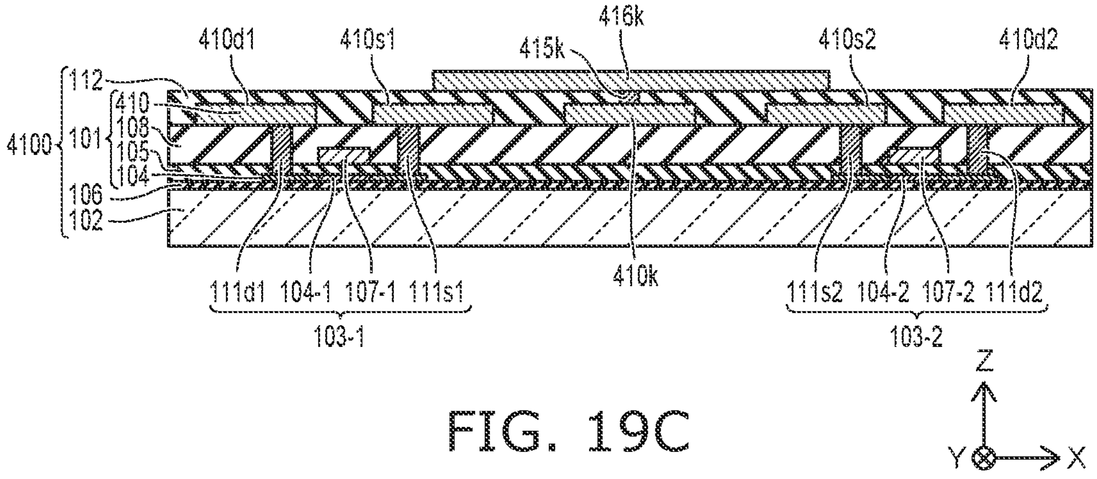
FIG. 19C is a schematic cross-sectional view illustrating the manufacturing method of the image display device according to the fourth embodiment.

As illustrated in FIG. 19C, the plug 416*k* is formed on the connecting portion 415*k* by photolithography and dry etching. The plug may be formed directly on the wiring line 410*k* without forming the connecting portion 415*k*.

Figure 20A:
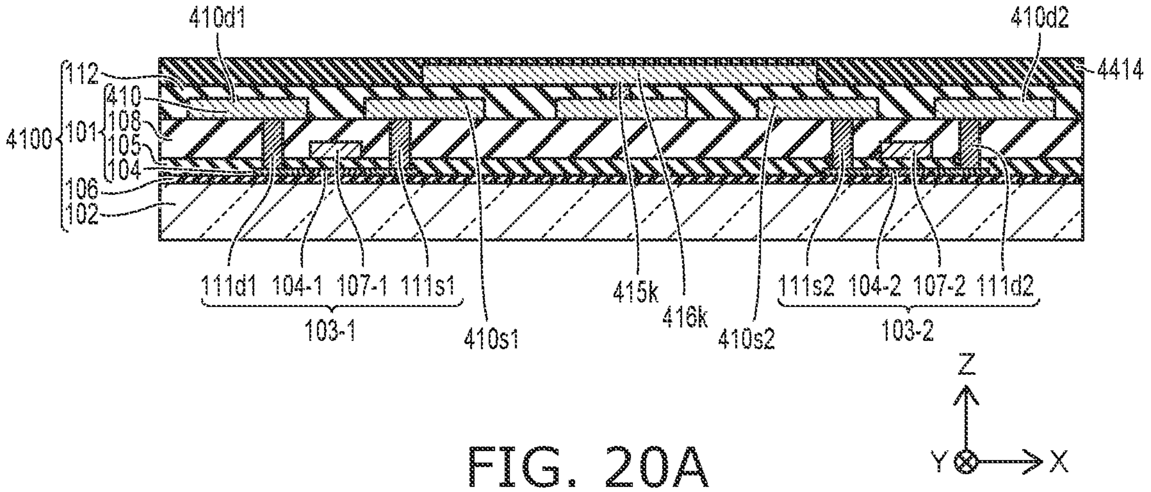
FIG. 20A is a schematic cross-sectional view illustrating the manufacturing method of the image display device according to the fourth embodiment.

As illustrated in FIG. 20A, a flattening film 4414 is applied so as to cover the interlayer insulating film 112 and the plug 416*k* and subsequently baked. The flattening film 4414 is formed thicker than a thickness of the plug 416*k*. Therefore, the flattening film 4414 also covers the lateral surface of the plug 416*k*. Subsequently, a front surface of the flattening film 4414 is polished. To polish the flattening film 4414, a chemical mechanical polishing (CMP) is used, for example.

Figure 20B:
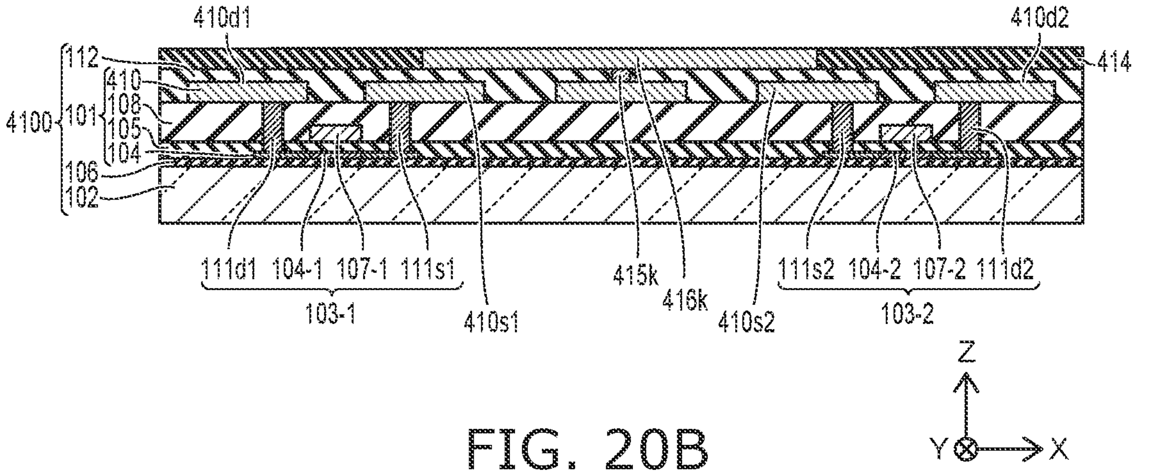
FIG. 20B is a schematic cross-sectional view illustrating the manufacturing method of the image display device according to the fourth embodiment.

As illustrated in FIG. 20B, by the polishing, the surface of plug 416*k* is exposed and the flattening film 414 is formed. In this way, the plug 416*k* and the connecting portion 415*k* are formed.

Figure 21A:
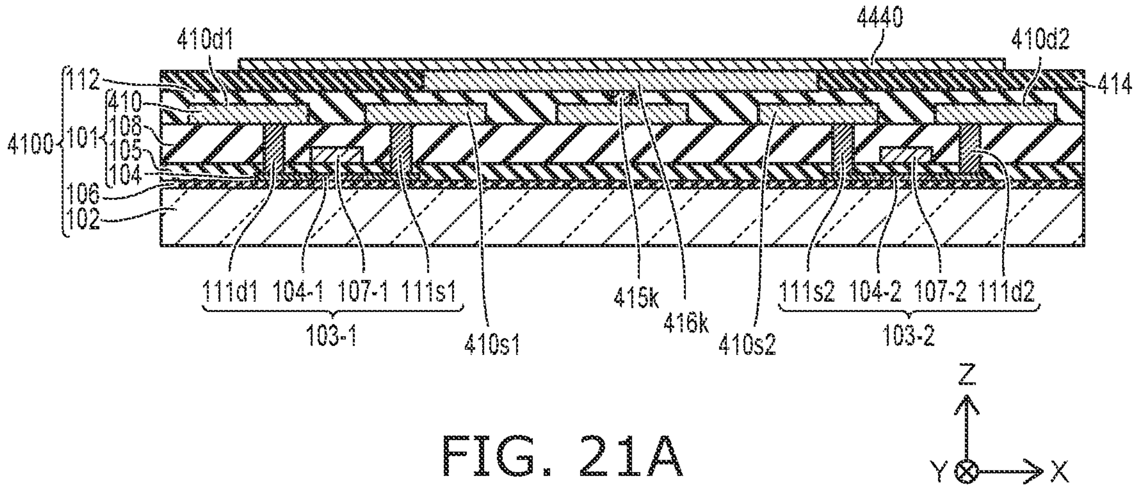
FIG. 21A is a schematic cross-sectional view illustrating the manufacturing method of the image display device according to the fourth embodiment.
Figure 21B:
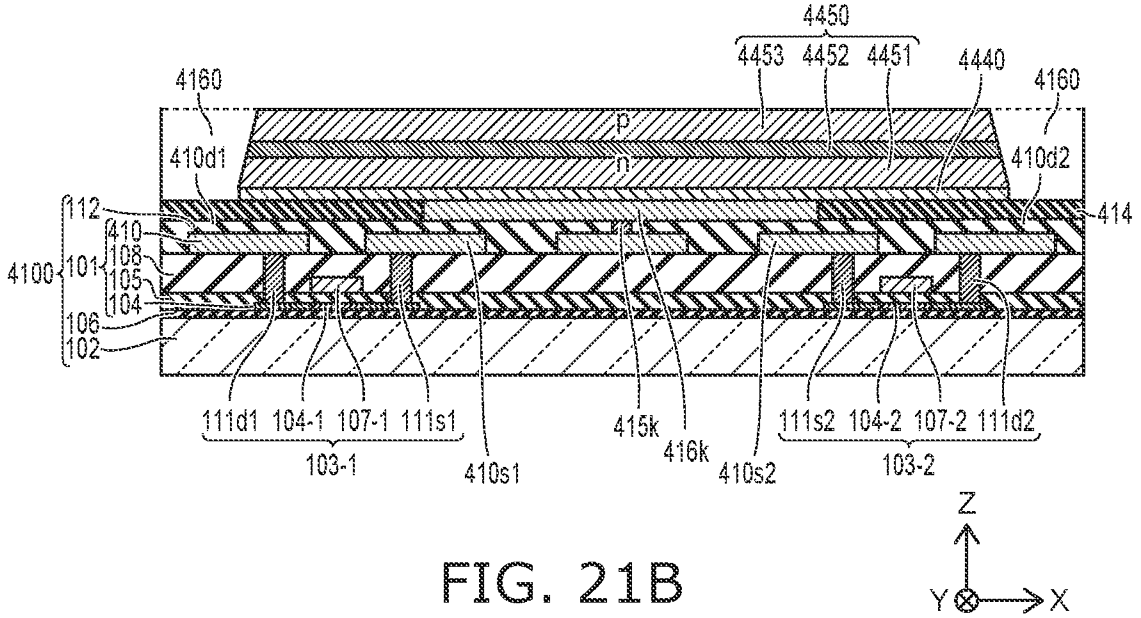
FIG. 21B is a schematic cross-sectional view illustrating the manufacturing method of the image display device according to the fourth embodiment.

Furthermore, as illustrated in FIG. 21A, a graphene layer 4440 is formed on the plug 416*k* and the flattening film 414 of the circuit substrate 4100. The graphene layer 4440 is pre-cut and formed to an appropriate outer periphery. The outer periphery of the graphene layer 4440 is set so that a semiconductor layer 4450 illustrated in FIG. 21B is subsequently grown across a sufficient area in an XY plane view. In this example, the outer periphery of the plug 416*k* is located within the outer periphery of the graphene layer 4440.

As illustrated in FIG. 21B, the semiconductor layer 4450 is formed on the graphene layer 4440. To form the semiconductor layer 4450, pulse sputtering is preferably used. The semiconductor layer 4450 is grown from an n-type semiconductor layer 4451 and grown in the order of a light-emitting layer 4452 and a p-type semiconductor layer 4453. The semiconductor layer 4450 is formed on the graphene layer 4440, and a deposit 4160 that is not monocrystallized is formed on areas other than graphene layer 4440.

Figure 22A:
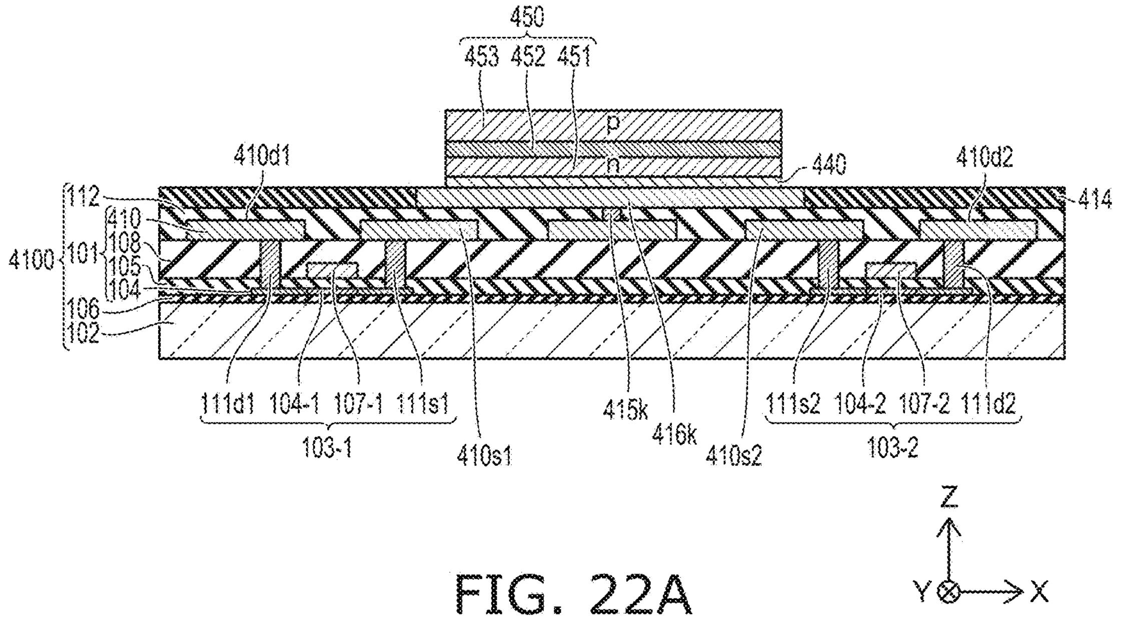
FIG. 22A is a schematic cross-sectional view illustrating the manufacturing method of the image display device according to the fourth embodiment.

As illustrated in FIG. 22A, the semiconductor layer 4450 illustrated in FIG. 21B is molded into the semiconductor layer 450 having a desired shape by RIE or the like. At this time, in an XY plane view, the outer periphery of the semiconductor layer 450 when the semiconductor layer 450 is projected onto the plug 416*k* is formed to be located within the outer periphery of the plug 416*k*.

The graphene layer 4440 illustrated in the FIG. 21B is, by the semiconductor layer 450 being overetched, molded to have substantially the same outer periphery as the outer periphery of the semiconductor layer 450, thereby forming the graphene sheet 440.

Figure 22B:
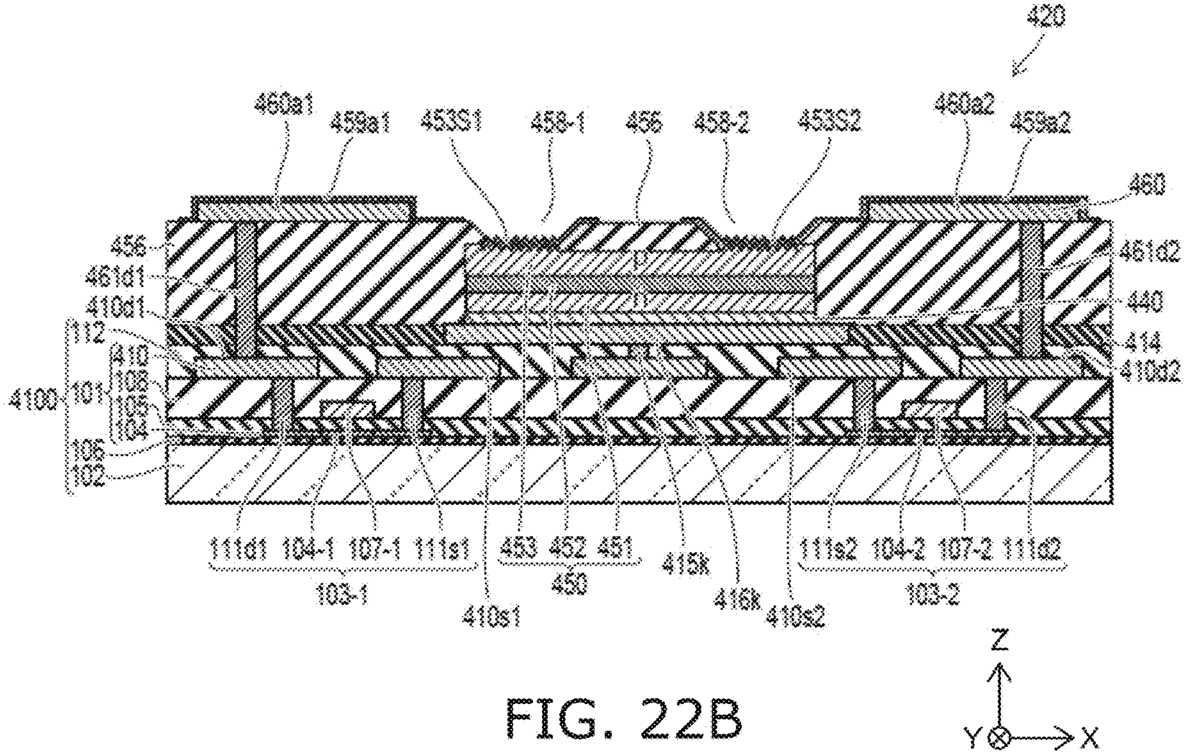
FIG. 22B is a schematic cross-sectional view illustrating the manufacturing method of the image display device according to the fourth embodiment.

As illustrated in FIG. 22B, the second interlayer insulating film 456 is formed covering the flattening film 414, the plug 416*k*, the lateral surface of the graphene sheet 440, and the semiconductor layer 450. The vias 461*d*1, 461*d*2 are formed through the interlayer insulating films 112, 456 and the flattening film 414. Furthermore, the wiring layer 460 is formed, and the wiring lines 460*a*1, 460*a*2 and the like are formed.

Subsequently, the openings 458-1, 458-2 are formed between the wiring lines 460*a*1, 460*a*2. The light-emitting surfaces 453S1, 453S2 of the p-type semiconductor layer exposed by the openings 458-1, 458-2 are each roughened. The light-transmitting electrodes 459*a*1, 459*a*2 are then formed.

In this manner, the sub-pixel group 420 including the semiconductor layer 450 that shares the two light-emitting surfaces 453S1, 453S2 is formed.

In the present example, the two light-emitting surfaces 453S1, 453S2 are provided in one semiconductor layer 450, but the number of light-emitting surfaces is not limited to two, and three or more light-emitting surfaces can be provided on the one semiconductor layer 450. As an example, one or two columns of sub-pixels may be realized by a single semiconductor layer 450. As a result, as described below, a recombination current that does not contribute to light emission per light-emitting surface can be reduced and the effect of realizing a finer light-emitting element can be increased.

Modified Example

Figure 23:
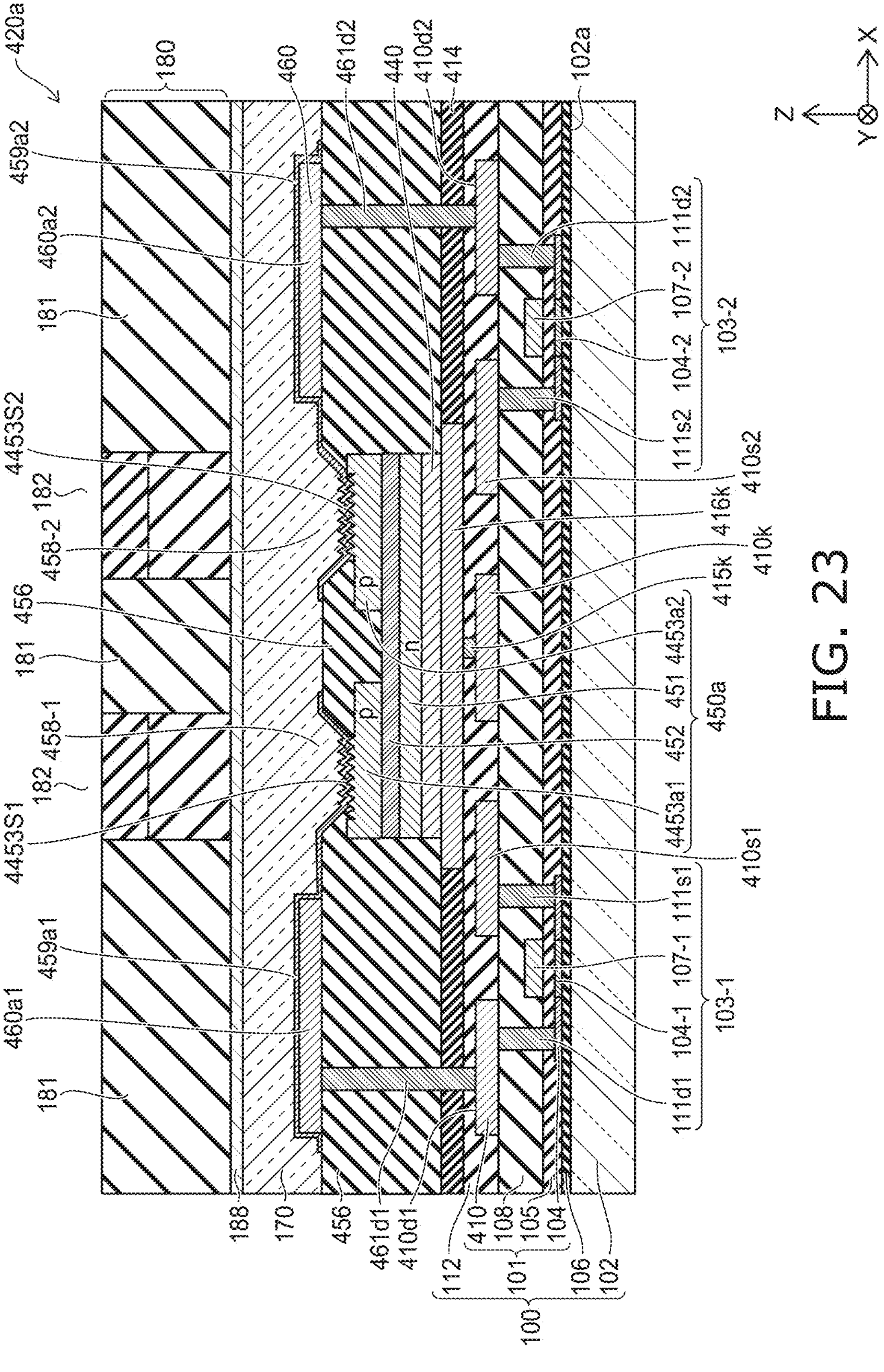
FIG. 23 is a schematic cross-sectional view illustrating a portion of an image display device according to a modified example of the fourth embodiment.

FIG. 23 is a schematic cross-sectional view illustrating a portion of an image display device according to a modified example of the present embodiment.

The present modified example differs from the fourth embodiment described above in that two p-type semiconductor layers 4453*a*1, 4453*a*2 are provided on the light-emitting layer 452. In other respects, components that are the same as those of the fourth embodiment are denoted by the same reference characters, and detailed descriptions thereof will be omitted as appropriate.

As illustrated in FIG. 23, the image display device of the present modified example includes a sub-pixel group 420*a*. The sub-pixel group 420*a* includes a semiconductor layer 450*a*. The semiconductor layer 450*a* includes the n-type semiconductor layer 451, the light-emitting layer 452, and the p-type semiconductor layers 4453*a*1, 4453*a*2. The semiconductor layer 450*a* is provided with the n-type semiconductor layer 451 on the plug 416*k* with the graphene sheet 440 interposed therebetween. The light-emitting layer 452 is layered on the n-type semiconductor layer 451. The two different p-type semiconductor layers **4453*a*1, 4453*a*2 are each layered on the light-emitting layer 452**.

The p-type semiconductor layers **4453*a*1, 4453*a*2 are, in this example, separated in the X-axis direction on the light-emitting layer 452. The interlayer insulating film 456 is provided between the p-type semiconductor layers 4453*a*1, 4453*a*2, and the p-type semiconductor layers 4453*a*1, 4453*a*2 are separated by the interlayer insulating film 456**.

The p-type semiconductor layers **4453*a*1, 4453*a*2** have substantially the same shape in an XY plane view, and the shape thereof is substantially square or rectangular, and may be another polygonal shape, circular, or the like.

The p-type semiconductor layers **4453*a*1, 4453*a*2 respectively include light-emitting surfaces 4453S1, 4453S2. The light-emitting surfaces 4453S1, 4453S2 are surfaces of the p-type semiconductor layers 4453*a*1, 4453*a*2 respectively exposed by the openings 458-1, 458-2**.

The light-emitting surfaces 4453S1, 4453S2 have substantially the same shape in an XY plane view and have a substantially square shape or the like, similar to the shape of the light-emitting surfaces in the fourth embodiment. The shape of the light-emitting surfaces 4453S1, 4453S2 is not limited to a rectangular shape such as in the present embodiment, and may be circular, elliptical, or polygonal such as hexagonal. The shape of the light-emitting surfaces 4453S1, 4453S2 may be similar to or different from the shape of the openings 458-1, 458-2.

The light-transmitting electrodes **459*a*1, 459*a*2 are respectively provided on the light-emitting surfaces 4453S1, 4453S2. The light-transmitting electrodes 459*a*1, 459*a*2 are also respectively provided on the wiring lines 460*a*1, 460*a*2. The light-transmitting electrode 459*a*1 is provided between the wiring line 460*a*1 and the light-emitting surface 4453S1, and electrically connects the wiring line 460*a*1 and the light-emitting surface 4453S1. The light-transmitting electrode 459*a*2 is provided between the wiring line 460*a*2 and the light-emitting surface 4453S2, and electrically connects the wiring line 460*a*2 and the light-emitting surface 4453S2**.

A manufacturing method of the present modified example will now be described.

Figure 24A:
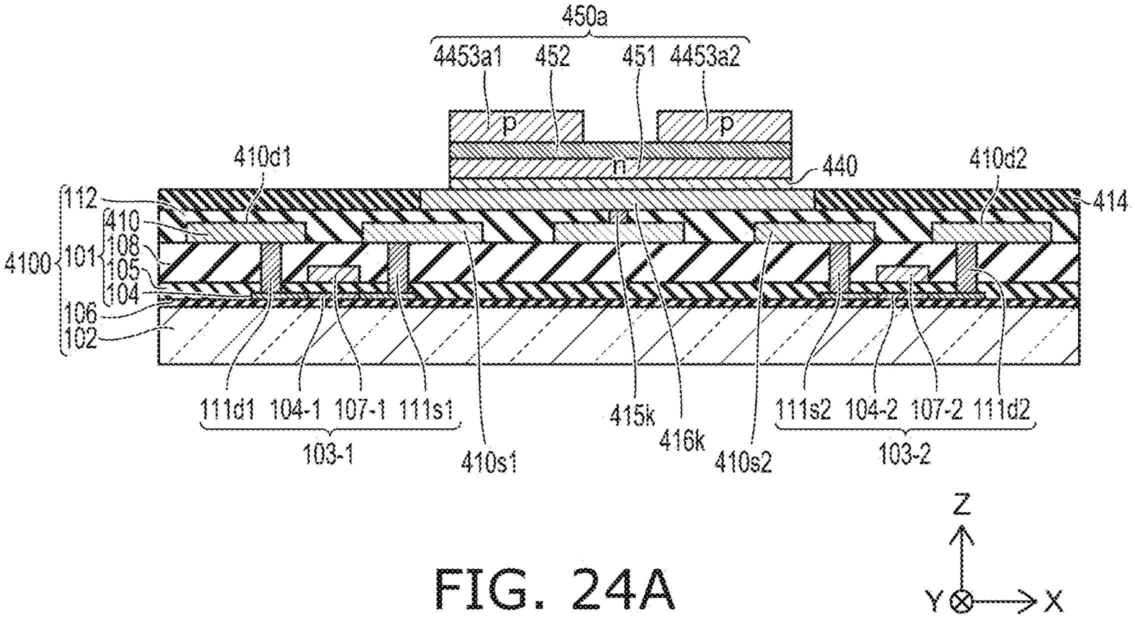
FIG. 24A is a schematic cross-sectional view illustrating a manufacturing method of the image display device according to the modified example of the fourth embodiment.
Figure 24B:
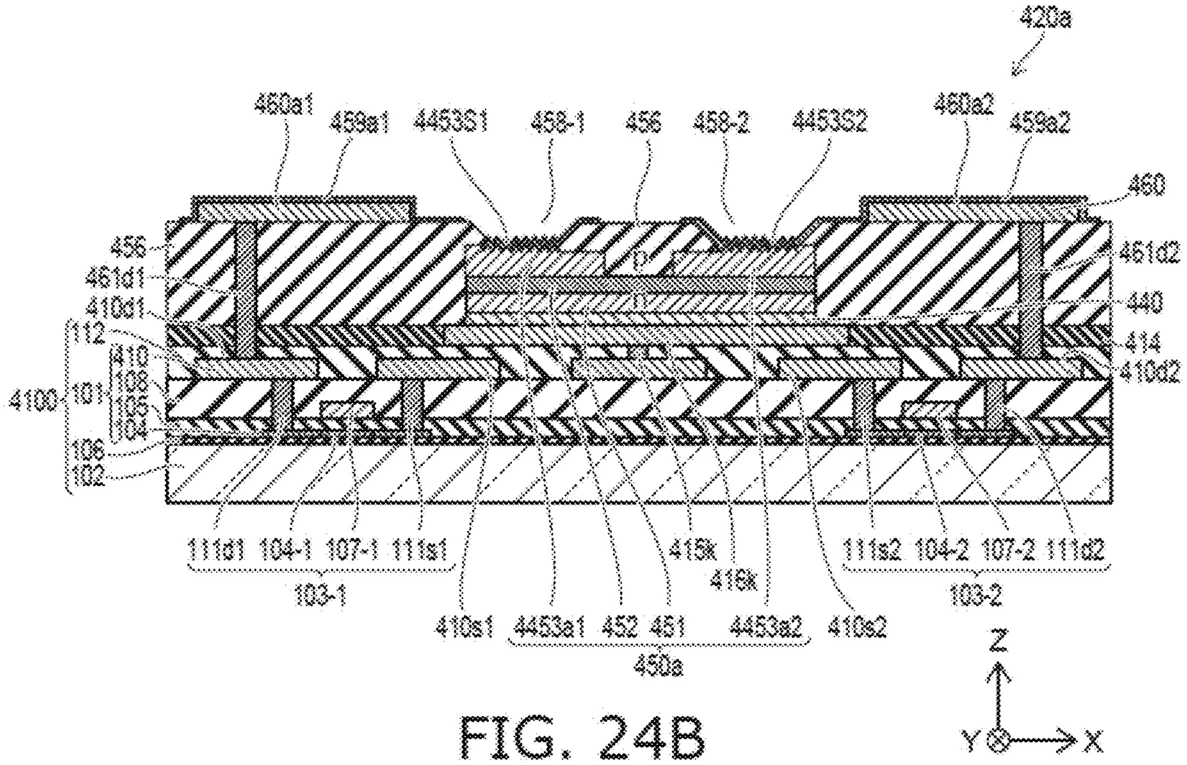
FIG. 24B is a schematic cross-sectional view illustrating the manufacturing method of the image display device according to the modified example of the fourth embodiment.

FIG. 24A and FIG. 24B are schematic cross-sectional views illustrating the manufacturing method of the image display device according of the present modified example.

In the present modified example, until formation of the graphene layer 4440 on the circuit substrate 4100 in which the plug **416*k* is formed, the same processes as those described in FIG. 19A to FIG. 21B of the fourth embodiment are applied. Hereinafter, as the manufacturing process of the present modified example, the process illustrated in FIG. 21**B and subsequent processes will be described.

As illustrated in FIG. 24A, in the present modified example, the semiconductor layer 4450 grown on the graphene layer 4440 is etched to form the semiconductor layer **450*a* in FIG. 21B. In the process of forming the semiconductor layer 450*a*, the n-type semiconductor layer 451 and the light-emitting layer 452 are formed and subsequently further etched to form the two p-type semiconductor layers 4453*a*1, 4453*a*2**.

The p-type semiconductor layers **4453*a*1, 4453*a*2 may be formed by deeper etching. For example, the etching for forming the p-type semiconductor layers 4453*a*1, 4453*a*2 may be performed to a depth that reaches inside the light-emitting layer 452 and inside the n-type semiconductor layer 451. In a case in which the p-type semiconductor layers are thus deeply etched, an etching position of the p-type semiconductor layer 4453 is preferably separated from outer peripheries of the light-emitting surfaces 4453S1, 4453S2 of the p-type semiconductor layer by 1 μm or more. By separating the etching position from the outer peripheries of the light-emitting surfaces 4453S1, 4453S2**, a recombination current can be suppressed.

The graphene layer 4440 illustrated in FIG. 21B is molded to an outer periphery corresponding to an outer periphery of the semiconductor layer **450*a* by overetching the semiconductor layer 450*a***.

As illustrated in FIG. 24B, the interlayer insulating film 456 covering the flattening film 414 and the semiconductor layer **450*a* is formed, and subsequently the vias 461*d*1, 461*d*2 are formed. Furthermore, the wiring layer 460 is formed, and the wiring lines 460*a*1, 460*a*2** and the like are formed.

The openings 458-1, 458-2 are each formed in the interlayer insulating film 456. The light-emitting surfaces 4453S1, 4453S2 of the p-type semiconductor layer exposed by the openings 458-1, 458-2 are each roughened. Subsequently, the light-transmitting electrodes **459*a*1, 459*a*2** are formed.

In this manner, the sub-pixel group **420*a* including the two light-emitting surfaces 4453S1, 4453S2** is formed.

In the case of the present modified example as well, as in the case of the fourth embodiment, the number of light-emitting surfaces is not limited to two, and three or more light-emitting surfaces may be provided on one semiconductor layer **450*a***.

Effects of the image display device of the present embodiment will now be described.

Figure 25:
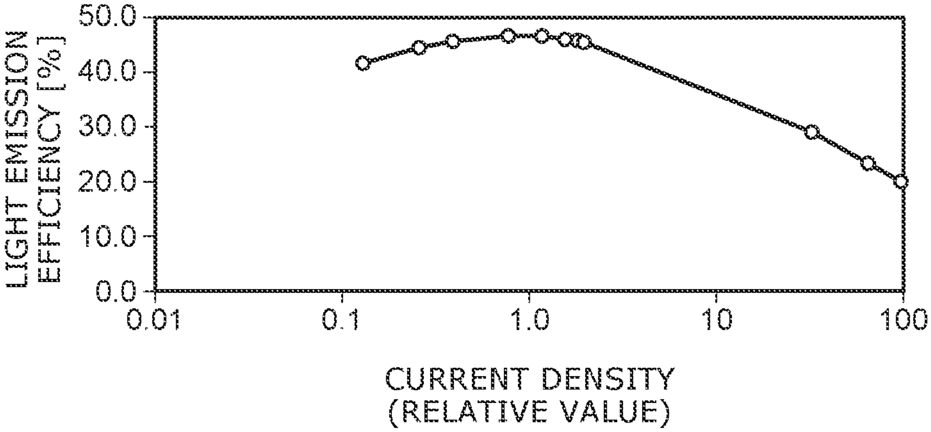
FIG. 25 is a graph showing features of a pixel LED element.

FIG. 25 is a graph showing characteristics of a pixel LED element.

The vertical axis in FIG. 25 indicates light emission efficiency (%). The horizontal axis indicates the current density of the current flowing in the pixel LED element by a relative value.

As shown in FIG. 25, in regions where the relative value of the current density is less than 1.0, the light emission efficiency of the pixel LED element is substantially constant or increases monotonically. In regions where the relative value of the current density is greater than 1.0, the light emission efficiency decreases monotonically. That is, in the pixel LED element, there exists an appropriate current density that results in the greatest light emission efficiency.

It is expected that a highly efficient image display device is realized by suppressing the current density to the extent that sufficient brightness can be acquired from the light-emitting element. Nevertheless, it is shown by FIG. 25 that, at low current densities, the light emission efficiency tends to decrease as the current density decreases.

For example, as described in the first embodiment described above, the light-emitting elements 150-1, 150-2 are formed by individually separating all layers of the semiconductor layer 1150 including the light-emitting layers 152-1, 152-2 by etching or the like. At this time, a bonding surface between the light-emitting layers 152-1, 152-2 and the p-type semiconductor layers 153-1, 153-2 is exposed at an end portion. Similarly, a bonding surface between the light-emitting layers 152-1, 152-2 and the n-type semiconductor layers 151-1, 151-2 is exposed at an end portion.

If such an end portion is present, electrons and holes are recombined at the end portion. On the other hand, such a recombination does not contribute to light emission. Recombination at the end portion occurs almost regardless of the current flowing in the light-emitting element. Recombination is thought to occur depending on a length, at the end portion, of the bonding surface that contributes to light emission.

When two cubic-shaped light-emitting elements having the same dimensions are made to emit light, recombination can occur at a total of eight end portions because the end portions are formed in four directions for each light-emitting element.

In contrast, in the present embodiment, the semiconductor layers 450, 450*a* having two light-emitting surfaces have four end portions. Because the region between the openings 458-1, 458-2 has few injections of electrons and holes and hardly contributes to light emission, the number of end portions contributing to light emission can be regarded as six. Thus, in the present embodiment, the number of end portions of the semiconductor layer is substantially reduced, making it possible to reduce the recombination current that does not contribute to light emission and, by the reduction in the recombination current, reduce the drive current.

For high definition and the like, in a case in which the distance between sub-pixels is reduced or a case in which the current density is relatively high or the like, the distance between the light-emitting surfaces 453S1, 453S2 is shortened in the sub-pixel group 420 of the fourth embodiment. In this case, when the p-type semiconductor layer 453 is shared, there is a risk that a portion of the electrons injected on the side of the adjacent light-emitting surface may be diverted, causing the light-emitting surface on the side not being driven to emit a small amount of light. In the modified example, the p-type semiconductor layers 4453*a*1, 4453*a*2 are separated from the light-emitting surfaces 4453S1, 4453S2, making it possible to reduce the occurrence of small light emission in the light-emitting surface on the side not being driven.

In the present embodiment, the semiconductor layer including the light-emitting layer is layered from the side of the interlayer insulating film 112 in the order of the n-type semiconductor layer, the light-emitting layer, and the p-type semiconductor layer, and the exposed surface of the p-type semiconductor layer is roughened to improve the light emission efficiency. As with the other embodiments described above, instead of the layered order of the n-type semiconductor layer and the p-type semiconductor layer, the p-type semiconductor layer, the light-emitting layer, and the n-type semiconductor layer may be layered in this order.

In all embodiments and modified examples described above, the layered order of the light-emitting element can be changed and applied by the appropriate manufacturing procedure described above. For example, the light-emitting element according to the first embodiment can be layered in the order of the p-type semiconductor layer, the light-emitting layer, and the n-type semiconductor layer, from the side of the first interlayer insulating film 112 toward the side of the light-emitting surface. Similarly, the light-emitting element of the second embodiment can be layered in the order of the n-type semiconductor layer, the light-emitting layer, and the p-type semiconductor layer, from the side of the first interlayer insulating film 112 toward the side of the light-emitting surface.

Further, in the embodiments and modified examples described above, the configurations described above can be applied in combination as appropriate. For example, in the first embodiment to the third embodiment, the plug used in the fourth embodiment can be applied to connecting the semiconductor layer in the lower layer to an external circuit. Similarly, in the fourth embodiment, instead of connection by a plug, a via can be used to connect the semiconductor layer in the lower layer to an external circuit.

Fifth Embodiment

The image display device described above can be, as an image display module including an appropriate number of pixels, a computer display, a television, a mobile terminal such as a smartphone, or a car navigation system, for example.

Figure 26:
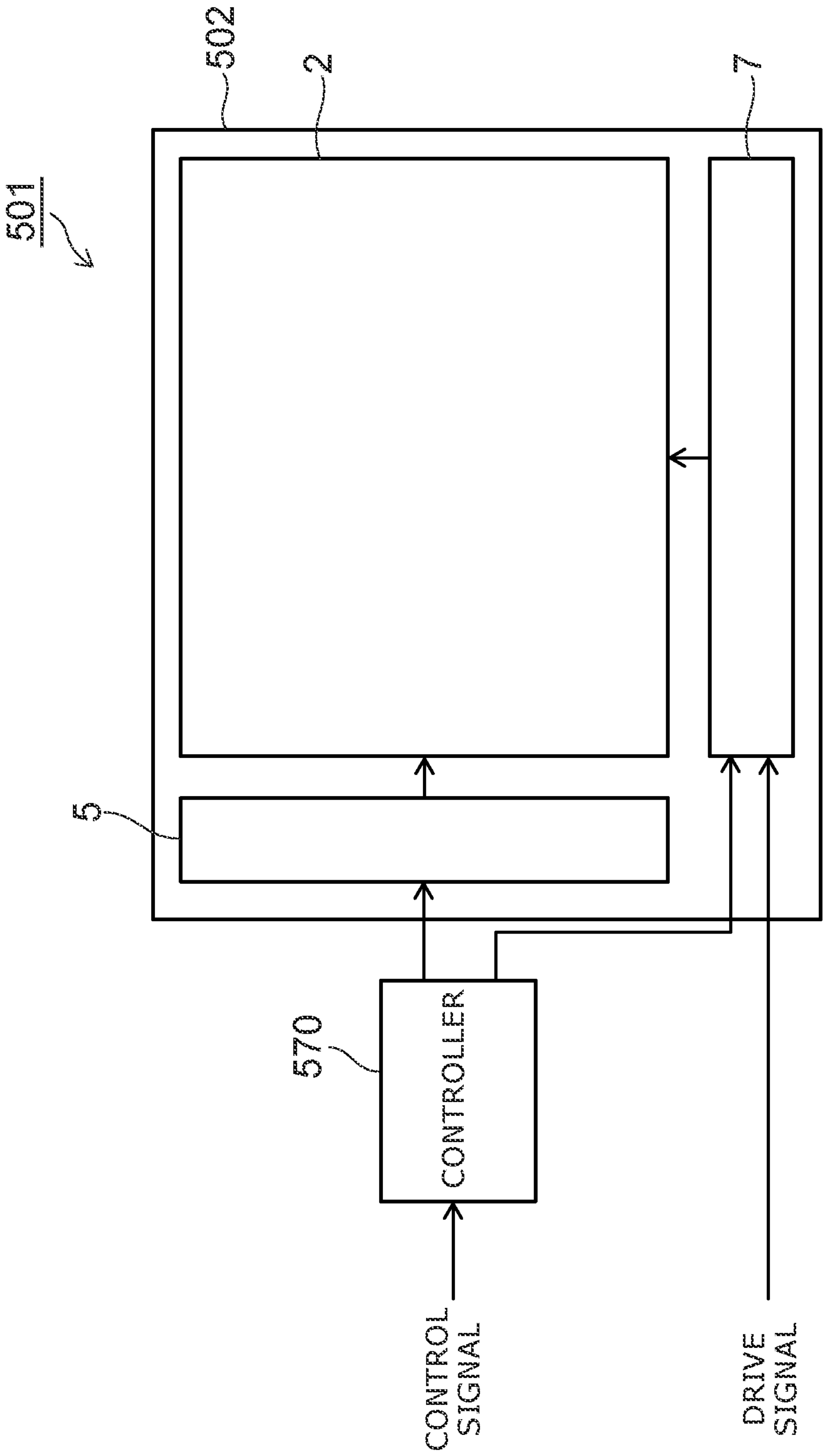
FIG. 26 is a block diagram illustrating an image display device according to a fifth embodiment.

FIG. 26 is a block diagram illustrating an image display device according to the present embodiment.

A main portion of a configuration of a computer display is illustrated in FIG. 26.

As illustrated in FIG. 26, an image display device 501 includes an image display module 502. The image display module 502 is an image display device having the configuration of the first embodiment described above, for example. The image display module 502 includes the display region 2 in which the sub-pixels 20 are arrayed, the row selection circuit 5, and the signal voltage output circuit 7. The image display device 501 may be provided with the configuration of any one of the second to fourth embodiments or the modified examples.

The image display device 501 further includes a controller 570. The controller 570 inputs control signals separated and generated by an interface circuit (not illustrated) to control the drive and drive sequence of each sub-pixel with respect to the row selection circuit 5 and the signal voltage output circuit 7.

Modified Example

Figure 27:
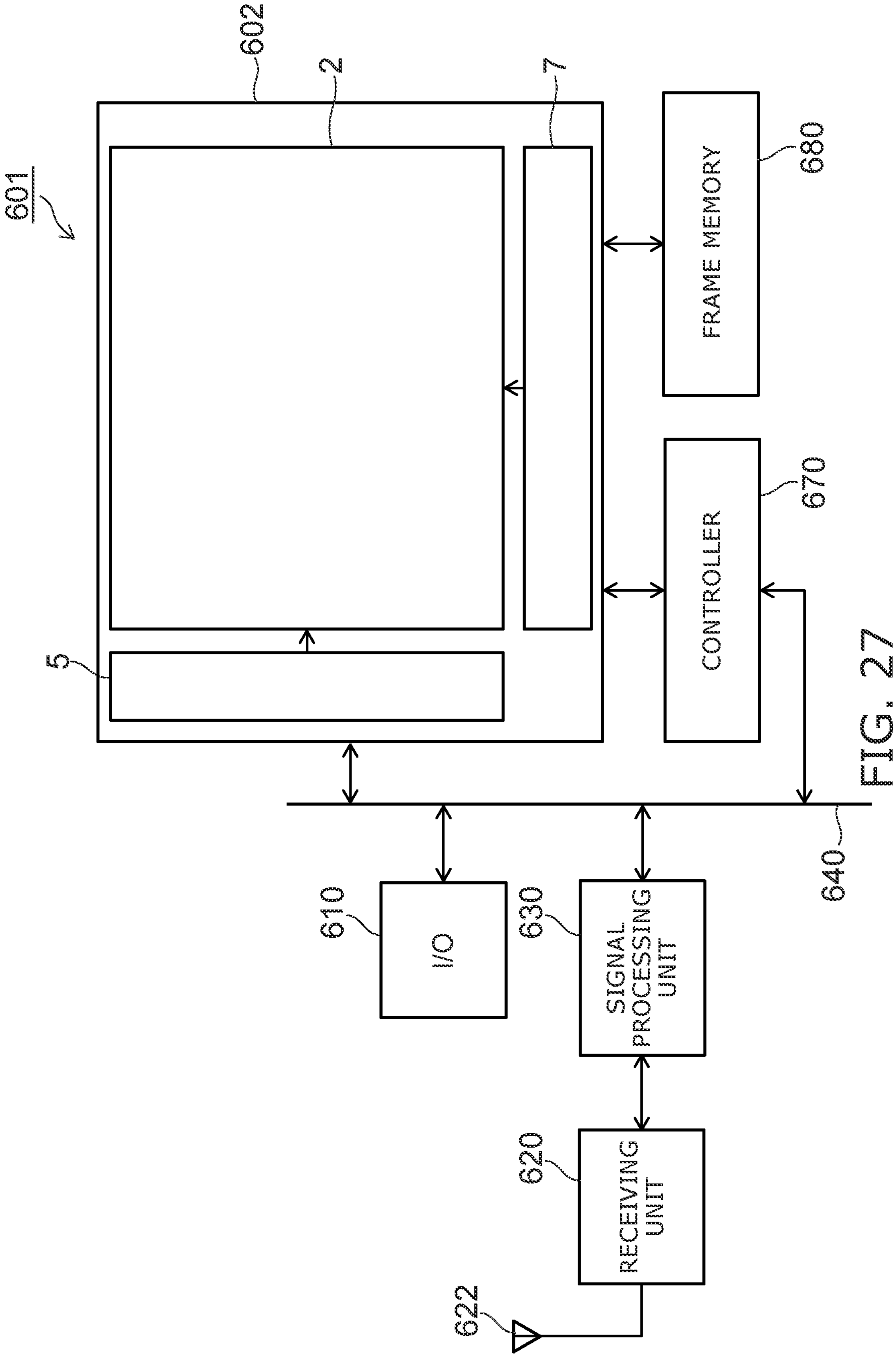
FIG. 27 is a block diagram illustrating an image display device according to a modified example of the fifth embodiment.

FIG. 27 is a block diagram illustrating an image display device of the present modified example.

FIG. 27 illustrates a configuration of a high-definition, flat-screen television.

As illustrated in FIG. 27, an image display device 601 includes an image display module 602. The image display module 602 is, for example, the image display device 1 provided with the configuration of the first embodiment described above. The image display device 601 includes a controller 670 and a frame memory 680. The controller 670 controls the drive sequence of each sub-pixel in the display region 2 on the basis of the control signal supplied by a bus 640. The frame memory 680 stores the display data of one frame and is used for processing, such as smooth video playback.

The image display device 601 includes an I/O circuit 610. The I/O circuit 610 provides an interface circuit and the like for connection to an external terminal, device, or the like. The I/O circuit 610 includes, for example, a universal serial bus (USB) interface for connecting an external hard disk device or the like, and an audio interface.

The image display device 601 includes a receiving unit 620 and a signal processing unit 630. The receiving unit 620 is connected with an antenna 622 to separate and generate necessary signals from radio waves received by the antenna 622. The signal processing unit 630 includes a digital signal processor (DSP), a central processing unit (CPU), and the like, and signals separated and generated by the receiving unit 620 are separated and generated into image data, audio data, and the like by the signal processing unit 630.

Other image display devices can be made as well by using the receiving unit 620 and the signal processing unit 630 as high-frequency communication modules for transmission/reception of mobile phones, Wi-Fi, global positioning system (GPS) receivers, and the like. For example, an image display device provided with an image display module with an appropriate screen size and resolution may be made into a mobile information terminal such as a smartphone or a car navigation system.

The image display module in the case of the present embodiment is not limited to the configuration of the image display device in the first embodiment, and may be the configuration of a modified example or other embodiment.

Figure 28:
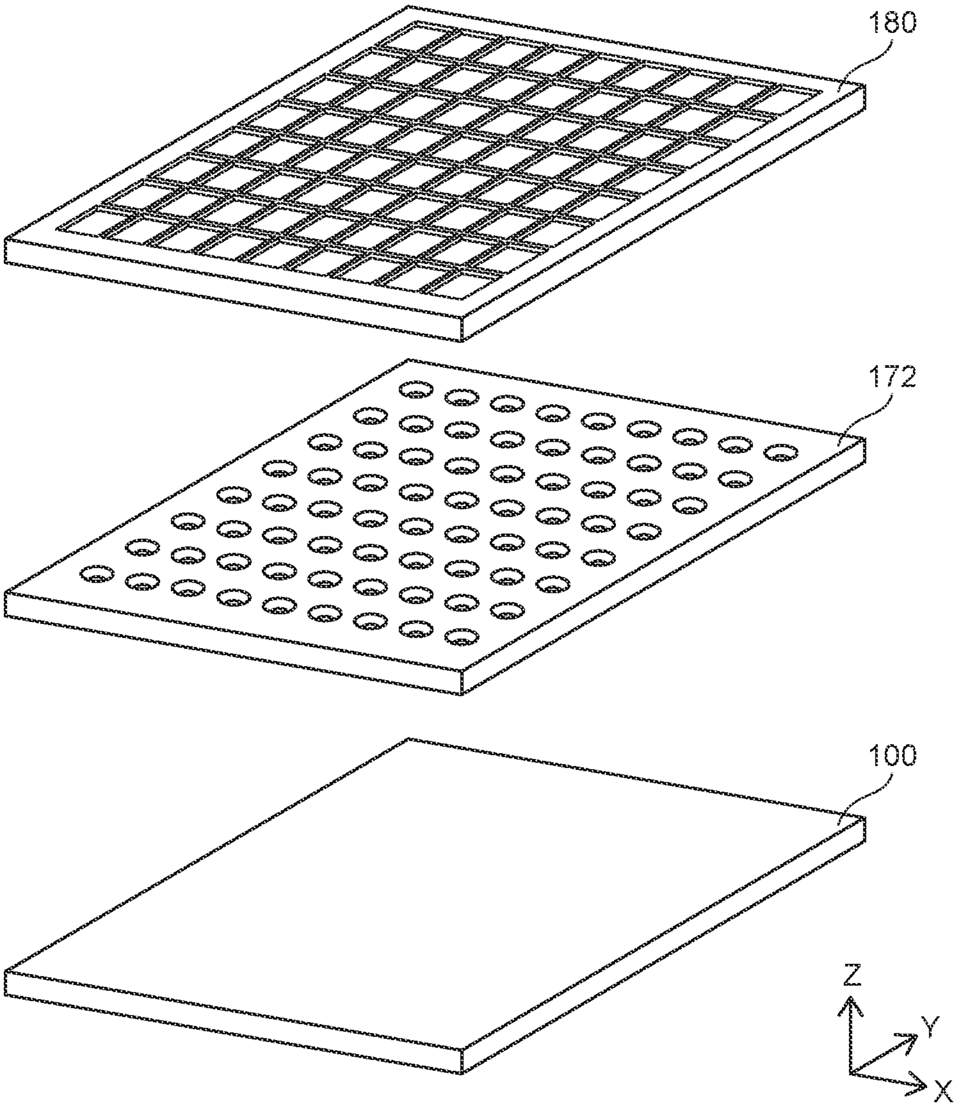
FIG. 28 is a perspective view schematically illustrating the image display devices according to the first to fourth embodiments and the modified examples thereof.

FIG. 28 is a perspective view schematically illustrating the image display devices according to the first to fourth embodiments and the modified examples thereof.

As illustrated in FIG. 28, the image display devices of the first to fourth embodiments are provided with the light-emitting circuit portion 172 including the plurality of sub-pixels on the circuit substrate 100, as described above. The color filter 180 is provided on the light-emitting circuit portion 172. Note that, in the fifth embodiment, the structures including the circuit substrate 100, the light-emitting circuit portion 172, and the color filter 180 are the image display modules 502, 602 and are incorporated into the image display devices 501, 601.

According to the embodiments described above, an image display device manufacturing method and an image display device that reduce a transfer process of a light-emitting element and improve yield are realized.

While several embodiments of the present invention have been described above, these embodiments have been presented as examples, and are not intended to limit the scope of the invention. These novel embodiments may be implemented in various other forms, and various omissions, substitutions, and changes may be made without departing from the spirit of the invention. These embodiments and variations thereof are included in the scope and spirit of the invention, and are within the scope of the invention described in the claims and equivalents thereof. Further, each of the aforementioned embodiments may be implemented in combination with each other.

What is claimed is:

1. An image display device manufacturing method comprising:

- providing a first substrate that comprises:
  - a circuit comprising a circuit element formed on a light-transmitting substrate, and
  - a first insulating film covering the circuit;
- forming, on the first insulating film, a layer comprising graphene;
- forming, on the layer comprising graphene, a semiconductor layer comprising a light-emitting layer;
- etching the semiconductor layer to form a light-emitting element having a first surface that contacts the layer comprising graphene, and a second surface opposite the first surface, the second surface including a light-emitting surface of the light-emitting element;
- forming a second insulating film covering the layer comprising graphene, the light-emitting element, and the first insulating film;
- forming a via passing through the first insulating film and the second insulating film; and
- electrically connecting the light-emitting element and the circuit element through the via at the light-emitting surface of the light-emitting element.

2. The image display device manufacturing method according to claim 1, wherein, in the step of forming the semiconductor layer, the semiconductor layer is grown by sputtering.

3. The image display device manufacturing method according to claim 1, wherein:

- a second substrate having flexibility is provided between the light-transmitting substrate and the circuit element; and
- the method further comprises, after the step of forming the semiconductor layer, removing the light-transmitting substrate.

4. The image display device manufacturing method according to claim 1, wherein the light-transmitting substrate comprises a glass substrate.

5. The image display device manufacturing method according to claim 1, further comprising:

- exposing the light-emitting surface.

6. The image display device manufacturing method according to claim 5, further comprising:

- forming a light-transmitting electrode on the light-emitting surface that is exposed.

7. The image display device manufacturing method according to claim 1, wherein the semiconductor layer comprises a gallium nitride compound semiconductor.

8. The image display device manufacturing method according to claim 1, further comprising:

- forming a wavelength conversion member on the light-emitting element.

* * * * *